(12) United States Patent
Kim et al.

(10) Patent No.: US 11,258,029 B2
(45) Date of Patent: *Feb. 22, 2022

(54) LIGHT-EMITTING DEVICE

(71) Applicant: Samsung Display Co., Ltd., Yongin-si (KR)

(72) Inventors: Younsun Kim, Yongin-si (KR); Seulong Kim, Yongin-si (KR); Dongwoo Shin, Yongin-si (KR); Jungsub Lee, Yongin-si (KR); Naoyuki Ito, Yongin-si (KR); Jino Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/887,626

(22) Filed: May 29, 2020

(65) Prior Publication Data

US 2020/0295292 A1 Sep. 17, 2020

Related U.S. Application Data

(63) Continuation-in-part of application No. 15/289,817, filed on Oct. 10, 2016, now Pat. No. 10,680,195.

(30) Foreign Application Priority Data

Mar. 10, 2016 (KR) .................. 10-2016-0029093

(51) Int. Cl.
*H01L 51/50* (2006.01)
*H01L 51/52* (2006.01)
*H01L 51/00* (2006.01)

(52) U.S. Cl.
CPC ........ *H01L 51/5076* (2013.01); *H01L 51/508* (2013.01); *H01L 51/5278* (2013.01);
(Continued)

(58) Field of Classification Search
CPC ............ H01L 51/0067; H01L 51/0072; H01L 51/0081; H01L 51/5076; H01L 51/508; H01L 51/5278

See application file for complete search history.

(56) References Cited

U.S. PATENT DOCUMENTS 6,303,238 B1 10/2001 Thompson et al.
6,717,358 B1 4/2004 Liao et al.
(Continued)

FOREIGN PATENT DOCUMENTS

KR 10-2009-0119746 A 11/2009
KR 10-2013-0064661 A 6/2013
(Continued)

OTHER PUBLICATIONS

Japanese Journal of Applied Physics, (2016), vol. 55, pp. 08RF01-1 to 08RF01-6. (Year: 2016).*
(Continued)

*Primary Examiner* — Dawn L Garrett
(74) *Attorney, Agent, or Firm* — Lewis Roca Rothgerber Christie LLP

(57) ABSTRACT

A light emitting device includes: a first electrode; a second electrode facing the first electrode; m emission units stacked between the first electrode and the second electrode; and m−1 charge generating layer(s) between the two adjacent emission units from among the m emission units, m−1 charge generating layer(s) including m−1 n-type charge generating layer(s) and m−1 p-type charge generating layer(s), wherein m is an integer of 2 or greater, a maximum emission wavelength of light emitted from at least one of the m emission units differs from that of light emitted from at least one of the other emission units, at least one of the m−1
(Continued)

n-type charge generating layer(s) includes a metal-containing material and an electron transporting metal-non-containing material.

20 Claims, 6 Drawing Sheets

(52) U.S. Cl.
CPC ...... *H01L 51/0067* (2013.01); *H01L 51/0072* (2013.01); *H01L 51/0081* (2013.01)

(56) References Cited

U.S. PATENT DOCUMENTS

| | | | |
|---|---|---|---|
| 6,936,961 B2 | 8/2005 | Liao et al. | |
| 7,075,231 B1 | 7/2006 | Liao et al. | |
| 7,494,722 B2 | 2/2009 | Liao et al. | |
| 7,528,545 B2 | 5/2009 | Liao et al. | |
| 7,560,862 B2 | 7/2009 | Liao et al. | |
| 7,977,872 B2 | 7/2011 | Spindler et al. | |
| 8,476,624 B1 | 7/2013 | Wu et al. | |
| 8,637,854 B2 | 1/2014 | Kang et al. | |
| 8,796,676 B2 | 8/2014 | Pieh et al. | |
| 8,957,409 B2 | 2/2015 | Zhou et al. | |
| 9,076,978 B2 | 7/2015 | Lee et al. | |
| 9,680,054 B2* | 6/2017 | Coe-Sullivan | H01L 33/50 |
| 10,680,195 B2* | 6/2020 | Kim | H01L 51/5076 |
| 2004/0043140 A1 | 3/2004 | Jagannathan et al. | |
| 2006/0040132 A1 | 2/2006 | Liao et al. | |
| 2006/0134460 A1 | 6/2006 | Kondakova et al. | |
| 2006/0199038 A1 | 9/2006 | Lee | |
| 2009/0001885 A1 | 1/2009 | Spindler et al. | |
| 2009/0026938 A1 | 1/2009 | Okada et al. | |
| 2009/0045728 A1 | 2/2009 | Murano et al. | |
| 2010/0147386 A1 | 6/2010 | Benson-smith et al. | |
| 2010/0244671 A1 | 9/2010 | Nomura et al. | |
| 2010/0253209 A1* | 10/2010 | Spindler | H01L 51/5278 313/504 |
| 2013/0228753 A1 | 9/2013 | Moon et al. | |
| 2015/0144897 A1 | 5/2015 | Kang et al. | |
| 2015/0144926 A1 | 5/2015 | Lee et al. | |
| 2017/0025485 A1* | 1/2017 | Kim | H01L 51/5237 |
| 2017/0186999 A1* | 6/2017 | Lee | H01L 27/323 |

FOREIGN PATENT DOCUMENTS

| | | |
|---|---|---|
| KR | 10-2013-0135161 A | 12/2013 |
| KR | 10-2014-0119990 A | 10/2014 |

OTHER PUBLICATIONS

Nanotechnology, (2009), vol. 20, 065204 (5 pages). (Year: 2009).*
Tang et al., J. Mater. Chem, (2010), pp. 2539-2548. (Year: 2010).*
Peter I. Djurovich, et al., "Measurement of the lowest unoccupied molecular orbital energies of molecular organic semiconductors," Organic Electronics, 10 (2009) pp. 515-520.

* cited by examiner

LIGHT-EMITTING DEVICE

CROSS-REFERENCE TO RELATED APPLICATIONS

This application is a continuation-in-part of U.S. application Ser. No. 15/289,817 filed on Oct. 10, 2016, which claims priority to and the benefit of Korean Patent Application No. 10-2016-0029093, filed on Mar. 10, 2016, in the Korean Intellectual Property Office, the entire content of each of which is incorporated herein by reference.

BACKGROUND

1. Field

One or more aspects of embodiments of the present disclosure relate to an electronic apparatus including a light-emitting device.

2. Description of the Related Art

Light emitting devices are self-emission devices that have wide viewing angles, high contrast ratios, short response times, and excellent brightness, driving voltage, and response speed characteristics, and can produce full-color images.

A light-emitting device may include a first electrode on a substrate, and a hole transport region, an emission layer, an electron transport region, and a second electrode, which are sequentially positioned on the first electrode. Holes provided from, for example, the first electrode may move toward the emission layer through the hole transport region, and electrons provided from, for example, the second electrode may move toward the emission layer through the electron transport region. Carriers, such as holes and electrons, may then recombine in the emission layer to produce excitons. These excitons transition from an excited state to a ground state, thereby generating light.

A light-emitting display apparatus, which is a self-emission display device, does not require a separate light source, resulting in being driven at a low voltage and configured as a thin and lightweight device. Due to excellent characteristics in terms of viewing angles, high contrast ratios, and short response times, the light-emitting display apparatus has been expanded in application range from a personal portable device, such as an MP3 player or a cellular phone, to a television (TV).

Meanwhile, as outdoor use of information appliances, such as an electronic apparatus including a light-emitting device, increases, time for exposure of such an electronic apparatus including the light-emitting device to sunlight also gradually increases. In addition, in the process of manufacturing a light-emitting device, irradiating ultraviolet rays is required in many cases. As such, when external ultraviolet light freely reaches regions inside the light-emitting device, especially an emission layer including a material may be seriously damaged.

SUMMARY

The present disclosure is designed to solve the above-described problems, and to provide an electronic apparatus capable of reducing an amount of ultraviolet light transmitted into an electronic apparatus. However, these problems are illustrative, and thus the scope of the present disclosure is not limited thereto.

Additional aspects will be set forth in part in the description which follows and, in part, will be apparent from the description, or may be learned by practice of the presented embodiments.

One or more aspects of embodiments of the present disclosure are directed toward a light-emitting device having low driving voltage, high efficiency, and long lifespan.

Additional aspects will be set forth in part in the description which follows and, in part, will be apparent from the description, or may be learned by practice of the presented embodiments.

According to one or more embodiments, an electronic apparatus includes:
 a substrate;
 a light-emitting device disposed on the substrate; and
 a thin film encapsulation portion sealing the light-emitting device and comprising at least one organic film,
   wherein the organic film comprises a cured product of a composition for forming an organic film, the composition comprising a curable material and an ultraviolet (UV) absorber,
 and the light-emitting device includes a first electrode;
 a second electrode facing the first electrode;
 m emission units stacked between the first electrode and the second electrode; and
 m−1 charge generating layer(s) between each of the two adjacent emission units from among the m emission units, the m−1 charge generating layer(s) including m−1 n-type charge generating layer(s) and m−1 p-type charge generating layer(s),
 wherein the m is an integer of 2 or greater,
 a maximum emission wavelength of light emitted from at least one of the m emission units differs from that of light emitted from at least one of the other emission units,
 at least one of the m−1 n-type charge generating layer(s) includes a metal-containing material and an electron transporting metal-non-containing material,
 the metal-containing material comprised in the m−1 n-type charge generating layer(s) comprises a metal, a metal complex, or a combination thereof,
 the metal comprised in the m−1 n-type charge generating layer(s) comprises lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu), or a combination thereof, and
 the metal complex comprised in the m−1 n-type charge generating layer(s) comprises an alkali metal, an alkaline earth metal, a rare-earth metal, a transition metal, a late transition metal, or a combination thereof, and at least one organic ligand selected from a hydroxyquinoline, a hydroxyisoquinoline, a hydroxy benzoquinoline, a hydroxyacridine, a hydroxyphenanthridine, a hydroxyphenyl oxazole, a hydroxyphenyl thiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene, and
 the light emitting device further comprises:
 an electron transport layer between the second electrode and an emission unit adjacent to the second electrode from among the m emission units, wherein the electron transport layer comprises a metal-containing material and an electron transporting metal-non-containing material, the metal-containing material comprised in the electron transport layer comprises a metal, a metal complex, or a combination thereof, the metal comprised in the electron transport layer comprises an alkali metal, an alkaline earth metal, a rare-earth metal, a transition metal, a late transition metal, or a combination thereof, the metal complex comprised in the electron transport layer comprises an alkali metal, an alkaline earth metal, a rare-earth metal, a transition metal, a late transition metal, or a combination thereof, and the electron transporting metal-non-containing material is an organic compound comprising at least one selected from a phenanthroline ring, an imidazole ring, a pyridine ring, a pyrazine ring, a pyrimidine ring, a pyridazine ring, and a triazine ring, wherein the metal-containing material comprised in the at least one of the m−1 n-type charge generating layer(s) differs from the metal-containing material comprised in the electron transport layer;

the electron transporting metal-non-containing material comprised in the at least one of the m−1 n-type charge generating layer(s) differs from the electron transporting metal-non-containing material comprised in the electron transport layer; or the metal-containing material comprised in the at least one of the m−1 n-type charge generating layer(s) differs from the metal-containing material comprised in the electron transport layer, and the electron transporting metal-non-containing material comprised in the at least one of the m−1 n-type charge generating layer(s) differs from the electron transporting metal-non-containing material comprised in the electron transport layer; and at least one of the m−1 n-type charge generating layer(s) and the electron transporting layer does not include a metal complex comprising lithium (Li).

According to one or more embodiments, an electronic apparatus includes:

a substrate;

an light-emitting device disposed on the substrate; and a color conversion layer disposed on the light-emitting device and wherein the color conversion layer comprises at least one quantum dot(s), and the light emitting device comprising:

a first electrode;

a second electrode facing the first electrode;

m emission units stacked between the first electrode and the second electrode; and m−1 charge generating layer(s) between each of the two adjacent emission units from among the m emission units, m−1 charge generating layer(s) comprising m−1 n-type charge generating layer(s) and m−1 p-type charge generating layer(s), wherein m is an integer of 2 or greater, a maximum emission wavelength of light emitted from at least one of the m emission units differs from that of light emitted from at least one of the other emission units, at least one of the m−1 n-type charge generating layer(s) comprises a metal-containing material and an electron transporting metal-non-containing material, the metal-containing material comprised in the m−1 n-type charge generating layer(s) comprises a metal, a metal complex, or a combination thereof, the metal comprised in the m−1 n-type charge generating layer(s) comprises lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu), or a combination thereof, and the metal complex comprised in the m−1 n-type charge generating layer(s) comprises an alkali metal, an alkaline earth metal, a rare-earth metal, a transition metal, a late transition metal, or a combination thereof, and at least one organic ligand selected from a hydroxyquinoline, a hydroxyisoquinoline, a hydroxy benzoquinoline, a hydroxyacridine, a hydroxyphenanthridine, a hydroxyphenyl oxazole, a hydroxyphenyl thiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene, and the light emitting device further comprises:

an electron transport layer between the second electrode and an emission unit adjacent to the second electrode from among the m emission units, wherein the electron transport layer comprises a metal-containing material and an electron transporting metal-non-containing material, the metal-containing material comprised in the electron transport layer comprises a metal, a metal complex, or a combination thereof, the metal comprised in the electron transport layer comprises an alkali metal, an alkaline earth metal, a rare-earth metal, a transition metal, a late transition metal, or a combination thereof, the metal complex comprised in the electron transport layer comprises an alkali metal, an alkaline earth metal, a rare-earth metal, a transition metal, a late transition metal, or a combination thereof, and the electron transporting metal-non-containing material is an organic compound comprising at least one selected from a phenanthroline ring, an imidazole ring, a pyridine ring, a pyrazine ring, a pyrimidine ring, a pyridazine ring, and a triazine ring, wherein the metal-containing material comprised in the at least one of the m−1 n-type charge generating layer(s) differs from the metal-containing material comprised in the electron transport layer;

the electron transporting metal-non-containing material comprised in the at least one of the m−1 n-type charge generating layer(s) differs from the electron transporting metal-non-containing material comprised in the electron transport layer; or the metal-containing material comprised in the at least one of the m−1 n-type charge generating layer(s) differs from the metal-containing material comprised in the electron transport layer, and the electron transporting metal-non-containing material comprised in the at least one of the m−1 n-type charge generating layer(s) differs from the electron transporting metal-non-containing material comprised in the electron transport layer; and at least one of the m−1 n-type charge generating layer(s) and the electron transporting layer does not include a metal complex comprising lithium (Li).

According to one or more embodiments, an electronic apparatus includes:
a substrate;
an light-emitting device disposed on the substrate;
a thin film encapsulation portion sealing the light-emitting device and comprising at least one organic film; and
a color conversion layer disposed on the thin film encapsulation portion and
wherein the organic film comprises a cured product of a composition for forming an organic film, the composition comprising a curable material and an ultraviolet (UV) absorber,
the color conversion layer comprises at least one quantum dot(s),
and the light emitting device comprising:
a first electrode;
a second electrode facing the first electrode;
m emission units stacked between the first electrode and the second electrode; and
m−1 charge generating layer(s) between each of the two adjacent emission units from among the m emission units, m−1 charge generating layer(s) comprising m−1 n-type charge generating layer(s) and m−1 p-type charge generating layer(s),
wherein m is an integer of 2 or greater,
a maximum emission wavelength of light emitted from at least one of the m emission units differs from that of light emitted from at least one of the other emission units,
at least one of the m−1 n-type charge generating layer(s) comprises a metal-containing material and an electron transporting metal-non-containing material,
the metal-containing material comprised in the m−1 n-type charge generating layer(s) comprises a metal, a metal complex, or a combination thereof,
the metal comprised in the m−1 n-type charge generating layer(s) comprises lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu), or a combination thereof, and
the metal complex comprised in the m−1 n-type charge generating layer(s) comprises an alkali metal, an alkaline earth metal, a rare-earth metal, a transition metal, a late transition metal, or a combination thereof, and at least one organic ligand selected from a hydroxyquinoline, a hydroxyisoquinoline, a hydroxy benzoquinoline, a hydroxyacridine, a hydroxyphenanthridine, a hydroxyphenyl oxazole, a hydroxyphenyl thiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene, and
the light emitting device further comprises:
an electron transport layer between the second electrode and an emission unit adjacent to the second electrode from among the m emission units,
wherein the electron transport layer comprises a metal-containing material and an electron transporting metal-non-containing material,
the metal-containing material comprised in the electron transport layer comprises a metal, a metal complex, or a combination thereof,
the metal comprised in the electron transport layer comprises an alkali metal, an alkaline earth metal, a rare-earth metal, a transition metal, a late transition metal, or a combination thereof,
the metal complex comprised in the electron transport layer comprises an alkali metal, an alkaline earth metal, a rare-earth metal, a transition metal, a late transition metal, or a combination thereof, and
the electron transporting metal-non-containing material is an organic compound comprising at least one selected from a phenanthroline ring, an imidazole ring, a pyridine ring, a pyrazine ring, a pyrimidine ring, a pyridazine ring, and a triazine ring,
wherein the metal-containing material comprised in the at least one of the m−1 n-type charge generating layer(s) differs from the metal-containing material comprised in the electron transport layer;
the electron transporting metal-non-containing material comprised in the at least one of the m−1 n-type charge generating layer(s) differs from the electron transporting metal-non-containing material comprised in the electron transport layer; or
the metal-containing material comprised in the at least one of the m−1 n-type charge generating layer(s) differs from the metal-containing material comprised in the electron transport layer, and the electron transporting metal-non-containing material comprised in the at least one of the m−1 n-type charge generating layer(s) differs from the electron transporting metal-non-containing material comprised in the electron transport layer; and
at least one of the m−1 n-type charge generating layer(s) and the electron transporting layer does not include a metal complex comprising lithium (Li).

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
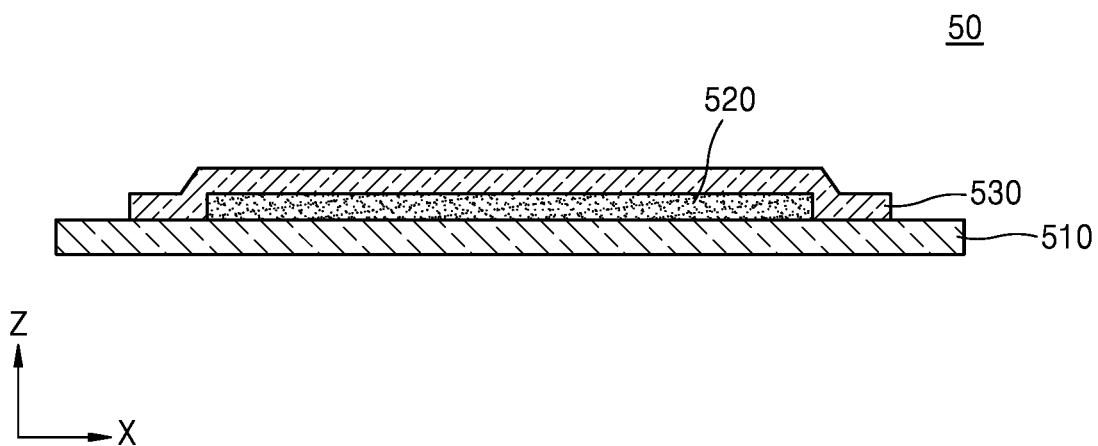
FIG. 1 is a schematic cross-sectional view of a structure of an electronic apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

FIG. 1 is a schematic cross-sectional view of a structure of an electronic apparatus according to an embodiment.

Referring to FIG. 1, an electronic apparatus 50 according to an embodiment includes a substrate 510, a light-emitting device 520, and a thin film encapsulation portion 530.

The substrate 510 may be any substrate commonly used in a light-emitting display device, and may be an inorganic substrate or an organic substrate, each having excellent mechanical strength, thermal stability, transparency, surface smoothness, ease of handling, and water resistance.

For example, the substrate 510 may be an inorganic substrate made of a transparent glass material containing SiO$_2$ as a main component, but embodiments of the present disclosure are not limited thereto.

For example, the substrate 510 may be an organic substrate having an insulating property. An organic material having an insulating property may be, for example, selected from polyethersulphone (PES), polyacrylate (PAR), polyetherimide (PEI), polyethylene napthalate (PEN), polyethyleneterepthalate (PET), polyphenylene sulfide (PPS), polyallylate, polyimide, polycarbonate (PC), cellulose triacetate (TAC), and cellulose acetate propionate (CAP), but embodiments of the present disclosure are not limited thereto.

Figure 2:
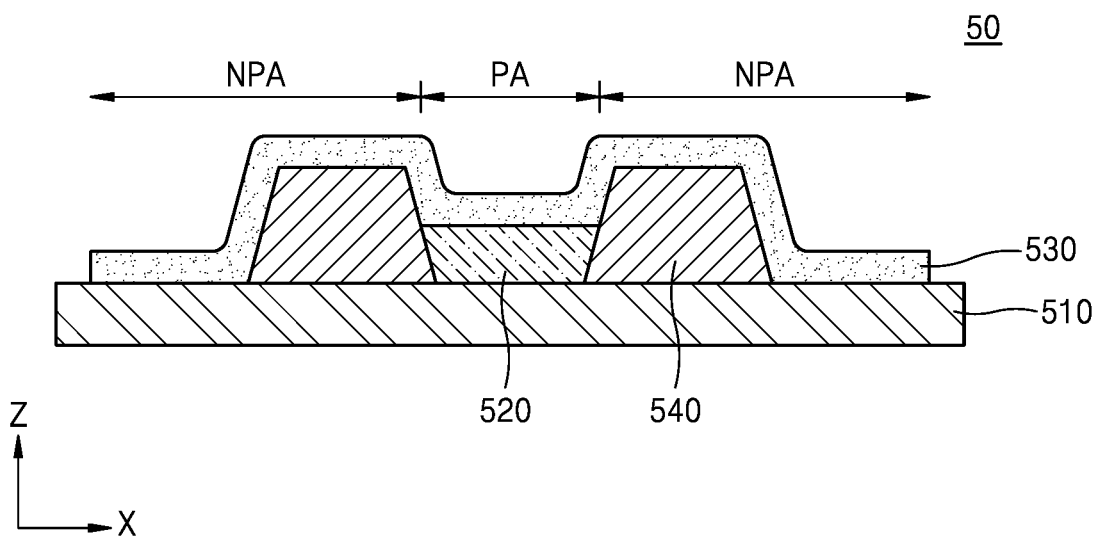
FIG. 2 is a schematic cross-sectional view of a structure of an electronic apparatus according to an embodiment.

FIG. 2 is a schematic cross-sectional view of a structure of an electronic apparatus according to an embodiment.

Referring to FIG. 2, an electronic apparatus 50 according to an embodiment includes a substrate 510, a light-emitting device 520, a thin film encapsulation portion 530, and a pixel defined layer 540.

The pixel defined layer 540 defining a pixel area (PA) and a non-pixel area (NPA) may be disposed on the substrate 510. In one embodiment, the pixel defined layer 540 may be disposed so as to surround the PA while covering edges of a pixel electrode and exposing a center portion the pixel electrode to the outside.

The pixel defined layer 540 may be formed of an organic insulating material or an inorganic insulating material well known in the art. In one embodiment, the pixel defined layer 540 may be formed of a polymer, such as polyimide and polyacrylate.

In one embodiment, a light-emitting device 520 may be disposed over the PA. The light-emitting device 520 may include a first electrode, an intermediate layer including an emission layer, and a second electrode.

In one embodiment, a light-emitting device 520 may be disposed on the substrate 510, so as to be surrounded by the pixel defined layer 540. For example, the pixel defined layer 540 may be provided such that the center portion of the pixel electrode, such as the first electrode, within the PA may be exposed to the outside and the edges of the pixel electrode may be covered by the pixel defined layer 540. Then, a light-emitting device 520 may be located in a plurality of the center portions exposed to the outside.

In one embodiment, a plurality of light-emitting devices may be disposed on the substrate 510, wherein at least one of the light-emitting devices is a light-emitting device 520, and a plurality of light-emitting devices may be insulated from each other.

The first electrode may be formed by, for example, depositing or sputtering a material for forming the first electrode on the substrate 510. When the first electrode is an anode, the material for forming the first electrode may be selected from materials with a high work function to facilitate hole injection.

The first electrode may be a reflective electrode, a semi-transmissive electrode, or a transmissive electrode. When the first electrode is a transmissive electrode, the material for forming the first electrode may be selected from indium tin oxide (ITO), indium zinc oxide (IZO), tin oxide (SnO$_2$), zinc oxide (ZnO), and any combination thereof, but embodiments of the present disclosure are not limited thereto. When the first electrode is a semi-transmissive electrode or a reflective electrode, the material for forming the first electrode may be selected from magnesium (Mg), silver (Ag), aluminum (Al), aluminum-lithium (Al—Li), calcium (Ca), magnesium-indium (Mg—In), magnesium-silver (Mg—Ag), and any combination thereof, but embodiments of the present disclosure are not limited thereto.

The first electrode may have a single-layered structure, or a multi-layered structure including two or more layers. For example, the first electrode may have a three-layered structure of ITO/Ag/ITO, but embodiments of the present disclosure are not limited thereto.

The intermediate layer including the emission layer may be disposed on the first electrode. The emission layer may be referred to the description provided below.

The intermediate layer may further include a hole transport region between the first electrode and the emission layer, and an electron transport region between the emission layer and the second electrode, but embodiments of the present disclosure are not limited thereto.

The second electrode may be disposed on the intermediate layer. The second electrode may be a cathode that is an electron injection electrode, and in this regard, a material for forming the second electrode may be a metal, an alloy, an electrically conductive compound, and any combination thereof.

The second electrode include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode may be a transmissive electrode, a semi-transmissive electrode, or a reflective electrode.

The second electrode may have a single-layered structure, or a multi-layered structure including two or more layers.

Then, a thin film encapsulation portion 530 sealing the light-emitting device 520 and the pixel defined layer 540 at the same time and including an organic film may be disposed on the second electrode.

In one embodiment, the organic film may include a cured product of a composition for forming the organic film, the composition including at least one ultraviolet (UV) absorber.

In one embodiment, the UV absorber may include at least one selected from a benzophenone-containing compound, a benzoquinone-containing compound, a anthraquinone-containing compound, a xanthone-containing compound, a benzotriazine-containing compound, a benzotriazinone-containing compound, a benzotriazole-containing compound, a benzoate-containing compound, a cyanoacrylate-containing compound, a triazine-containing compound, an oxanilide-containing compound, a salicylate-containing compound, a pyrene-containing compound, a naphthalene-containing compound, an anthracene-containing compound, and a catechol-containing compound, each substituted with at least one selected from with a hydroxyl group.

The benzophenone-containing compound may be, for example, 2-hydroxybenzophenone, 2,4-dihydroxybenzophenone, 2-hydroxy-4-m ethoxybenzophenone, 2-hydroxy-4-octylbenzophenone, 4-dodecyloxy-2-hydroxybenzophenone, 4-benzyloxy-2-hydroxybenzophenone, 2,2',4,4'-tetrahydroxybenzophenone, or 2,2'-dihydroxy-4,4'-dimethoxybenzophenone.

The benzoquinone-containing compound may be, for example, 2-hydroxybenzoquinone.

The anthraquinone-containing compound may be, for example, 1-hydroxyanthraquinone, 1,5-hydroxyanthraquinone, or 1,8-hydroxyanthraquinone.

The benzotriazole-containing compound may be, for example, 2-(2-hydroxyphenyl)benzotriazole, 2-(5-methyl-2-hydroxyphenyl)benzotriazole, 2-[2-hydroxy-3,5-bis(α,α-dimethylbenzyl)phenyl]-2H-benzotriazole, 2-(3,5-di-t-butyl-2-hydroxyphenyl)benzotriazole, 2-(3-t-butyl-5-methyl-2-hydroxyphenyl)-5-chlorobenzotriazole, 2-(3,5-di-t-butyl-2-hydroxyphenyl)-5-chlorobenzotriazole, 2-(3,5-di-t-acyl-2-hydroxyphenyl)benzotriazole, or 2-(2'-hydroxy-5'-t-octylphenyl)benzotriazole.

The benzoate-containing compound may be, for example, phenyl 2-hydroxybenzoate or 2,4-di-t-butylphenyl-3',5'-di-t-butyl-4-hydroxybenzoate.

The triazine-containing compound may be, for example, 2-(4,6-diphenyl-1,3,5-triazine-2-yl)phenol, 2-(4,6-diphenyl-1,3,5-triazine-2-yl)-5-(hexyl)oxy-phenol, or 2-[4-[(2-hydroxy-3-dodecyloxypropyl)oxy]-2-hydroxyphenyl]-4,6-bis(2,4-dimethylphenyl)-1,3,5-triazine.

The salicylate-containing compound may be, for example, phenylsalicylate or 4-t-butylphenylsalicylate.

In one embodiment, the UV absorber may include an UV-absorbing compound, and the UV-absorbing compound may include at least one UV-absorbing unit represented by one selected from Formulae 11-1 to 11-4:

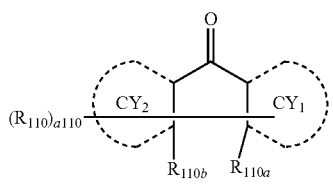

Formula 11-1

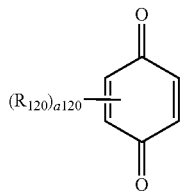

Formula 11-2

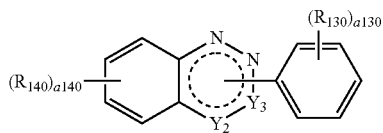

Formula 11-3

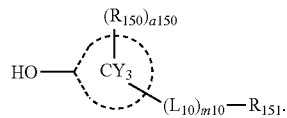

Formula 11-4

In Formulae 11-1 to 11-4, $CY_1$ to $CY_3$ may each independently be selected from a benzene group, a naphthalene group, an anthracene group, a pyrene group, and a phenanthrene group, $L_{10}$ may be —O—, —S—, $S(=O)_2$—, —C(=O)—, —C(=O)O—, —C(=O)NH—, a $C_1$-$C_{30}$ hydrocarbon group, a $C_5$-$C_{60}$ carbocyclic group, or a $C_2$-$C_{30}$ heterocyclic group, m10 may be an integer of 0 to 5, $L_{10}$ may be a single bond when m10 is 0, $R_{110a}$ and $R_{110b}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$cyclo alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$, $R_{110a}$ and $R_{110b}$ may optionally be linked to form a —$(Y_1)_{k1}$— linking group, $Y_1$ may be —O—, —S—, or —C(=O)—, k1 may be an integer of 1 to 3, at least one of $Y_2$ and $Y_3$ may be N, and the other one may be a single bond, a double bond, or —C(=O)—, $R_{110}$, $R_{120}$, $R_{130}$, $R_{140}$, $R_{150}$, and $R_{151}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cyclo alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $Si(Q_1)(Q_2)(Q_3)$, $-N(Q_1)(Q_2)$, $-B(Q_1)(Q_2)$, $-C(=O)(Q_1)$, $-S(=O)_2(Q_1)$, and $-P(=O)(Q_1)(Q_2)$, a110 may be an integer of 1 to 8, a120 and a140 may each independently be an integer of 1 to 4, a130 may be an integer of 1 to 5, a150 may be an integer of 1 to 10, at least one of $R_{110}(s)$ in the number of a110 may be a hydroxyl group, at least one of $R_{120}(s)$ in the number of a120 may be a hydroxyl group, and at least one of $R_{130}(s)$ in the number of a130 may be a hydroxyl group.

In one embodiment, the UV-absorbing compound may be represented by Formulae 11-1 to 11-5:

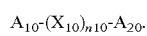   Formula 11-5

In Formula 11-5, $A_{10}$ and $A_{20}$ may each independently be a monovalent group derived from the UV-absorbing unit, $X_{10}$ may be a $C_2$-$C_{60}$ hydrocarbon group, and n10 may be an integer of 1 to 5.

For example, the UV-absorbing unit may be represented by one selected from Formulae 12-1 to 12-11, but embodiments of the present disclosure are not limited thereto:

12-1
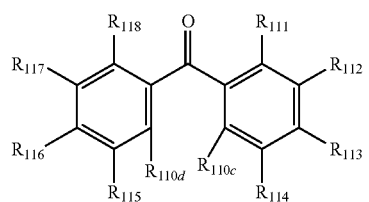

12-2
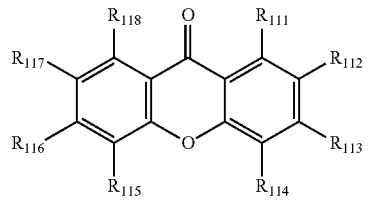

12-3
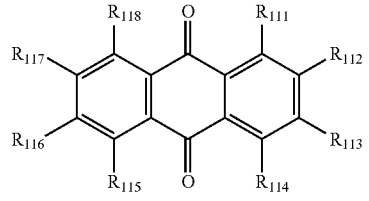

12-4
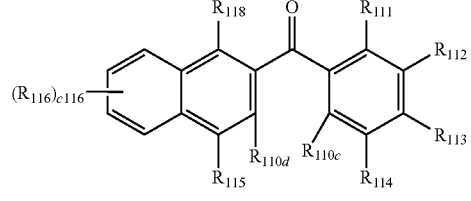

12-5
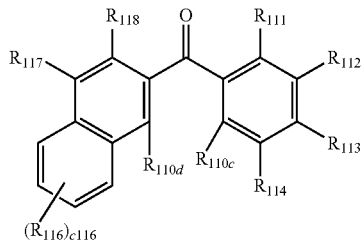

12-6
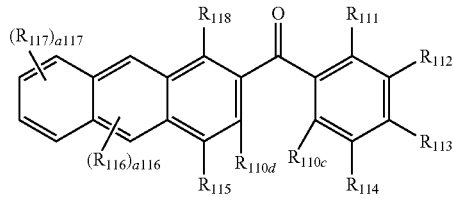

12-7
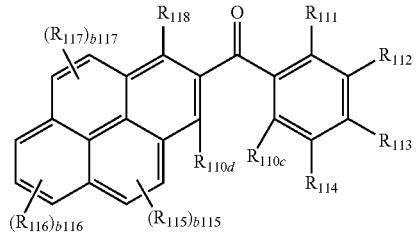

12-8
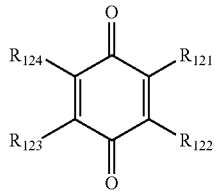

12-9
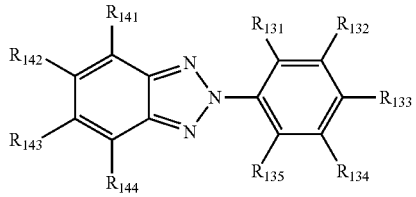

12-10
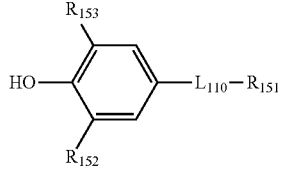

12-11
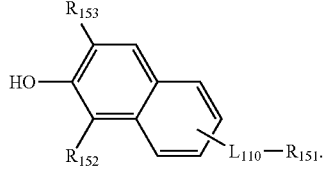

In Formulae 12-1 to 12-11, $R_{110c}$, $R_{110d}$, and $R_{111}$ to $R_{118}$ may respectively be defined the same as described above in connection with $R_{110}$, a116 may be 1 or 2, a117 may be 1, 2, 3, or 4, b115 may be 1 or 2, b116 may be 1, 2, or 3, b117 may be 1 or 2, c116 may be 1, 2, 3, or 4, $R_{121}$ to $R_{124}$ may respectively be defined the same as described above in connection with $R_{120}$, $R_{131}$ to $R_{135}$ may respectively be defined the same as described above in connection with $R_{130}$, $R_{141}$ to $R_{144}$ may respectively be defined the same as described above in connection with $R_{140}$, $R_{151}$ to $R_{153}$ may respectively be defined the same as described above in connection with $R_{150}$, at least one selected from $R_{111}$ to $R_{118}$, at least one selected from $R_{121}$ to $R_{124}$, and at least one selected from $R_{131}$ to $R_{135}$ may each independently a hydroxyl group, and

* indicates a binding site to a neighboring atom.

In one embodiment, the UV absorber may include a first UV-absorbing compound and a second UV-absorbing compound, wherein the first UV-absorbing compound and the second UV-absorbing compound may each independently be selected from:

a benzophenone-containing compound, a benzoquinone-containing compound, a anthraquinone-containing compound, a xanthone-containing compound, a benzotriazine-containing compound, a benzotriazinone-containing compound, a benzotriazole-containing compound, a benzoate-containing compound, a cyanoacrylate-containing compound, a triazine-containing compound, an oxanilide-containing compound, a salicylate-containing compound, a pyrene-containing compound, a naphthalene-containing compound, and an anthracene-containing compound, and a catechol-containing compound, each substituted with a hydroxyl group, and a wavelength range of light absorbed by the first UV-absorbing compound may be different from that of light absorbed by the second UV-absorbing compound.

In one embodiment, the UV-absorbing unit may be represented by one selected from Formulae 13-1 to 13-9:

13

13-1

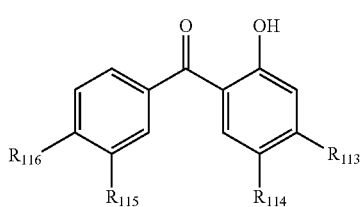

13-2

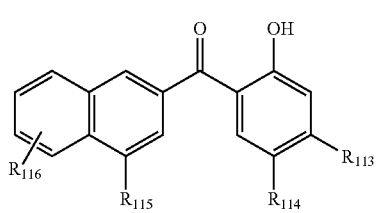

13-3

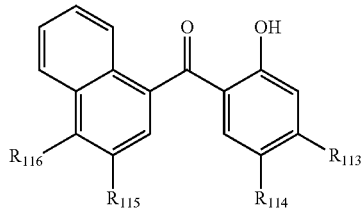

13-4

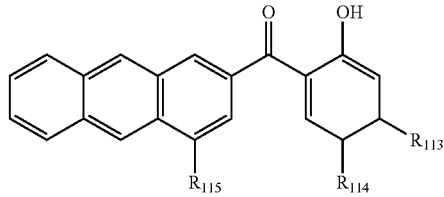

13-5

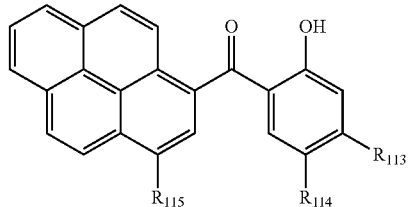

13-6

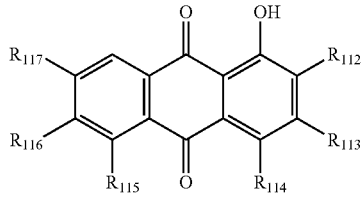

13-7

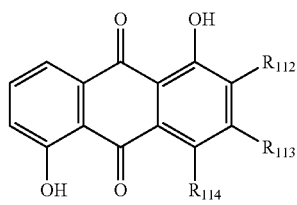

13-8

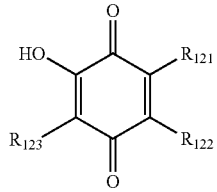

13-9

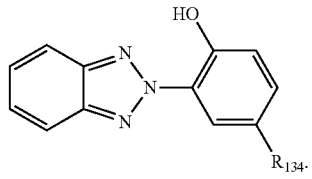

In Formulae 13-1 to 13-9, $R_{113}$ to $R_{117}$ may respectively be defined the same as described above in connection with Rico, $R_{121}$ to $R_{123}$ may respectively be defined the same as described above in connection with $R_{120}$, $R_{134}$ may be defined the same as described above in connection with $R_{130}$, and

* indicates a binding site to a neighboring atom.

In one embodiment, a wavelength range of light absorbed by the first UV-absorbing compound may be different from that of light absorbed by the second UV-absorbing compound.

In one embodiment, the UV absorber may absorb light having a wavelength between 280 nm and 430 nm. In one or more embodiments, the UV absorber may absorb light having a wavelength between about 340 nm and about 430 nm.

The UV absorber may absorb UV light and prevent the UV light from penetrating the pixel defined layer 540. Thus, the electronic apparatus 50 including the UV absorber in the thin film encapsulation portion 530 may be able to prevent deterioration of the light-emitting device 520, which is caused by outgassing of the pixel defined layer 540 upon the UV light, and damage of an insulating film or the emission layer including an organic material.

In one embodiment, an amount of the UV absorber may be in a range of about 0.1 parts to about 20 parts by weight, for example, about 0.5 parts to about 5 parts by weight, based on 100 parts by weight of the composition for forming the organic film. By controlling the amount of the UV absorber in the organic film, the maximum absorption wavelength of the organic film may be finely adjusted, and accordingly, the UV absorption spectrum of the organic film may be also controlled. When the amount of the UV absorber is less than about 0.1 parts by weight, the thin film encapsulation portion 530 may fail to sufficiently secure light stability. When the amount of the UV absorber is greater than 20 parts by weight, the transmittance in a visible light area of the thin film encapsulation portion 530 may be inhibited while the light emission efficiency of the light-emitting device (e.g., a blue light-emitting device having a maximum wavelength between 430 nm and 460 nm) may be inhibited.

When the amount of the UV absorber is within the range above, excellent UV blocking effect may be achieved. For example, when the electronic apparatus 50 includes a light-emitting device, the thin film encapsulation portion 530 may have high light stability due to the UV absorber so that the thin film encapsulation portion 530 may be able to effectively protect a light-emitting device, specifically, an organometallic compound in the emission layer, from UV light.

In one embodiment, the composition for forming the organic film may include the UV absorber and a curable material. The curable material may include at least one selected from an acryl-based material, a methacryl-based material, an acrylate-based material, a methacrylate-based material, a vinyl-based material, an epoxy-based material, a urethane-based material, and a cellulose-based material.

The curable material may include an acrylate-based material, an epoxy compound-based material or a combination thereof.

For example, a cured product of the composition including the curable material and the UV absorber for forming the organic film may include a (meth)acrylate resin derived from the (meth)acrylate compound, and may further include at least one selected from an isoprene-based resin, a vinyl-based resin, an epoxy-based resin, an urethane-based resin, a cellulose-based resin, a perylene-based resin, an imide-based resin, and a silicon-based resin that are derived from at least one selected from the vinyl-based compound, the epoxy-based compound, the urethane-based compound, and the cellulose-based compound In one embodiment, the organic film may have a structure in which the UV absorber is dispersed in the cured product of the curable material. Here, the UV absorber may be simply dispersed in the cured product of the curable material, or the UV absorber may be cross-linked with the cured product of the curable material. For example, the UV absorber may include a polymerizable functional group, and the UV absorber may be cross-linked with the cured product of the curable material.

In one embodiment, the curable material may include at least one (meth)acrylate-based compound.

For example, the (meth)acrylate-based compound may have a weight average molecular weight (Mw) in a range of about 50 to about 999.

In one embodiment, the curable material may include at least one di(meth)acrylate compound and at least one mono (meth)acrylate compound.

By controlling the amount ratio of the di(meth)acrylate compound to the mono(meth)acrylate compound, the viscosity of the composition for forming the organic film may be controlled, and accordingly, the thin-film processability (coatability) may be also improved.

For example, when the composition for forming the organic film has low viscosity (e.g., 50 cp or more), the UV absorber may have excellent dispersibility so that a thin film having a thickness of at least 1 μm may be easily formed and a pattern resolution of at least 1 μm for a thin film may be implemented. In addition, due to the low viscosity, the composition for forming the organic film may be thinned through various thinning processes, such as inkjet printing and vacuum deposition.

In one embodiment, the di(meth)acrylate compound may be selected from:
  a compound represented by Formula 100; and
  ethylene glycol di(meth)acrylate, diethylene glycol di(meth)acrylate, triethylene glycol di(meth)acrylate, propylene glycol di(meth)acrylate, dipropylene glycol di(meth)acrylate, neopentyl glycol di(meth)acrylate, 1,4-butanediol di(meth)acrylate, 1,6-hexanediol di(meth)acrylate, bisphenol-A di(meth)acrylate, pentaerythritol di(meth)acrylate, and dipentaerythritol di(meth) acrylate:

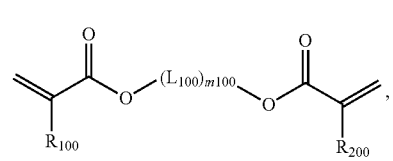

Formula 100 wherein, in Formula 100,
  $L_{100}$ may be —O—, —S—, S(=O)$_2$—, —C(=O)—, —C(=O)O—, —C(=O)NH—, —N($R_{106}$)—, —C($R_{106}$)($R_{107}$)—, —Si($R_{106}$)($R_{107}$)—, or an unbranched $C_6$-$C_{20}$ alkylene group,
  m100 may be an integer of 1 to 10, and
  $R_{100}$, $R_{200}$, $R_{106}$, and $R_{107}$ may each independently be selected from hydrogen, deuterium, a $C_1$-$C_{20}$ alkyl group, a $C_2$-$C_{20}$ alkenyl group, a $C_2$-$C_{20}$ alkynyl group, a $C_1$-$C_{20}$ alkoxy group; and deuterium, —F, —Cl, —Br, —I, a hydroxyl group, a cyano group, an epoxy group, a nitro group, an amidino group, a hydrazino group, a hydrazono group, a substituted or unsubstituted $C_1$-$C_{20}$ alkyl group, and a substituted or unsubstituted $C_1$-$C_{20}$ alkoxy group.

For example, at least one of the di(meth)acrylate may be a compound represented by Formula 100.

In one embodiment, the curable material may include a compound represented by Formula 100, and may further include at least one selected from ethylene glycol di(meth)acrylate, diethylene glycol di(meth)acrylate, triethylene glycol di(meth)acrylate, propylene glycol di(meth)acrylate, dipropylene glycol di(meth)acrylate, neopentyl glycol di(meth)acrylate, 1,4-butanediol di(meth)acrylate, 1,6-hexanediol di(meth)acrylate, bisphenol-A di(meth)acrylate, pentaerythritol di(meth)acrylate, and dipentaerythritol di(meth)acrylate.

In one embodiment, the mono(meth)acrylate compound may be selected from biphenyloxy ethyl (meth)acrylate, methyl (meth)acrylate, ethyl (meth)acrylate, n-propyl (meth)acrylate, isopropyl (meth)acrylate, n-butyl (meth)acrylate, isoamyl (meth)acrylate, isobutyl (meth)acrylate, isooctyl (meth)acrylate, sec-butyl (meth)acrylate, t-butyl (meth)acrylate, n-pentyl (meth)acrylate, 3-methylbutyl (meth)acrylate, n-hexyl (meth)acrylate, 2-ethyl-n-hexyl (meth)acrylate, n-octyl (meth)acrylate, cyclohexyl (meth)acrylate, isobornyl (meth)acrylate, dicyclopentanyl (meth)acrylate, dicyclopentanyloxyethyl (meth)acrylate, isomiristyl (meth)acrylate, lauryl (meth)acrylate, methoxydipropylene glycol (meth)acrylate, methoxytripropylene glycol(meth)acrylate, benzyl(meth)acrylate, 2-hydroxyethyl (meth)acrylate, 2-hydroxypropyl (meth)acrylate, 3-hydroxypropyl (meth)acrylate, 4-hydroxybutyl (meth)acrylate, 5-hydroxypentyl (meth)acrylate, 6-hydroxyhexyl (meth)acrylate, 4-hydroxycyclohexyl (meth)acrylate, neopentylglycol mono(meth)acrylate, 3-chloro-2-hydroxypropyl (meth)acrylate, (1,1-dimethyl-3-oxobutyl) (meth)acrylate, 2-acetoacetoxyethyl (meth)acrylate, 2-methoxyethyl (meth)acrylate, 2-ethoxyethyl (meth)acrylate, neopentylglycol mono(meth)acrylate, ethylene glycol monomethyl ether (meth)acrylate, glycerin mono(meth)acrylate, 2-acryloyloxyethyl phthalate, 2-acryloyloxy 2-hydroxyethyl phthalate, 2-acryloyloxyethyl hexahydrophthalate, 2-acryloyloxy propylphthalate, neopentylglycolbenzoate (meth)acrylate, nonylphenoxypolyethylene glycol (meth)acrylate, nonylphenoxypolypropylene glycol (meth)acrylate, paracumylphenoxyethylene glycol (meth)acrylate, ECH modified phenoxy acrylate, phenoxyethyl (meth)acrylate, phenoxydiethylene glycol (meth)acrylate, phenoxyhexaethylene glycol (meth)acrylate, phenoxytetraethylene glycol (meth)acrylate, polyethylene glycol (meth)acrylate, polyethylene glycol phenylether (meth)acrylate, polyethylene glycol-polypropylene glycol (meth)acrylate, polypropylene glycol (meth)acrylate, stearyl (meth)acrylate, ethoxylated phenol acrylate (Phenol (EO) acrylate), ethoxylated cresol (meth)acrylate, dipropylene glycol (meth)acrylate, ethoxylated phenyl (meth)acrylate, ethoxylated succinate (meth)acrylate, tert-butyl (meth)acrylate, tribromophenyl (meth)acrylate, ethoxylated tribromophenyl (meth)acrylate, tridodecyl (meth)acrylate, and tetrahydrofurfuryl (meth)acrylate(Tetrahydofurfuryl (meth)acrylate), but embodiments of the present disclosure are not limited thereto.

For example, at least one of the mono(meth)acrylate compound may be biphenyloxy ethyl(meth)acrylate.

In one embodiment, the curable material may include the biphenyloxy ethyl (meth)acrylate, and may further include at least one compound selected from methyl (meth)acrylate, ethyl (meth)acrylate, n-propyl (meth)acrylate, isopropyl (meth)acrylate, n-butyl (meth)acrylate, isoamyl (meth)acrylate, isobutyl (meth)acrylate, isooctyl (meth)acrylate, sec-butyl (meth)acrylate, t-butyl (meth)acrylate, n-pentyl (meth)acrylate, 3-methylbutyl (meth)acrylate, n-hexyl (meth)acrylate, 2-ethyl-n-hexyl (meth)acrylate, n-octyl (meth)acrylate, cyclohexyl (meth)acrylate, isobornyl (meth)acrylate, dicyclopentanyl (meth)acrylate, dicyclopentanyloxyethyl (meth)acrylate, isomiristyl (meth)acrylate, lauryl (meth)acrylate, methoxydipropylene glycol (meth)acrylate, methoxytripropylene glycol(meth)acrylate, benzyl(meth)acrylate, 2-hydroxyethyl (meth)acrylate, 2-hydroxypropyl (meth)acrylate, 3-hydroxypropyl (meth)acrylate, 4-hydroxybutyl (meth)acrylate, 5-hydroxypentyl (meth)acrylate, 6-hydroxyhexyl (meth)acrylate, 4-hydroxycyclohexyl (meth)acrylate, neopentylglycol mono(meth)acrylate, 3-chloro-2-hydroxypropyl (meth)acrylate, (1,1-dimethyl-3-oxobutyl) (meth)acrylate, 2-acetoacetoxyethyl (meth)acrylate, 2-methoxyethyl (meth)acrylate, 2-ethoxyethyl (meth)acrylate, neopentylglycol mono(meth)acrylate, ethylene glycol monomethyl ether (meth)acrylate, glycerin mono(meth)acrylate, 2-acryloyloxyethyl phthalate, 2-acryloyloxy 2-hydroxyethyl phthalate, 2-acryloyloxyethyl hexahydrophthalate, 2-acryloyloxy propylphthalate, neopentylglycolbenzoate (meth)acrylate, nonylphenoxypolyethylene glycol (meth)acrylate, nonylphenoxypolypropylene glycol (meth)acrylate, paracumylphenoxyethylene glycol (meth)acrylate, ECH modified phenoxy acrylate, phenoxyethyl (meth)acrylate, phenoxydiethylene glycol (meth)acrylate, phenoxyhexaethylene glycol (meth)acrylate, phenoxytetraethylene glycol (meth)acrylate, polyethylene glycol (meth)acrylate, polyethylene glycol phenylether (meth)acrylate, polyethylene glycol-polypropylene glycol (meth)acrylate, polypropylene glycol (meth)acrylate, stearyl (meth)acrylate, ethoxylated phenol acrylate (Phenol (EO) acrylate), ethoxylated cresol (meth)acrylate, dipropylene glycol (meth)acrylate, ethoxylated phenyl (meth)acrylate, ethoxylated succinate (meth)acrylate, tert-butyl (meth)acrylate, tribromophenyl (meth)acrylate, ethoxylated tribromophenyl (meth)acrylate, tridodecyl (meth)acrylate, and tetrahydrofurfuryl (meth)acrylate(Tetrahydofurfuryl (meth)acrylate).

In one embodiment, the curable material may include the di(meth)acrylate compound and the mono(meth)acrylate compound, and may further include multifunctional (meth)acrylate having at least 3 functional groups.

In one embodiment, the multifunctional (meth)acrylate having at least 3 functional groups may include pentaerythritol tri(meth)acrylate, pentaerythritol tetra(meth)acrylate, pentaerythritol hexa(meth)acrylate, dipentaerythritol tri (meth)acrylate, dipentaerythritol penta(meth)acrylate, dipentaerythritol hexa(meth)acrylate, trimethylolpropane tri (meth)acrylate, tris(metha)acryloyloxyethyl phosphate, ethoxylated trimethylolpropane tri(meth)acrylate, ethoxylated pentaerythritol tetra(meth)acrylate, ethoxylated glycerol tri(meth)acrylate, phosphine oxide (PO) modified glycerol tri(meth)acrylate, pentaerythritol tri(meth)acrylate, ethoxylated phosphoric acid triacrylate, trimethylolpropane tri(meth)acrylate, caprolactone modified trimethylolpropanetri(meth)acrylate, ethoxylated trimethylolpropanetri(meth)acrylate, PO modified trimethylolpropanetri(meth)acrylate, tris(acryloxyethyl)isocyanurate, dipentaerythritolhexa (meth)acrylate, caprolactone modified dipentaerythritolhexa (meth)acrylate, dipentaerythritolhydroxypenta(meth)acrylate, alkyl modified dipentaerythritolpenta(meth)acrylate, dipentaerythritolpoly(meth)acrylate, alkyl modified dipentaerythritoltri(meth)acrylate, or any combination thereof.

In one or more embodiments, the multifunctional (meth)acrylate monomer having at least 3 functional groups may include a multifunctional (meth)acrylate monomer having at least 4 functional group.

In one or more embodiments, the multifunctional (meth)acrylate monomer having at least 3 functional groups may include pentaerythritol tetra(meth)acrylate, pentaerythritol hexa(meth)acrylate, dipentaerythritol penta(meth)acrylate, dipentaerythritol hexa(meth)acrylate, ethoxylated pentaerythritol tetra(meth)acrylate, caprolactone modified dipentaerythritol hexa(meth)acrylate, dipentaerythritol hydroxypenta(meth)acrylate, alkyl modified dipentaerythritol penta(meth)acrylate, or any combination thereof.

In one or more embodiments, the multifunctional (meth)acrylate monomer having at least 3 functional groups may include tetra-functional (meth)acrylate and hexa-functional (meth)acrylate.

In one or more embodiments, the multifunctional (meth)acrylate monomer having at least 3 functional groups may include pentaerythritol tetra(meth)acrylate, dipentaerythritol tetra(meth)acrylate, ethoxylated pentaerythritol tetra(meth)acrylate, ethoxylated dipentaerythritol tetra(meth)acrylate pentaerythritol hexa(meth)acrylate, dipentaerythritol hexa(meth)acrylate, or any combination thereof.

In one embodiment, an amount of the curable material may be in a range of about 90 parts to about 99 parts by weight based on 100 parts by weight of the composition for forming the organic film.

In one embodiment, the composition for forming the organic film may further include a photopolymerization initiator.

In one embodiment, the photopolymerization initiator may be any material known in the art without particular limitation, and for example, may be a material curable at a wavelength range between 360 nm and 450 nm.

In one embodiment, the composition for forming the organic film may further include two or more types of the photopolymerization initiator. For example, among the two or more types of the photopolymerization initiator, one type of the photopolymerization initiator may be cured in an UV region (for example, having a wavelength range between 360 nm and 450 nm), and the other type of the photopolymerization initiator may be cured in a visible ray region (for example, having a wavelength range between 450 nm and 770 nm). In one or more embodiments, the two or more types of the photopolymerization initiator may be all cured in the UV region or in the visible ray region.

In one embodiment, the photopolymerization initiator may include at least one selected from an organic peroxide-based compound, an azo-based compound, a benzophenone-based compound, an oxim-based compound, and a phosphine oxide-based compound. For example, the photopolymerization initiator may be a phosphine oxide-based compound.

For example, the photopolymerization initiator may be a phosphine oxide-based compound, and the phosphine oxide-based compound may include Diphenyl(2,4,6-trimethylbenzoyl)phosphine oxide.

In one embodiment, an amount of the photopolymerization initiator may be in a range of about 0.5 parts to about 5 parts by weight based on 100 parts by weight of the composition for forming the organic film.

In one or more embodiments, the composition for forming the organic film may further include an adhesive, a radical scavenger, and the like, as needed.

In one embodiment, the thin film encapsulation portion 530 may further include a metal, a metal halide, a metal nitride, a metal oxide, a metal oxynitride, a silicon nitride, a silicon oxide, and a silicon oxynitride.

For example, the thin film encapsulation portion 530 may include at least one selected from $MgF_2$, LiF, $AlF_3$, NaF, silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, and magnesium oxide, but embodiments of the present disclosure are not limited thereto.

In one embodiment, the thin film encapsulation portion 530 including the organic film formed by the composition for forming the organic film may have transmittance of less than about 10% for light having a wavelength range between about 400 nm and about 420 nm (for example, about 405 nm).

In one or more embodiments, the thin film encapsulation portion 530 including the organic film formed by the composition for forming the organic film may have transmittance of less than about 10% for light having a wavelength range between about 400 nm and about 420 nm (for example, about 405 nm), and also may have transmittance of greater than 80% for light having a wavelength of 430 nm or more.

In one embodiment, the organic film may have transmittance of greater than about 80% for light having a wavelength range between 430 nm and 800 nm, and may also have transmittance of 10% or less for light having a wavelength of about 405 nm or less.

In one embodiment, the organic film may have transmittance of about 10% or less (for example, about 8% or less) for light having a wavelength range between about 400 nm and about 410 nm (for example, about 405 nm).

In one or more embodiments, the organic film may have transmittance of about 80% or more (for example, about 90% or more) for light having a wavelength of about 430 nm or more, and may also have transmittance of about 10% or less for light having a wavelength of about 405 nm or less.

In one or more embodiments, the thin film encapsulation portion 530 including the organic film formed by the composition for forming the organic film may have a change in transmittance of less than about 1% at a wavelength of about 405 nm, when exposed to UV light (having a wavelength range between about 380 nm to about 400 nm) at an exposure amount of about 52,000 $Wh/m^2$.

In one embodiment, the organic film may have a change in transmittance of less than about 3% at a wavelength range of about 400 nm or more and less than about 410 nm, when exposed to light at an exposure amount of about 52,000 $Wh/m^2$.

In one or more embodiments, the organic film may have a change in transmittance of less than about 1% at wavelength range of about 400 nm or more and less than about 405 nm, when exposed to light at an exposure amount of about 52,000 $Wh/m^2$.

In one embodiment, the organic film may have a change in transmittance of less than about 3% at a wavelength range of about 400 nm or more and less than about 410 nm, when exposed to light having a maximum emission wavelength of about 405 nm or light having a wavelength range between about 380 nm and about 410 nm at an exposure amount of about 52,000 $Wh/m^2$.

In one or more embodiments, the organic film may have a change in transmittance of less than about 1% at wavelength range of about 400 nm or more and less than about 405 nm, when exposed to light having a maximum emission wavelength of about 405 nm or light having a wavelength range between about 380 nm and about 410 nm at an exposure amount of about 52,000 $Wh/m^2$.

The change in transmittance within the wavelength range above may be measured by, for example, exposing the organic film to an LED lamp emitting light having a wavelength range between about 380 nm and about 410 nm and a maximum emission wavelength of about 405 nm.

In one embodiment, a thickness of the organic film may be in a range between about 10 nm and 20 μm, and for example, between about 10 nm and about 10 μm.

In one embodiment, the organic film my further include a matrix resin, and the matrix resin may include at least one selected from an acryl-based resin, a methacryl-based resin, an isoprene-based resin, a vinyl-based resin, an epoxy-based resin, an urethane-based resin, a cellulose-based resin, a perylene-based resin, an imide-based resin, and a silicon-based resin.

In one or more embodiments, the at least one organic film may further include an initiator in addition to the curable material and the UV absorber. The initiator is defined the same as described above.

In one or more embodiments, the at least one organic film may further include the matrix resin and the initiator.

The at least one organic film may be formed in a predetermined region by using one or more suitable methods selected from vacuum deposition, spin coating, casting, Langmuir-Blodgett (LB) deposition, ink-jet printing, laser-printing, and laser-induced thermal imaging (LITI). Here, the number and thickness of the organic film may be appropriately selected in consideration of productivity and device characteristics.

In one embodiment, the thin film encapsulation portion 530 may include at least one organic film, and the at least one organic film may include a first organic film, wherein the first organic film may include a cured product of the composition for forming the organic film, the composition including the curable material and the UV absorber.

In one embodiment, the thin film encapsulation portion 530 may further include at least one inorganic film, and the at least one inorganic film may include a first inorganic film.

In one embodiment, the thin film encapsulation portion 530 may further include at least one inorganic film, and the at least one inorganic film may include a first inorganic film.

The at least one organic film may include the first organic film, and the first organic film may include a cured product of the composition for forming the organic film, the composition including the curable material and the UV absorber.

In one embodiment, the first organic film may be disposed between the light-emitting device 520 and the first inorganic film, or the first inorganic film may be disposed between the light-emitting device 520 and the first organic film.

In one embodiment, the thin film encapsulation portion 530 may further include at least one inorganic film, and the at least one inorganic film may include the first inorganic film.

In one embodiment, the thin film encapsulation portion 530 may further include at least one inorganic film, and the thin film encapsulation portion 530 may include a sealing unit in which the organic film and the inorganic film are stacked, in the number of n, wherein n is an integer of 1 or more.

In one embodiment, the inorganic film may include a metal, a metal halide, a metal nitride, a metal oxide, a metal oxynitride, a silicon nitride, a silicon oxide, and a silicon oxynitride.

For example, the inorganic film may include at least one selected from $MgF_2$, LiF, $AlF_3$, NaF, silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, and magnesium oxide, but embodiments of the present disclosure are not limited thereto.

The at least one inorganic film may be formed in predetermined region by using one or more suitable methods selected from chemical vapor deposition (CVD), plasma enhanced chemical vapor deposition (PECVD), sputtering, atomic layer deposition (ALD), and thermal evaporation. Here, the number and thickness of the inorganic film may be appropriately selected in consideration of productivity and device characteristics.

In one embodiment, the at least one organic film may include the first organic film, and the at least one inorganic film may include the first inorganic film, wherein the first organic film may be disposed between the light-emitting device 520 and the first inorganic film. For example, the at least one organic film may include the first organic film, and the at least one inorganic film may include the first inorganic film, wherein the first organic film and the first inorganic film may be stacked in this stated order from the light-emitting device 520. Here, the meaning of the expression "stacked in this stated order" is understood that a case where a layer is disposed between the light-emitting device 520 and the first organic film, and/or a case where a layer is disposed between the first organic film and the first inorganic film is not excluded.

In one or more embodiments, the at least one organic film may include the first organic film, and the at least one inorganic film may include the first inorganic film, wherein the first inorganic film may be disposed between the light-emitting device 520 and the first organic film. For example, the at least one organic film may include the first organic film, and the at least one inorganic film may include the first inorganic film, wherein the first inorganic film and the first organic film may be stacked in this stated order from the light-emitting device 520.

In one or more embodiments, the at least one organic film may include the first organic film, and the at least one inorganic film may include the first inorganic film and the second inorganic film, wherein the first inorganic film, the first organic film, and the second inorganic film may be stacked in this stated order from the light-emitting device 520.

In one or more embodiments, the at least one organic film may include the first organic film and the second organic film, and the at least one inorganic film may include the first inorganic film, wherein the first organic film, the first inorganic film, and the second organic film may be stacked in this stated order from the light-emitting device 520.

In one or more embodiments, the at least one organic film may include the first organic film and the second organic film, and the at least one inorganic film may include the first inorganic film and the second inorganic film, wherein the first inorganic film, the first organic film, the second inorganic film, and the second organic film may be stacked in this stated order from the light-emitting device 520.

In one or more embodiments, the at least one organic film may include the first organic film and the second organic film, and the at least one inorganic film may include the first inorganic film and the second inorganic film, wherein the first organic film, the first inorganic film, the second organic film, and the second inorganic film may be stacked in this stated order from the light-emitting device 520.

In one or more embodiments, the at least one organic film may include the first organic film and the second organic film, and the at least one inorganic film may include the first inorganic film and the second inorganic film, wherein the first inorganic film, the second inorganic film, the first organic film, and the second organic film may be stacked in this stated order from the light-emitting device 520.

In one or more embodiments, the at least one organic film may include the first organic film and the second organic film, and the at least one inorganic film may include the first inorganic film and the second inorganic film, wherein the first organic film, the second organic film, the first inorganic film, and the second inorganic film may be stacked in this stated order from the light-emitting device 520.

In one or more embodiments, the at least one organic film may include the first organic film and the second organic film, and the at least one inorganic film may include the first inorganic film, the second inorganic film, and a third inorganic film, wherein the first inorganic film, the first organic film, the second inorganic film, the second organic film, and the third inorganic film may be stacked in this stated order from the light-emitting device 520.

In one or more embodiments, the at least one organic film may include the first organic film, the second organic film and the third organic film, and the at least one inorganic film may include the first inorganic film and the second inorganic film, wherein the first organic film, the first inorganic film, the second organic film, the second inorganic film, and the third organic film may be stacked in this stated order from the light-emitting device 520, but embodiments of the present disclosure are not limited thereto. Not only the number of the organic film and the inorganic film, but also the stacking order of the inorganic film and the organic film may be appropriately modified according to the design.

The thin film encapsulation portion 530 may further include at least one low inorganic film or low organic film between the sealing unit and the organic light-emitting device 520 or between the sealing unit and the pixel defined layer 540.

In one embodiment, a thin-film unit may include an organic-inorganic composite layer in which the organic film and the inorganic film are stacked in this stated order from the light-emitting device 520 and the pixel defined layer 540, or an inorganic-organic composite film in which the inorganic film and the organic film are stacked in this stated order from the light-emitting device 520 and the pixel defined layer 540.

In one embodiment, the thin film encapsulation portion 530 may include at least one thin-film unit, and may further include at least one organic film between the sealing unit and the light-emitting device 520 or between the sealing unit and the pixel defined layer 540.

In one embodiment, the thin film encapsulation portion 530 may include at least one thin-film unit, and may further include at least one inorganic film between the sealing unit and the light-emitting device 520 or between the sealing unit and the pixel defined layer 540.

In one embodiment, the thin film encapsulation portion 530 may include two types of the thin-film unit.

In one embodiment, the thin film encapsulation portion 530 may include two types of the thin-film unit, and may further include at least one organic film between the thin-film unit and the light-emitting device 520 or between the thin-film unit and the pixel defined layer 540.

In one embodiment, the thin film encapsulation portion 530 may include two types of the thin-film unit, and may further include at least one inorganic film between the thin-film unit and the light-emitting device 520 or between the thin-film unit and the pixel defined layer 540.

For example, the thin film encapsulation portion 530 may have a first inorganic film/first organic film/second inorganic film structure, a first organic film/first inorganic film/second organic film/second inorganic film structure, a first inorganic film/second inorganic film/first organic film/third inorganic film/second organic film structure, or a first organic film/second organic film/first inorganic film/third organic film/second inorganic film structure, but embodiments of the present disclosure are not limited thereto. Here, the number and stacking order of the organic film and the inorganic film may be appropriately modified.

In one embodiment, between the sealing unit and the light-emitting device 520 or between the sealing unit and the pixel defined layer 540, at least one of a capping layer or a protection layer may be further disposed.

According to an embodiment of the present disclosure, a light-emitting device may include a first electrode;
   a second electrode facing the first electrode;
   m emission units stacked between the first electrode and the second electrode; and
   m−1 charge generating layer(s) between each of the two adjacent emission units from among the m emission units, the m−1 charge generating layer(s) including m−1 n-type charge generating layer(s) and m−1 p-type charge generating layer(s),
   wherein m may be an integer of 2 or greater,
   a maximum emission wavelength of light emitted from at least one of the m emission units may differ from that of light emitted from at least one of the other emission units,
   at least one of the m−1 n-type charge generating layer(s) may include a metal-containing material and an electron transporting metal-non-containing material,
   the metal-containing material may include a metal, a metal complex, or a combination thereof,
   the metal may include a rare-earth metal, a transition metal, a late transition metal, or a combination thereof, and
   the metal complex may include an alkali metal, an alkaline earth metal, a rare-earth metal, a transition metal, a late transition metal, or a combination thereof.

Figure 5:
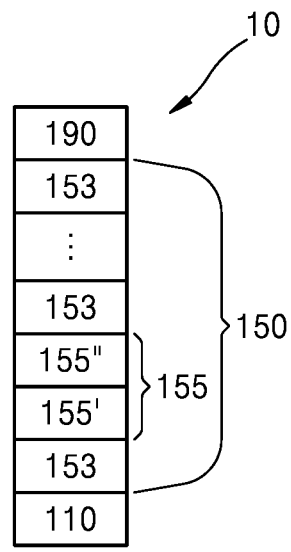
FIG. 5 is a schematic cross-sectional view illustrating a light-emitting device according to an embodiment.

FIG. 5 illustrates a schematic view of a light-emitting device 10 according to an embodiment of the present disclosure. As shown in FIG. 5, a light-emitting device 10 according to an embodiment may include a first electrode 110; a second electrode 190 facing the first electrode; m emission units 153 stacked between the first electrode 110 and the second electrode 120; and m−1 charge generating layer(s) 155 between each of the two adjacent emission units 153 from among the m emission units 153, the m−1 charge generating layer(s) including m−1 n-type charge generating layer(s) 155' and m−1 p-type charge generating layer(s) 155" (e.g., each charge generating layer 155 may include an n-type charge generating layer 155' and a p-type charge generating layer 155").

The "emission unit" as used herein is not particularly limited and may be any suitable emission unit capable of emission. In some embodiments, the emission unit may include at least one emission layer. In some embodiments, the emission unit may further include an organic layer, in addition to an emission layer.

The light-emitting device 10 may include m stacked emission units 153, wherein m may be an integer of 2 or greater. m, which denotes the number of emission units, may be any suitable integer, and the upper limit of the number of emission units is not particularly limited. In some embodiments, the light-emitting device may include 2, 3, 4, or 5 emission units.

A maximum emission wavelength of light emitted from at least one of the m emission units may differ from that of light emitted from at least one of the other emission units. In some embodiments, in a light-emitting device that includes a first emission unit and a second emission unit that are stacked together, the maximum emission wavelength of light emitted from the first emission unit may differ from that of light emitted from the second emission unit. In this case, an emission layer of the first emission unit and that of the second emission unit may each independently include i) a single-layered structure including a single layer that includes a single material, ii) a single-layered structure including a single layer that includes a plurality of different materials, or iii) a multi-layered structure having a plurality of layers that include a plurality of different materials. Accordingly, light emitted from the first emission unit or the second emission unit may be single color light or mixed color light. In some embodiments, in a light-emitting device that includes a first emission unit, a second emission unit, and a third emission unit that are stacked together, the maximum emission wavelength of light emitted from the first emission unit may be the same as that of light emitted from the second emission unit, whereas the maximum emission wavelength of light emitted from the third emission unit may differ from that of light emitted from the first and second emission units. In some embodiments, the maximum emission wavelength of light emitted from the first emission unit, the maximum emission wavelength of light emitted from the second emission unit, and the maximum emission wavelength of light emitted from the third emission unit may differ from one another.

The light-emitting device 10 may include the charge generating layer 155 between the two adjacent emission units 153 from among the m emission units 153. Here, the term "adjacent" as used herein may refer to an arrangement of two layers positioned closest to each other. In some embodiments, the term "two adjacent emission units" may refer to an arrangement of two emission units disposed closest to each other from among a plurality of emission units. For example, the term "adjacent" may refer to an arrangement of two layers that, in some embodiments, may physically contact each other, and in other embodiments, may have another layer disposed therebetween. In some embodiments, an emission unit adjacent to a second electrode may refer to an emission unit disposed closest to the second electrode from among a plurality of emission units. In some embodiments, the second electrode may physically contact the emission unit, or additional layers other than the emission units may be present between the second electrode and the emission unit. In some embodiments, an electron transport layer may be between the second electrode and the emission unit. A charge generating layer may be between two adjacent emission units.

The charge generating layer may function as a cathode for one of the two adjacent emission units by generating electrons and as an anode for the other emission unit by generating holes. The charge generating layer may separate adjacent emission units, while not being directed connected to an electrode. In some embodiments, a light-emitting device including m emission units may include m−1 charge generating layer(s).

The charge generating layer 155 may include the n-type charge generating layer 155' and the p-type charge generating layer 155". In some embodiments, the n-type charge generating layer 155' and the p-type charge generating layer 155" may directly contact each other so as to form an NP junction (e.g., a P-N junction). Due to the NP junction, electrons and holes may be concurrently or simultaneously generated between the n-type charge generating layer 155' and the p-type charge generating layer 155". The generated electrons may be transferred to one emission unit of the two adjacent emission units through the n-type charge generating layer 155'. The generated holes may be transferred to another emission unit of the two adjacent emission units through the p-type charge generating layer 155". In addition, since the charge generating layers 155 may each include one n-type charge generating layer 155' and one p-type charge generating layer 155", the light-emitting device 10 that includes m−1 charge generating layer(s) 155 may include m−1 n-type charge generating layer(s) 155' and m−1 p-type charge generating layer(s) 155".

The term "n-type" as used herein may refer to n-type semiconductor properties, for example, properties capable of injection and transport of electrons. The term "p-type" as used herein may refer to p-type semiconductor properties, for example, properties capable of injection and transport of holes.

At least one of the m−1 n-type charge generating layer(s) may include a metal-containing material and an electron transporting metal-non-containing material (e.g., electron transporting material that does not include metal).

The metal-containing material may include a metal, a metal complex, or a combination thereof.

According to an embodiment, when at least one of the m−1 n-type charge generating layer(s) includes a metal as the metal-containing material, the metal may include a rare-earth metal, a transition metal, a late transition metal, or a combination thereof. In some embodiments, when at least one of the m−1 n-type charge generating layer(s) includes a metal as the metal-containing material, the metal may be selected from lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). According to an embodiment, when at least one of the m−1 n-type charge generating layer(s) includes a metal as the metal-containing material, the metal may be Yb, but embodiments are not limited thereto.

In one or more embodiments, when at least one of the m−1 n-type charge generating layer(s) includes a metal complex as the metal-containing material, the metal complex may include an alkali metal, an alkaline earth metal, a rare-earth metal, a transition metal, a late transition metal, or a combination thereof. In some embodiments, when at least one of the m−1 n-type charge generating layer(s) includes a metal complex as the metal-containing material, a metal of the metal complex may be selected from lithium (Li), aluminum (Al), titanium (Ti), zirconium (Zr), hafnium (Hf), zinc (Zn), and copper (Cu). According to an embodiment, when at least one of the m−1 n-type charge generating layer(s) includes a metal complex as the metal-containing material, the metal complex may be a Li complex or an Al complex, but embodiments are not limited thereto.

When at least one of the m−1 n-type charge generating layer(s) includes a metal complex as the metal-containing material, the metal complex may include at least one organic ligand selected from a hydroxyquinoline, a hydroxyisoquinoline, a hydroxy benzoquinoline, a hydroxyacridine, a hydroxyphenanthridine, a hydroxyphenyl oxazole, a hydroxyphenyl thiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene. In some embodiments, when at least one of the m−1 n-type charge generating layer(s) includes a metal complex as the metal-containing material, the metal complex may include at least one selected from a substituted or unsubstituted hydroxyquinoline and a substituted or unsubstituted hydroxyphenyl benzothiazole, but embodiments are not limited thereto.

In some embodiments, when at least one of the m−1 n-type charge generating layer(s) includes a metal complex as the metal-containing material, the metal complex may be a lithium quinolate (Liq) and/or an aluminum quinolate (Alq3).

In some embodiments, a lowest unoccupied molecular orbital (LUMO) energy level of the electron transporting metal-non-containing material may be about −4.0 electron volts (eV) or greater. In some embodiments, a LUMO energy level of the electron transporting metal-non-containing material may be about −3.8 eV or greater. In some embodiments, a LUMO energy level of the electron transporting metal-non-containing material may be about −3.5 eV or greater.

Since an organic compound having a LUMO energy level of about −4.0 eV or greater has a slight difference in LUMO energy level with peripheral layers, the organic compound may efficiently (or suitably) transfer electrons generated in the n-type charge generating layer to the peripheral layers.

In one or more embodiments, the electron transporting metal-non-containing material may be an organic compound including at least one π electron-depleted nitrogen-containing ring.

The term "π electron-depleted nitrogen-containing ring" as used herein may refer to a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed (e.g., fused), and/or iii) a heteropolycyclic group in which at least one 5-membered to 7-membered heteromonocyclic group having at least one *—N=*' moiety is condensed with at least one $C_5$-$C_{60}$ carbocyclic group.

In some embodiments, the electron transporting metal-non-containing material may be an organic compound including at least one selected from an imidazole ring, a pyrazole ring, a thiazole ring, an isothiazole ring, an oxazole ring, an isoxazole ring, a pyridine ring, a pyrazine ring, a pyrimidine ring, a pyridazine ring, an indazole ring, a purine ring, a quinoline ring, an isoquinoline ring, a benzoquinoline ring, a phthalazine ring, a naphthyridine ring, a quinoxaline ring, a quinazoline ring, a cinnoline ring, a phenanthridine ring, an acridine ring, a phenanthroline ring, a phenazine ring, a benzoimidazole ring, an iso-benzothiazole ring, a benzoxazole ring, an isobenzoxazole ring, a triazole ring, a tetrazole ring, an oxadiazole ring, a triazine ring, a thiadiazole ring, an imidazopyridine ring, an imidazopyrimidine ring, and indenoquinoline ring. In some embodiments, the electron transporting metal-non-containing material may be an organic compound including at least one selected from a phenanthroline ring, an imidazole ring, a pyridine ring, a pyrazine ring, a pyrimidine ring, a pyridazine ring, and a triazine ring.

According to an embodiment, the electron transporting metal-non-containing material may be represented by Formula 1:

$[Ar_1]_{c1}$-$[(L_1)_{a1}$-$R_1]_{b1}$,  Formula 1 wherein, in Formula 1, $Ar_1$ may be a substituted or unsubstituted $C_5$-$C_{60}$ carbocyclic group or a substituted or unsubstituted $C_1$-$C_{60}$ heterocyclic group, c1 may be 1, 2, or 3, when c1 is 2 or greater, a plurality of $Ar_1$(s) may be identical to or different from each other, and the plurality of $Ar_1$(s) may be connected to a respective one another via a single bond, $L_1$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1 may be an integer selected from 0 to 5, when a1 is 0, *-$(L_1)_{a1}$-*' may be a single bond, and when a1 is 2 or greater, a plurality of $L_1$(s) may be identical to or different from each other, $R_1$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —C(=O)($Q_1$), —S(=O)$_2$($Q_1$), and —P(=O)($Q_1$)($Q_2$), wherein $Q_1$ to $Q_3$ may be each independently a $C_1$-$C_{10}$ alkyl group, a $C_1$-$C_{10}$ alkoxy group, a phenyl group, a biphenyl group, a terphenyl group, or a naphthyl group, b1 may be an integer selected from 1 to 5, and when b1 is 2 or greater, a plurality of $[(L_1)_{a1}$-$R_1]$(s) may be identical to or different from each other.

In some embodiments, in Formula 1, $Ar_1$ may be selected from the group consisting of:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzoimidazole group, an iso-benzothiazole group, a benzoxazole group, an isobenzoxazole group, a triazole group, a tetrazole group, an oxadiazole group, a triazine group, a thiadiazole group, an imidazopyridine group, an imidazopyrimidine group, indenoquinoline group, a pyridoquinazoline group, and a benzoimidazoquinazoline group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzoimidazole group, an iso-benzothiazole group, a benzoxazole group, an isobenzoxazole group, a triazole group, a tetrazole group, an oxadiazole group, a triazine group, a thiadiazole group, an imidazopyridine group, an imidazopyrimidine group, indenoquinoline group, a pyridoquinazoline group, and a benzoimidazoquinazoline group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_3i$), and —P(=O)($Q_{31}$)($Q_{32}$), $L_1$ may be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, and $R_1$ may be selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, and a pyridonaphthyridinyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and $S(=O)_2(Q_1)$ and $—P(=O)(Q_1)(Q_2)$, wherein $Q_1$, $Q_2$, and $Q_{31}$ to $Q_{33}$ may be each independently a $C_1$-$C_{10}$ alkyl group, a $C_1$-$C_{10}$ alkoxy group, a phenyl group, a biphenyl group, a terphenyl group, or a naphthyl group.

According to an embodiment, the electron transporting metal-non-containing material may be selected from Compounds 1 to 21, but embodiments are not limited thereto:

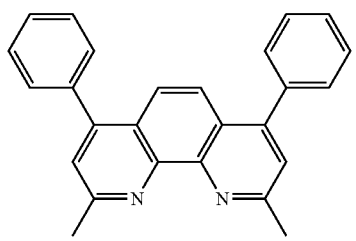

1

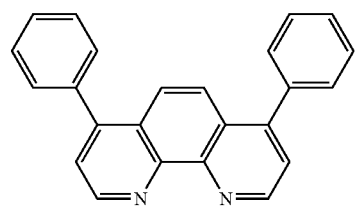

2

-continued
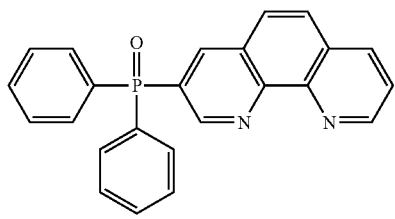
3
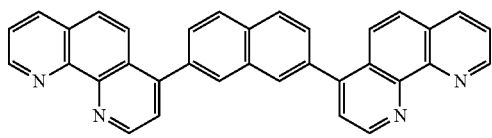
4
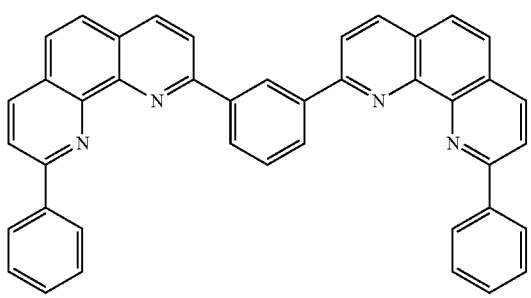
5
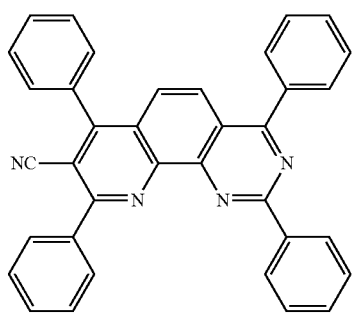
6
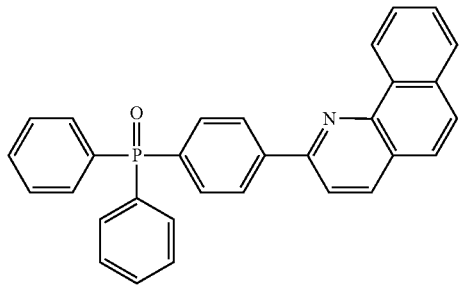
7
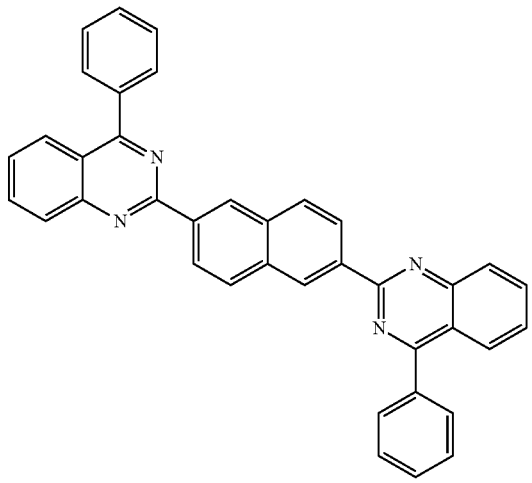
8
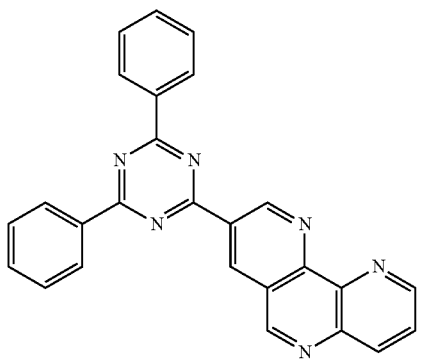
9
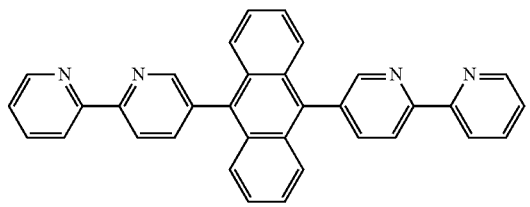
10

-continued
11
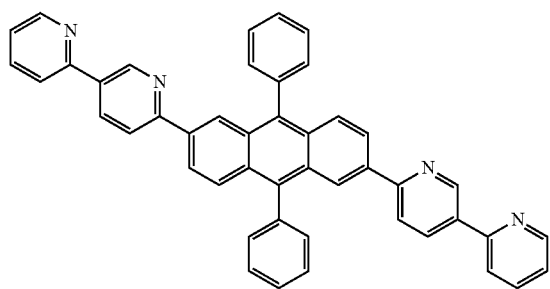
12
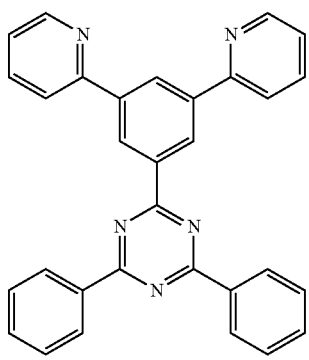
13
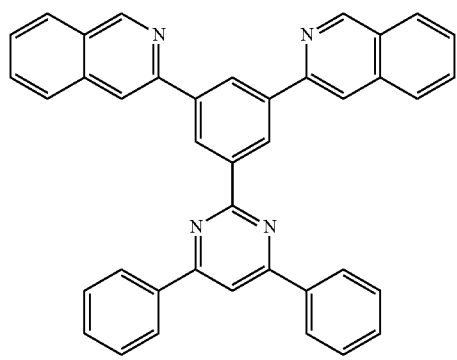
14
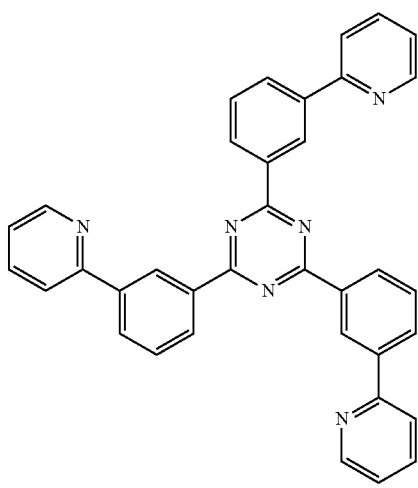
15
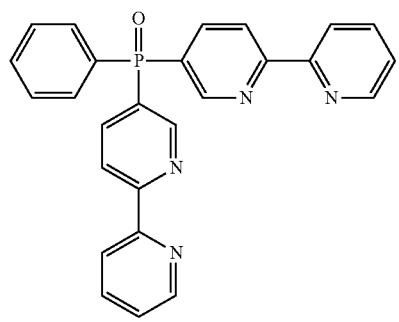
16
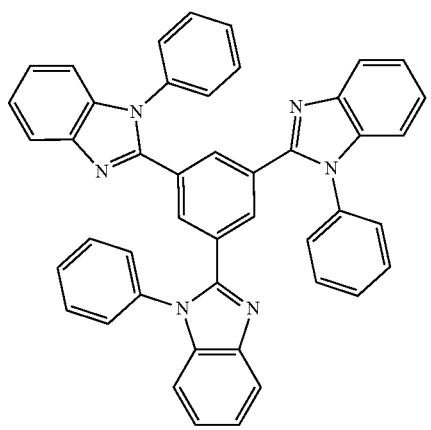
17
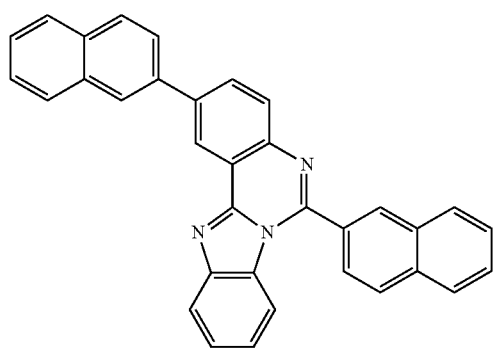

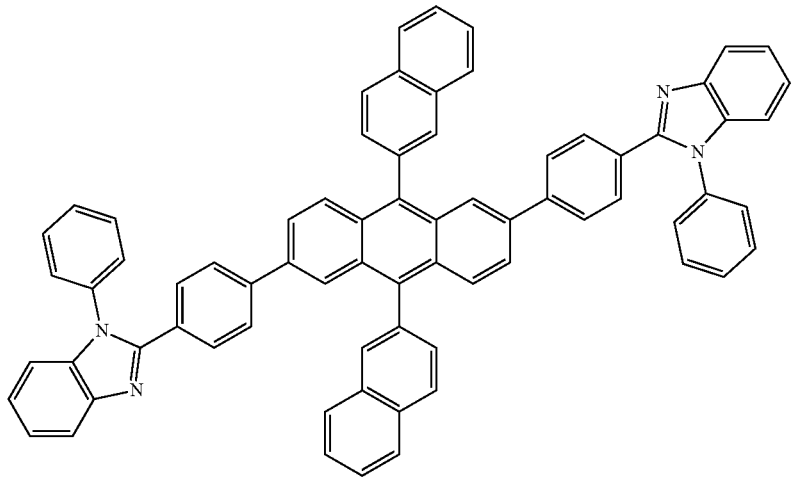
18
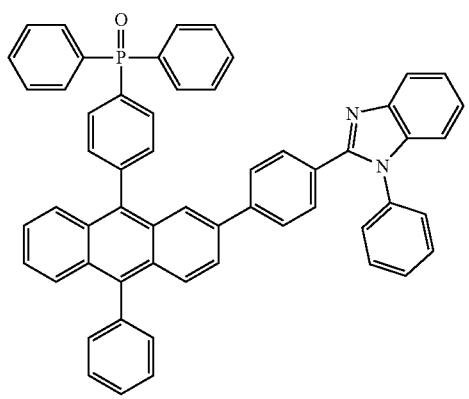
19
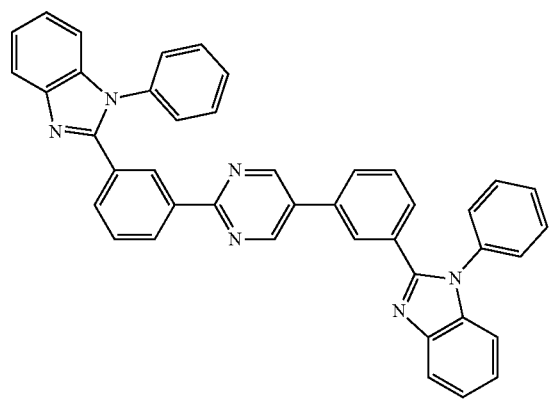
20
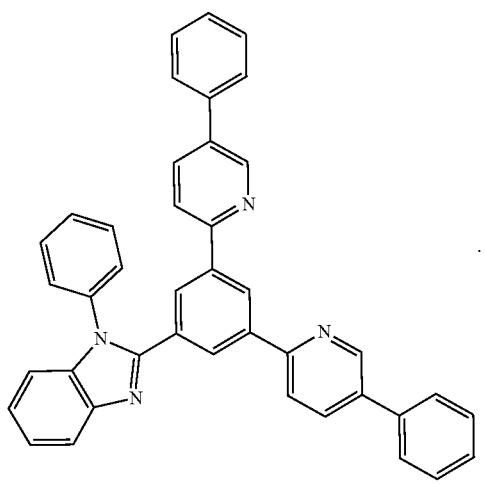
21

The electron transporting metal-non-containing material comprised in the electron transport layer may not include the following compounds:

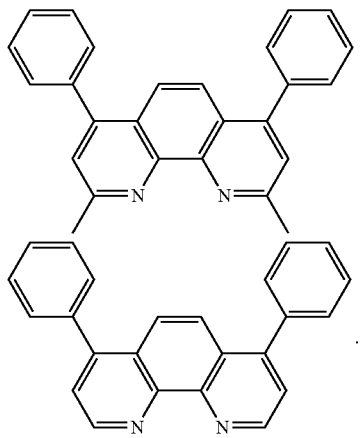

According to an embodiment, when an n-type charge generating layer, which includes the metal-containing material and the electron transporting metal-non-containing material, includes the metal as the metal-containing material, a weight ratio of the metal to the electron transporting metal-non-containing material may be in a range of about 0.01:100 to about 15:100. In some embodiments, a weight ratio of the metal to the electron transporting metal-non-containing material may be in a range of about 1:100 to about 5:100, but embodiments are not limited thereto.

According to an embodiment, when an n-type charge generating layer, which includes the metal-containing material and the electron transporting metal-non-containing material, includes the metal complex as the metal-containing material, a weight ratio of the metal complex to the electron transporting metal-non-containing material may be in a range of about 1:100 to about 100:1. In some embodiments, a weight ratio of the metal complex to the electron transporting metal-non-containing material may be in a range of about 1:50 to about 50:1. In some embodiments, a weight ratio of the metal complex to the electron transporting metal-non-containing material may be in a range of about 1:25 to about 25:1. In some embodiments, a weight ratio of the metal complex to the electron transporting metal-non-containing material may be in a range of about 3:7 to about 7:3, but embodiments are not limited thereto.

The p-type charge generating layer may substantially smoothly generate holes between the p-type charge generating layer and the n-type charge generating layer, and a material for the p-type charge generating layer is not particularly limited, and may be any suitable material capable of smoothly transferring generated holes to an adjacent emission unit. In some embodiments, the p-type charge generating layer may include only an organic compound. In some embodiments, the p-type charge generating layer may further include a metal oxide. In some embodiments, the p-type charge generating layer may further include a p-type dopant.

According to an embodiment, the p-type charge generating layer may include at least one selected from a quinone derivative, a metal oxide, and a cyano group-containing compound, but embodiments are not limited thereto.

In some embodiments, a material for the p-type charge generating layer may include at least one selected from the group consisting of:

a quinone derivative, such as tetracyanoquinodimethane (TCNQ) and/or 2,3,5,6-tetrafluoro-7,7,8,8-tetracyano-quinodimethane (F4-TCNQ);

a metal oxide, such as tungsten oxide and/or molybdenum oxide;

1,4,5,8,9,11-hexaazatriphenylene-hexacarbonitrile (HAT-CN); and compounds represented by Formula 221, but embodiments are not limited thereto:

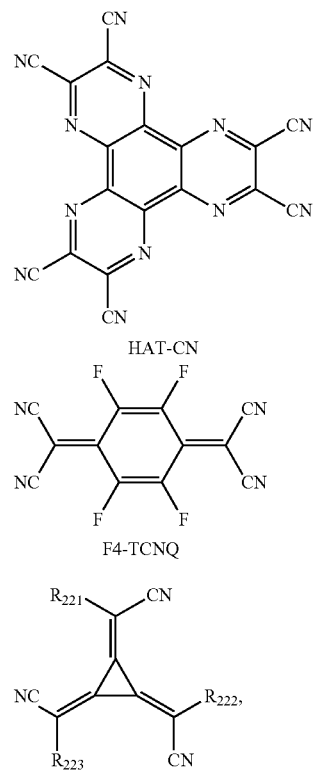

Formula 221 wherein, in Formula 221, $R_{221}$ to $R_{223}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, provided that at least one selected from $R_{221}$ to $R_{223}$ may include at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

According to an embodiment, the thickness of the n-type charge generating layer and that of the p-type charge generating layer may be each independently in a range of about 20 Å to about 1,000 Å. According to an embodiment, the thickness of the n-type charge generating layer and that of the p-type charge generating layer may be each independently in a range of about 50 Å to about 500 Å. According to an embodiment, the thickness of the n-type charge generating layer may be in a range of about 100 Å to about 300 Å, and the thickness of the p-type charge generating layer may be in a range of about 50 Å to about 200 Å, but embodiments are not limited thereto.

According to an embodiment, the light-emitting device 10 may further include a hole transport region between the first electrode and an emission unit adjacent to the first electrode from among the m emission units, wherein the hole transport region may include a p-dopant having a LUMO energy level of about −3.5 eV or less. The p-dopant may include at least one selected from a quinone derivative, a metal oxide, and a cyano group-containing compound, but embodiments are not limited thereto. In some embodiments, the p-dopant may include at least one selected from the group consisting of:

a quinone derivative, such as tetracyanoquinodimethane (TCNQ) and/or 2,3,5,6-tetrafluoro-7,7,8,8-tetracyanoquinodimethane (F4-TCNQ);

a metal oxide, such as tungsten oxide and/or molybdenum oxide;

1,4,5,8,9,11-hexaazatriphenylene-hexacarbonitrile (HAT-CN); and compounds represented by Formula 221, but is not limited thereto.

Figure 6:
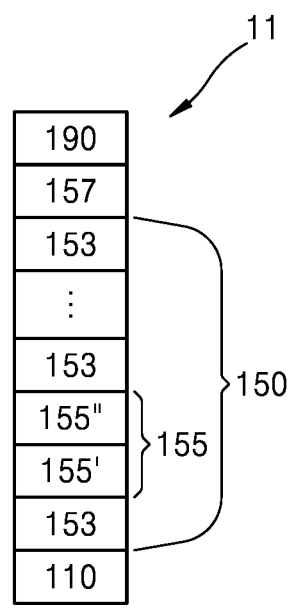
FIG. 6 is a schematic cross-sectional view illustrating a light-emitting device according to an embodiment.

FIG. 6 illustrates a schematic view of a light-emitting device 11 according to an embodiment. According to an embodiment, as shown in FIG. 6, the light-emitting device 11 may further include an electron transport layer 157 between the emission unit 153 adjacent to the second electrode 190 from among the m emission units 153 and the second electrode 190.

The electron transport layer 157 may include a metal-containing material and an electron transporting metal-non-containing material (e.g., an electron transporting material that does not include metal).

The metal-containing material may include a metal, a metal complex, or a combination thereof.

In some embodiments, when the electron transport layer includes a metal as the metal-containing material, the metal may include an alkali metal, an alkaline earth metal, a rare-earth metal, a transition metal, a late transition metal, or a combination thereof. In some embodiments, when the electron transport layer includes a metal as the metal-containing material, the metal may be selected from lithium (Li), sodium (Na), potassium (K), rubidium (Rb), cesium (Cs), francium (Fr), beryllium (Be), magnesium (Mg), calcium (Ca), strontium (Sr), barium (Ba), radium (Ra), La, Ce, Pr, Nd, Pm, Sm, Eu, Gd, Tb, Dy, Ho, Er, Tm, Yb and Lu. According to an embodiment, when the electron transport layer includes a metal as the metal-containing material, the metal may be selected from Li, Mg, and Yb, but embodiments are not limited thereto.

In some embodiments, when the electron transport layer includes a metal complex as the metal-containing material, the metal complex may include an alkali metal, an alkaline earth metal, a rare-earth metal, a transition metal, a late transition metal, or a combination thereof. In some embodiments, when the electron transport layer includes a metal complex as the metal-containing material, the metal complex may include Li, Al, Ti, Zr, Hf, Zn, and/or Cu. According to an embodiment, when the electron transport layer includes a metal complex as the metal-containing material, the metal complex may be a Li complex or an Al complex, but embodiments are not limited thereto.

When the electron transport layer includes a metal complex as the metal-containing material, the metal complex may further include at least one organic ligand selected from a hydroxyquinoline, a hydroxyisoquinoline, a hydroxybenzoquinoline, a hydroxyacridine, a hydroxyphenanthridine, a hydroxyphenyl oxazole, a hydroxyphenyl thiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene. In some embodiments, when the electron transport layer includes a metal complex as the metal-containing material, the metal complex may include at least one selected from a substituted or unsubstituted hydroxyquinoline and a substituted or unsubstituted hydroxyphenylbenzothiazole.

In some embodiments, when the electron transport layer includes a metal complex as the metal-containing material, the metal complex may be a lithium quinolate (Liq) and/or an aluminum quinolate ($Alq_3$).

The electron transporting metal-non-containing material included in the electron transport layer may be an organic compound including at least one π electron-depleted nitrogen-containing ring. In some embodiments, the electron transporting metal-non-containing material may be an organic compound including at least one selected from an imidazole ring, a pyrazole ring, a thiazole ring, an isothiazole ring, an oxazole ring, an isoxazole ring, a pyridine ring, a pyrazine ring, a pyrimidine ring, a pyridazine ring, an indazole ring, a purine ring, a quinoline ring, an isoquinoline ring, a benzoquinoline ring, a phthalazine ring, a naphthyridine ring, a quinoxaline ring, a quinazoline ring, a cinnoline ring, a phenanthridine ring, an acridine ring, a phenanthroline ring, a phenazine ring, a benzoimidazole ring, an iso-benzothiazole ring, a benzoxazole ring, an isobenzoxazole ring, a triazole ring, a tetrazole ring, an oxadiazole ring, a triazine ring, a thiadiazole ring, an imidazopyridine ring, an imidazopyrimidine ring, and indenoquinoline ring. In some embodiments, the electron transporting metal-non-containing material may be an organic compound including at least one selected from a phenanthroline ring, an imidazole ring, a pyridine ring, a pyrazine ring, a pyrimidine ring, a pyridazine ring, and a triazine ring. In some embodiments, the electron transporting metal-non-containing material may be selected from Compounds 1 to 6 (as illustrated above).

In some embodiments, the metal-containing material and the electron transporting metal-non-containing material included in at least one of the m−1 n-type charge generating layer(s) may be the same as the metal-containing material and the electron transporting metal-non-containing material included in the electron transport layer, respectively. In some embodiments, at least one of the m−1 n-type charge generating layer(s) may include Yb as the metal-containing material and Compound 1 as the electron transporting metal-non-containing material. The electron transport layer may include Yb as the metal-containing material and Compound 1 as the electron transporting metal-non-containing material.

According to some embodiments, the metal-containing material included in at least one of the m−1 n-type charge generating layer(s) may differ from the metal-containing material included in the electron transport layer; the electron transporting metal-non-containing material included in at least one of the m−1 n-type charge generating layer(s) may differ from the electron transporting metal-non-containing material included in the electron transport layer; or the metal-containing material included in at least one of the m−1 n-type charge generating layer(s) may differ from the metal-containing material included in the electron transport layer, and the electron transporting metal-non-containing material included in at least one of the m−1 n-type charge generating layer(s) may differ from the electron transporting metal-non-containing material included in the electron transport layer.

In some embodiments, at least one of the m−1 n-type charge generating layer(s) may include Yb as the metal-containing material and Compound 1 as the electron transporting metal-non-containing material. The electron transport layer may include Li as the metal-containing material and Compound 1 as the electron transporting metal-non-containing material. In some embodiments, at least one of the m−1 n-type charge generating layer(s) may include Yb as the metal-containing material and Compound 1 as the electron transporting metal-non-containing material. The electron transport layer may include Liq as the metal-containing material and Compound 5 as the electron transporting metal-non-containing material.

According to some embodiments, m may be 3 or greater, and the m−1 n-type charge generating layers may all include the same metal-containing material and the same electron transporting metal-non-containing material, and the metal-containing material included in the m−1 n-type charge generating layers may differ from the metal-containing material included in the electron transport layer; the electron transporting metal-non-containing material included in the m−1 n-type charge generating layers may differ from the electron transporting metal-non-containing material included in the electron transport layer; or the metal-containing material included in the m−1 n-type charge generating layers may differ from the metal-containing material included in the electron transport layer, and the electron transporting metal-non-containing material included in the m−1 n-type charge generating layers may differ from the electron transporting metal-non-containing material included in the electron transport layer.

According to an embodiment, the light-emitting device 11 may further include, in addition to an electron transport layer between the second electrode and an emission unit adjacent to the second electrode from among the m emission units, a hole transport region between the first electrode and an emission unit adjacent to the first electrode from among the m emission units, wherein the hole transport region may include a p-dopant having a LUMO energy level of about −3.5 eV or less. The p-dopant may be the same as described herein.

In a light-emitting device according to an embodiment, m may be 2. That is, in some embodiments, the light-emitting device may include only two emission units. In some embodiments, a light-emitting device may include a first electrode, a first emission unit, a first charge generating layer, a second emission unit, and a second electrode, which are stacked in this stated order. The light-emitting device may further include an electron transport layer between the second emission unit and the second electrode.

In a light-emitting device according to another embodiment, m may be 3. That is, in some embodiments, the light-emitting device may include only three emission units. In some embodiments, a light-emitting device may include a first electrode, a first emission unit, a first charge generating layer, a second emission unit, a second charge generating layer, a third emission unit, and a second electrode, which are stacked in this stated order. The light-emitting device may further include an electron transport layer between the third emission unit and the second electrode.

According to another embodiment, a light-emitting device may include a first electrode;
a second electrode facing the first electrode;
m emission units stacked between the first electrode and the second electrode; and
m−1 charge generating layer(s) between the two adjacent emission units from among the m emission units, m−1 charge generating layer(s) including m−1 n-type charge generating layer(s) and m−1 p-type charge generating layer(s),
wherein m may be an integer of 2 or greater,
a maximum emission wavelength of light emitted from at least one of the m emission units may differ from that of light emitted from at least one of the other emission units,
at least one of the m−1 n-type charge generating layer(s) may include a metal-containing material and an electron transporting metal-non-containing material,
the metal-containing material may include a metal, a metal complex, or a combination thereof,
the metal may include a rare-earth metal, a transition metal, a late transition metal, or a combination thereof, and
the metal complex may include an alkali metal, an alkaline earth metal, a rare-earth metal, a transition metal, a late transition metal, or a combination thereof.

The light-emitting device may further include an electron transport layer between the second electrode and an emission unit adjacent to the second electrode from among the m emission units,
wherein the electron transport layer may include a metal-containing material and an electron transporting metal-non-containing material,
the metal-containing material may include a metal, a metal complex, or a combination thereof,
the metal may include an alkali metal, an alkaline earth metal, a rare-earth metal, a transition metal, a late transition metal, or a combination thereof, and
the metal complex may include an alkali metal, an alkaline earth metal, a rare-earth metal, a transition metal, a late transition metal, or a combination thereof.

According to another embodiment, a light-emitting device may include a first electrode;
a second electrode facing the first electrode;
m emission units stacked between the first electrode and the second electrode; and
m−1 charge generating layer(s) between two adjacent emission units from among the m emission units and including m−1 n-type charge generating layer(s) and m−1 p-type charge generating layer(s),
wherein m may be an integer of 2 or greater,
a maximum emission wavelength of light emitted from at least one of the m emission units may differ from that of light emitted from at least one of the other emission units,
at least one of the m−1 n-type charge generating layer(s) may include a metal-containing material and an electron transporting metal-non-containing material,
the metal-containing material may include a metal, a metal complex, or a combination thereof,
the metal may include a rare-earth metal, a transition metal, a late transition metal, or a combination thereof, and
the metal complex may include an alkali metal, an alkaline earth metal, a rare-earth metal, a transition metal, a late transition metal, or a combination thereof.

The light-emitting device may further include an electron transport layer between the second electrode and an emission unit adjacent to the second electrode from among the m emission units, wherein the electron transport layer may include a metal-containing material and an electron transporting metal-non-containing material, the metal-containing material may include a metal, a metal complex, or a combination thereof, the metal may include an alkali metal, an alkaline earth metal, a rare-earth metal, a transition metal, a late transition metal, or a combination thereof, and the metal complex may include an alkali metal, an alkaline earth metal, a rare-earth metal, a transition metal, a late transition metal, or a combination thereof.

When the n-type charge generating layer includes a metal-containing material and an electron transporting metal-non-containing material, wherein the metal-containing material is a metal including a rare-earth metal, a transition metal, a late transition metal, or a combination thereof, the metal may have relatively great atomic weight or size compared to an alkali metal, and thus may exhibit no or reduced intermixing with peripheral layers. Accordingly, a light-emitting device including the n-type charge generating layer according to embodiments of the present disclosure may have long lifespan and/or improved stability.

In addition, when the n-type charge generating layer includes a metal-containing material and an electron transporting metal-non-containing material, wherein the metal-containing material is a metal complex, the metal in the metal complex may be stabilized by a ligand (e.g., an organic ligand included in the metal complex). Accordingly, a light-emitting device including the n-type charge generating layer according to embodiments of the present disclosure may have improved stability due to interaction between the metal complex and the electron transporting metal-non-containing material.

In addition, when the n-type charge generating layer includes a metal-containing material and an electron transporting metal-non-containing material, wherein the metal-containing material includes both a metal of a rare-earth metal, a transition metal, a late transition metal, or a combination thereof and a metal complex, a light-emitting device including the n-type charge generating layer may have both of the foregoing advantages.

Figure 7:
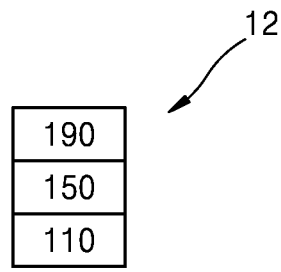
FIG. 7 is a schematic cross-sectional view illustrating a light-emitting device according to an embodiment.

Description of FIG. 7

FIG. 7 is a schematic cross-sectional view illustrating a light-emitting device 12 according to an embodiment. The light-emitting device 12 may include the first electrode 110, the organic layer 150, and the second electrode 190.

Hereinafter, the structure of the light-emitting device 12 according to an embodiment and a method of manufacturing a light-emitting device according to an embodiment will be described in connection with FIG. 7.

First Electrode 110

In FIG. 7, a substrate may be additionally disposed under the first electrode 110 or above the second electrode 190. The substrate may be a glass substrate or a plastic substrate, each having excellent mechanical strength, thermal stability, transparency, surface smoothness, ease of handling, and/or water-resistance.

The first electrode 110 may be formed by depositing or sputtering a material for the first electrode 110 on the substrate. When the first electrode 110 is an anode, a material for the first electrode 110 may be selected from materials with a high work function to facilitate hole injection.

The first electrode 110 may be a reflective electrode, a semi-transmissive electrode, or a transmissive electrode. When the first electrode 110 is a transmissive electrode, a material for the first electrode 110 may be selected from indium tin oxide (ITO), indium zinc oxide (IZO), tin oxide ($SnO_2$), zinc oxide (ZnO), and any combinations thereof, but is not limited thereto. In one or more embodiments, when the first electrode 110 is a semi-transmissive electrode or a reflective electrode, a material for the first electrode 110 may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof, but is not limited thereto.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

Organic Layer 150

The organic layer 150 may be positioned on the first electrode 110. The organic layer 150 may include an emission unit.

The organic layer 150 may further include a hole transport region between the first electrode 110 and the emission unit and an electron transport region between the emission unit and the second electrode 190.

Hole Transport Region in Organic Layer 150

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including a plurality of different materials, or a multi-layered structure of hole injection layer/hole transport layer, hole injection layer/hole transport layer/emission auxiliary layer, hole injection layer/emission auxiliary layer, hole transport layer/emission auxiliary layer, or hole injection layer/hole transport layer/electron blocking layer, wherein for each structure, constituting layers are sequentially stacked from the first electrode 110 in this stated order, but the structure of the hole transport region is not limited thereto.

The hole transport region may include at least one selected from m-MTDATA, TDATA, 2-TNATA, NPB (NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), polyaniline/poly(4-styrenesulfonate) (Pani/PSS), a compound represented by Formula 201, and a compound represented by Formula 202:

-continued
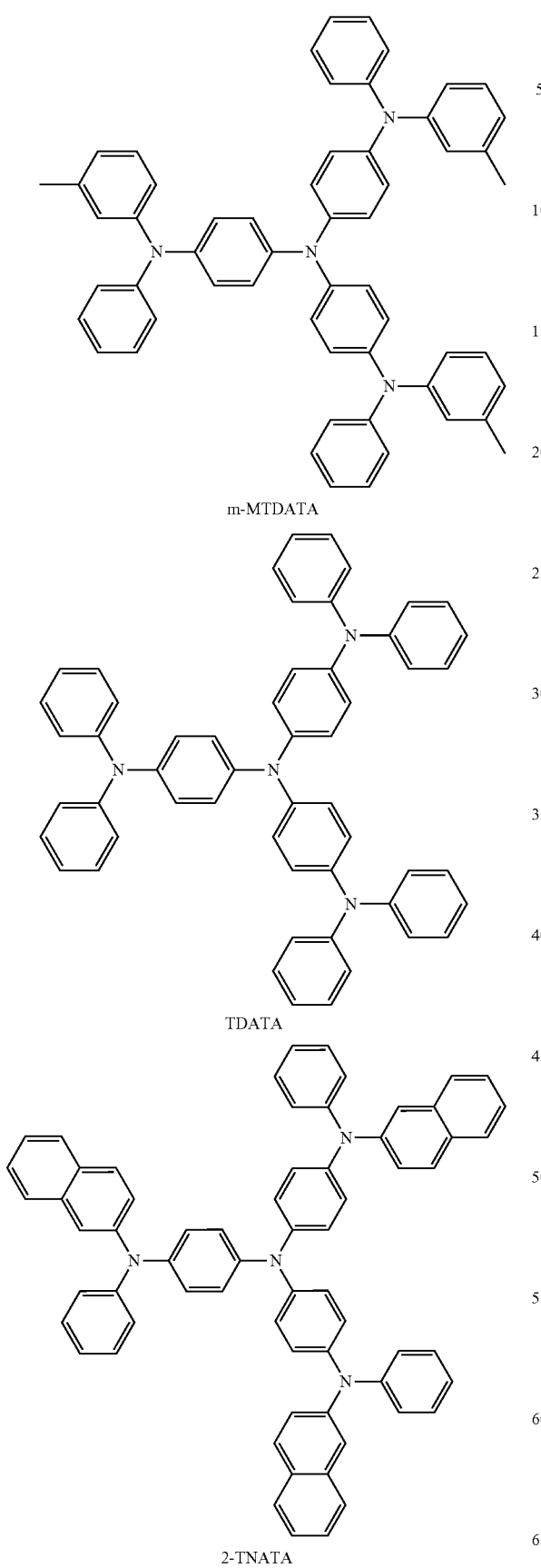
m-MTDATA
TDATA
2-TNATA
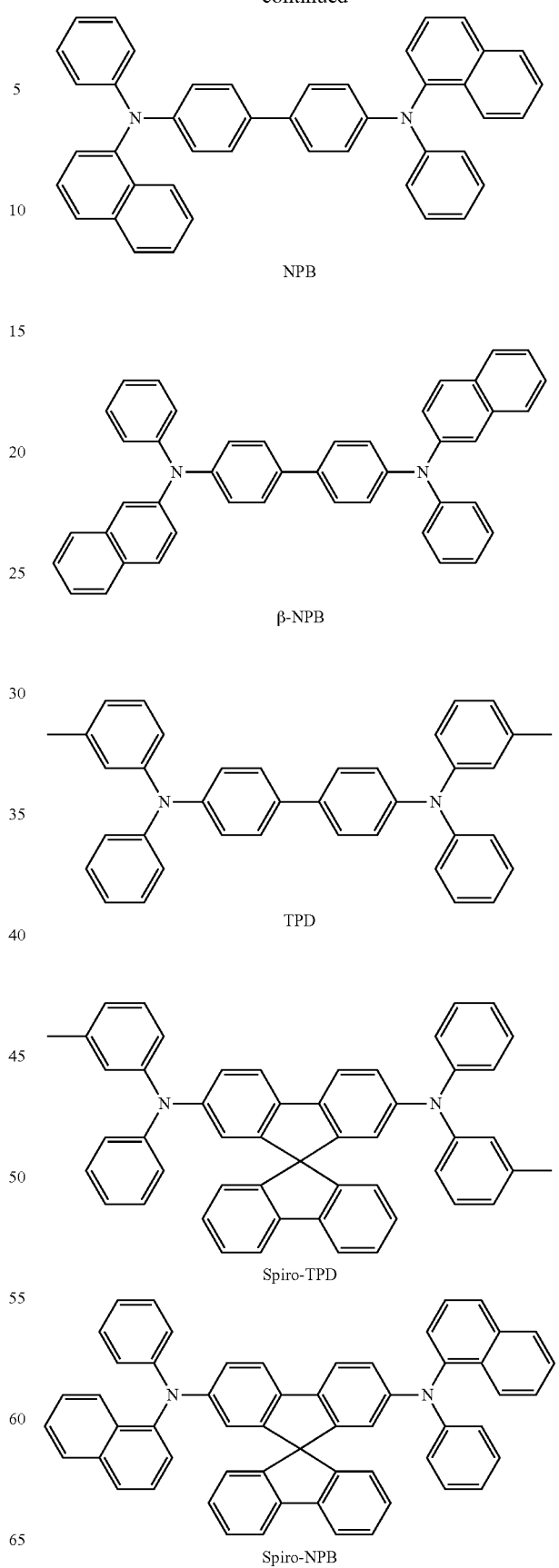
NPB
β-NPB
TPD
Spiro-TPD
Spiro-NPB

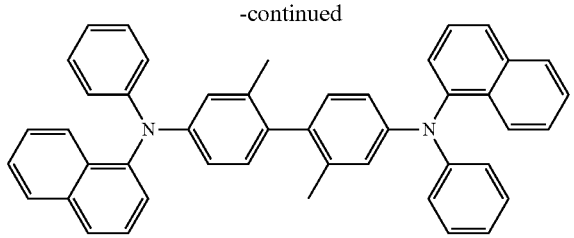

methylated NPB

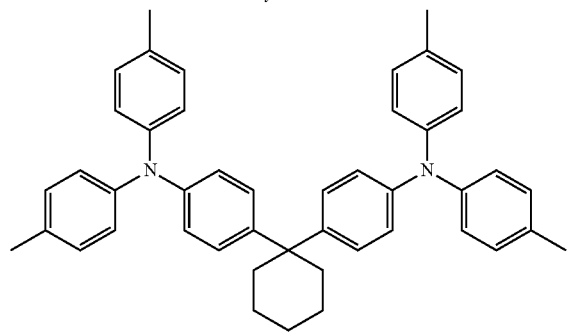

TAPC

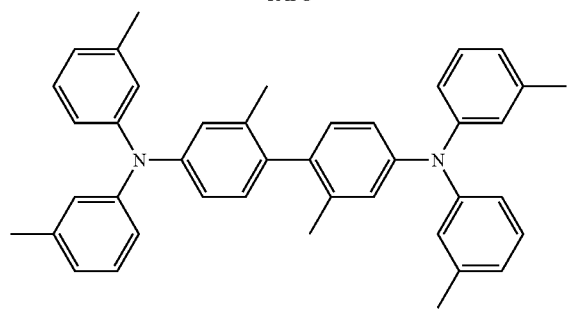

HMTPD

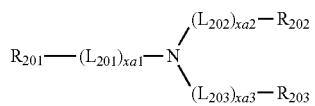

Formula 201

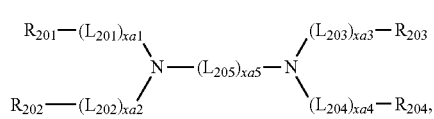

Formula 202 wherein, in Formulae 201 and 202, $L_{201}$ to $L_{204}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)—*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may be each independently an integer selected from 0 to 3, xa5 may be an integer selected from 1 to 10, and $R_{201}$ to $R_{204}$ and $Q_{201}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formula 202, $R_{201}$ and $R_{202}$ may optionally be bound to each other via a single bond, a dimethyl-methylene group, or a diphenyl-methylene group, and $R_{203}$ and $R_{204}$ may optionally be bound to each other via a single bond, a dimethyl-methylene group, or a diphenyl-methylene group.

In some embodiments, in Formulae 201 and 202, $L_{201}$ to $L_{205}$ may be each independently selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may each be independently selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may be each independently 0, 1, or 2.

According to an embodiment, xa5 may be 1, 2, 3, or 4.

According to some embodiments, $R_{201}$ to $R_{204}$ and $Q_{201}$ may be each independently selected from the group consisting of:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may be the same as described herein.

According to some embodiments, at least one selected from $R_{201}$ to $R_{203}$ in Formula 201 may be selected from the group consisting of:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

According to some embodiments, in Formula 202, i) $R_{201}$ and $R_{202}$ may be bound to each other via a single bond, and/or ii) $R_{203}$ and $R_{204}$ may be bound to each other via a single bond.

According to some embodiments, at least one selected from $R_{201}$ to $R_{204}$ in Formula 202 may be selected from the group consisting of:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

The compound represented by Formula 201 may be represented by Formula 201 A:

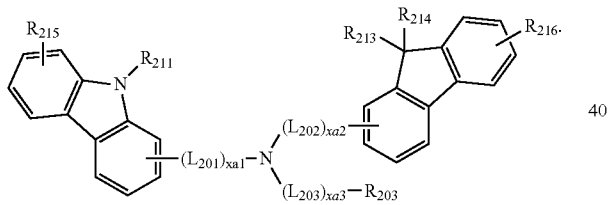

Formula 201A

In some embodiments, the compound represented by Formula 201 may be represented by Formula 201A, but embodiments are not limited thereto:

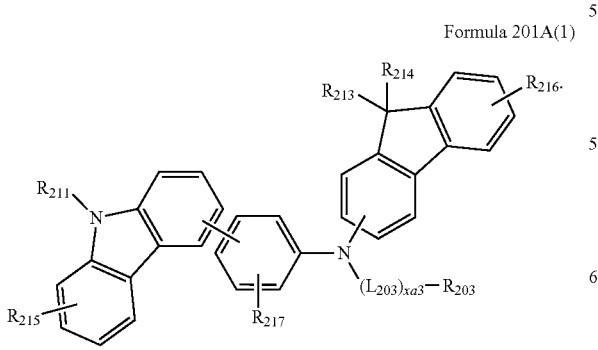

Formula 201A(1)

In some embodiments, the compound represented by Formula 201 may be represented by Formula 201A-1, but embodiments are not limited thereto:

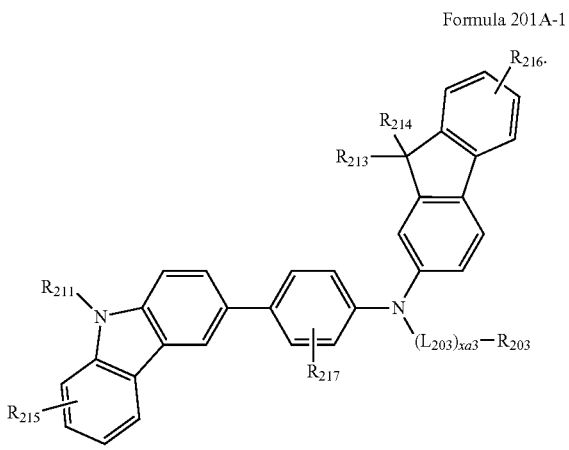

Formula 201A-1

In some embodiments, the compound represented by Formula 202 may be represented by Formula 202A, but embodiments are not limited thereto:

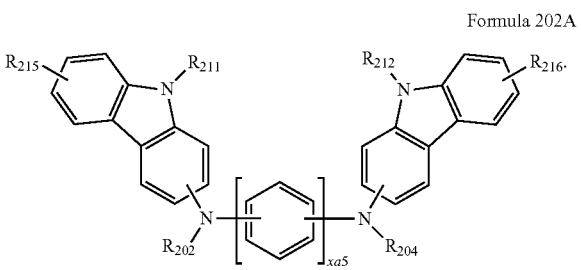

Formula 202A

In some embodiments, the compound represented by Formula 202 may be represented by Formula 202A-1:

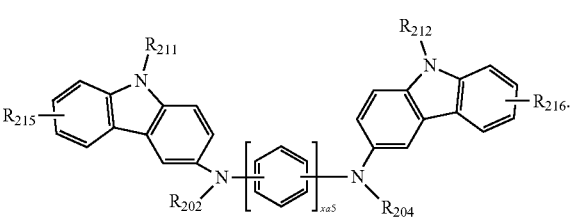

Formula 202A-1

In Formulae 201A, 201A(1), 201A-1, 202A, and 202A-1,
descriptions of $L_{201}$ to $L_{203}$, xa1 to xa3, xa5, and $R_{202}$ to $R_{204}$ may each independently be the same as descriptions thereof provided herein, descriptions of $R_{211}$ and $R_{212}$ may each independently be the same as the description provided herein in connection with $R_{203}$, and $R_{213}$ to $R_{217}$ may be each independently selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

For example, the hole transport region may include at least one compound selected from Compounds HT1 to HT39, but embodiments are not limited thereto:

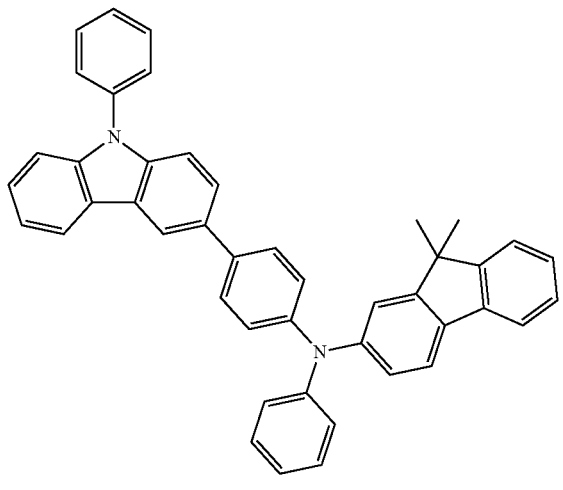

HT1

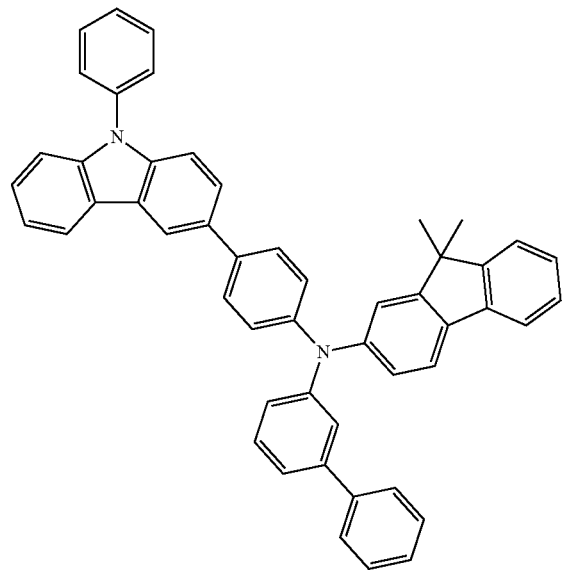

HT2

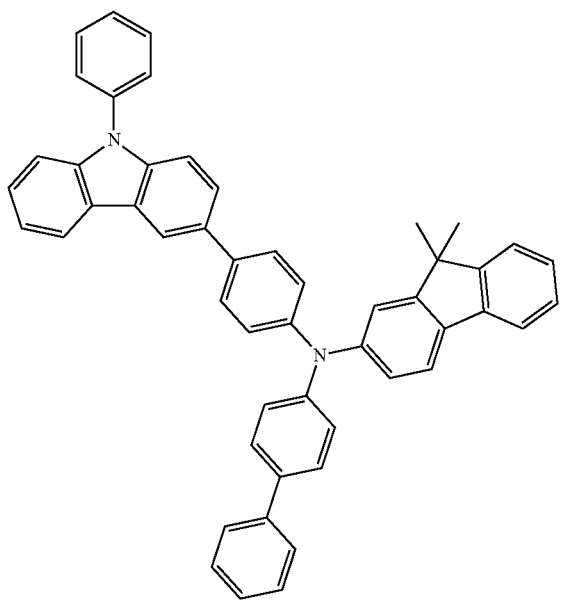

HT3

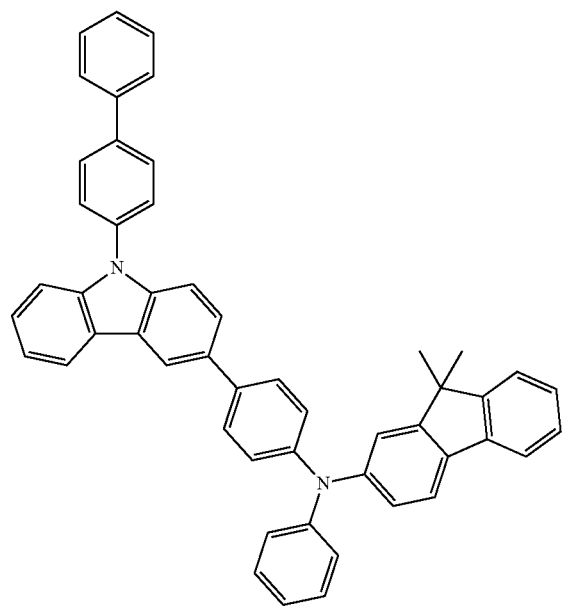

HT4

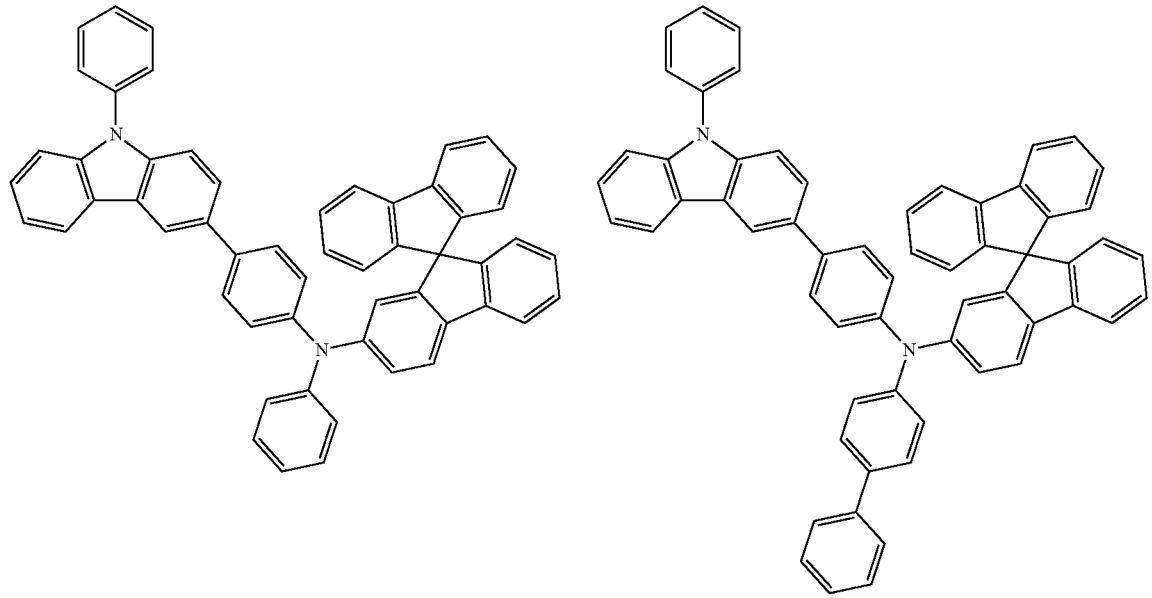
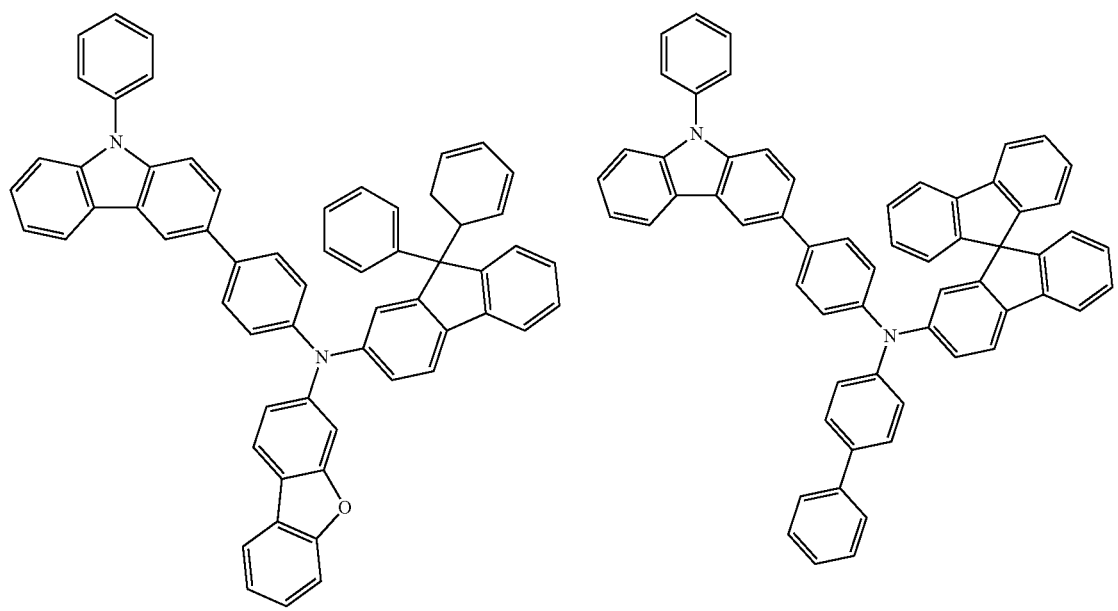

-continued
HT9
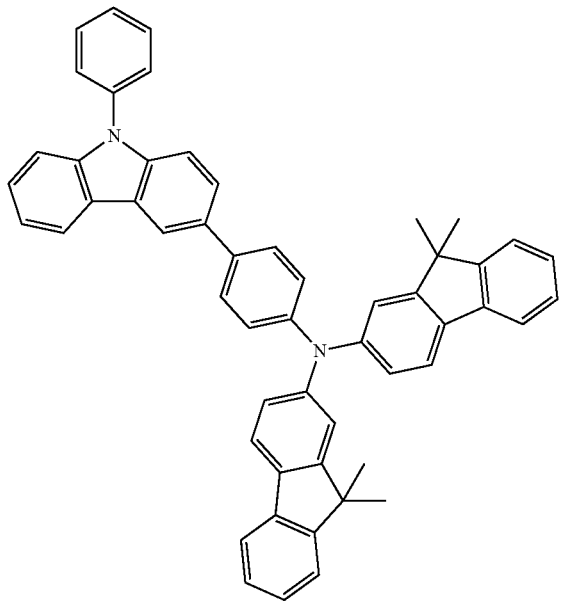
HT10
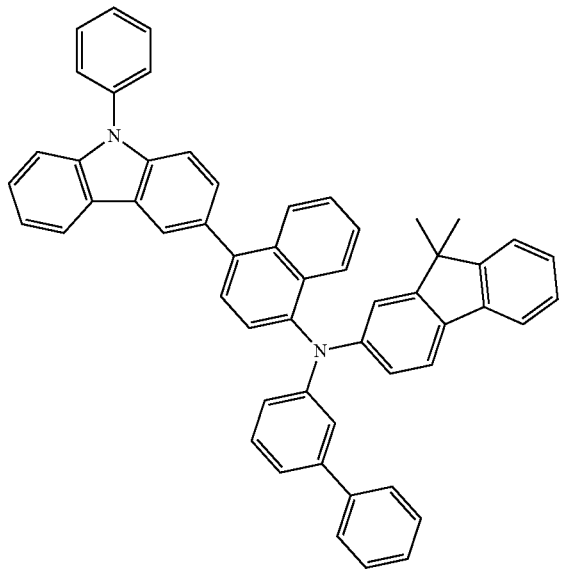
HT11
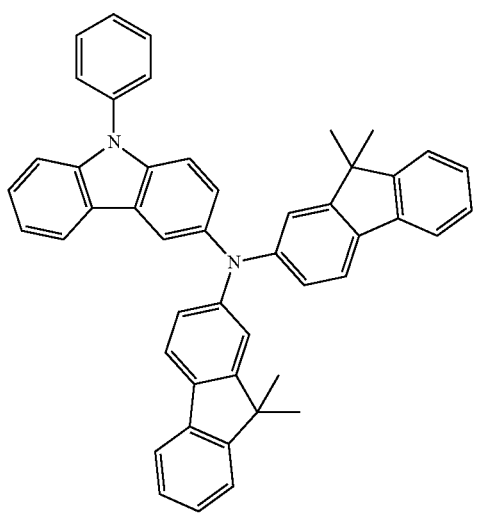
HT12
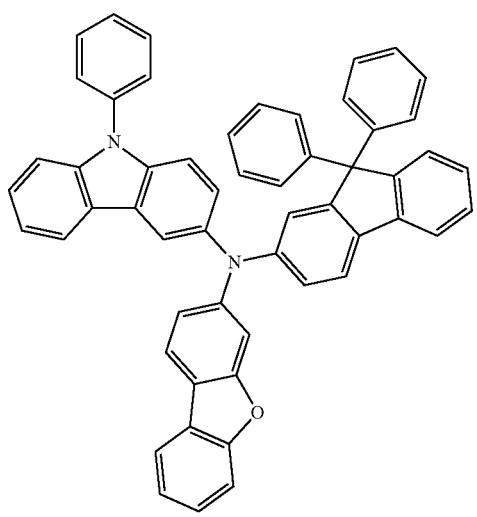
HT13
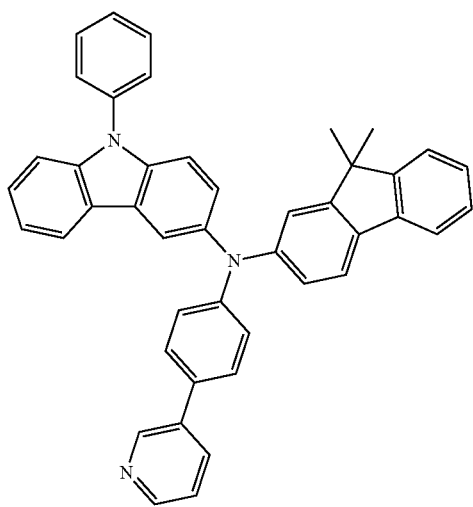
HT14
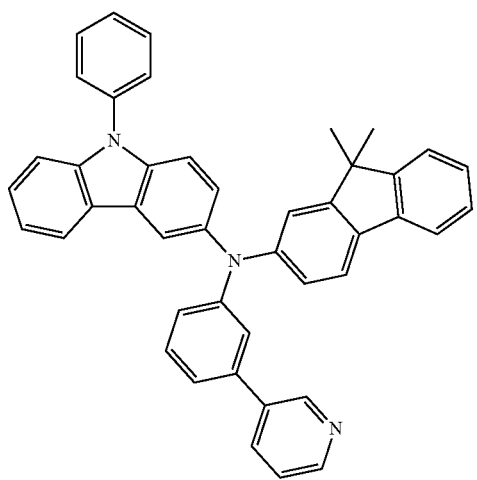

-continued
HT15
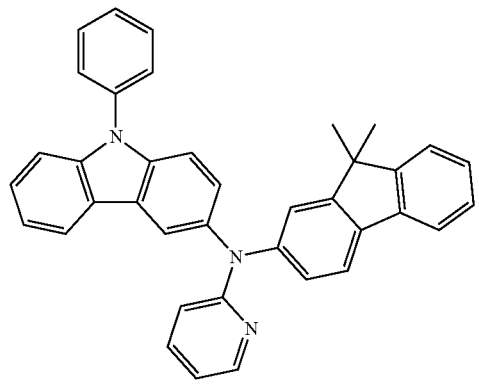
HT16
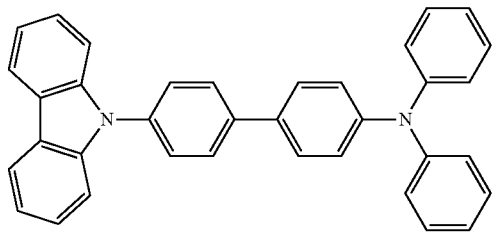
HT17
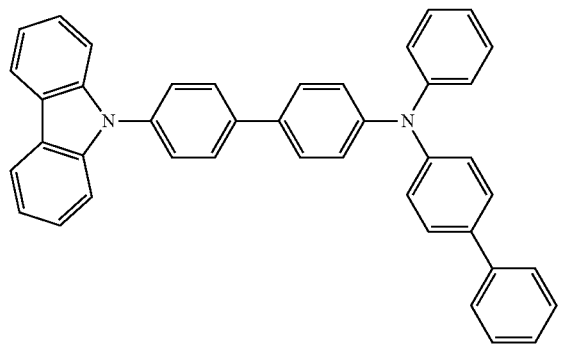
HT18
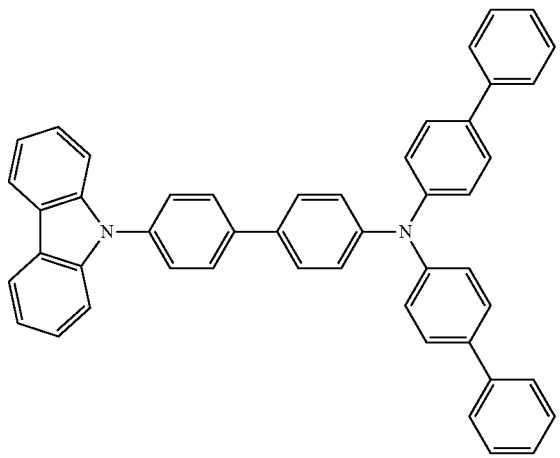
HT19
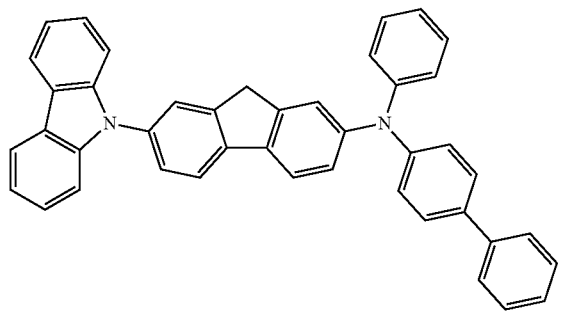
HT20
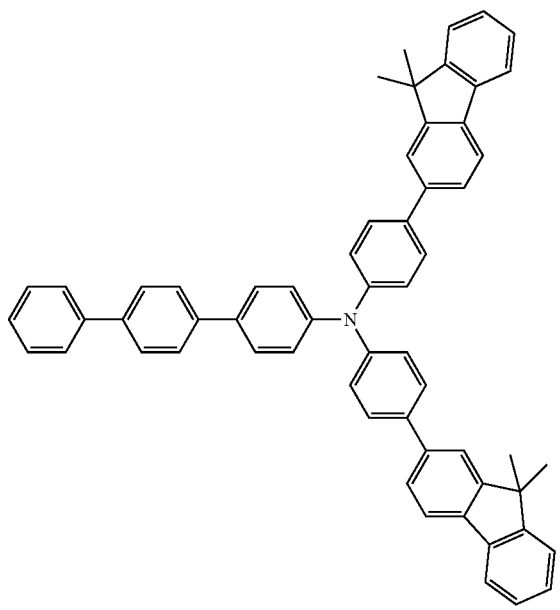

-continued
HT21
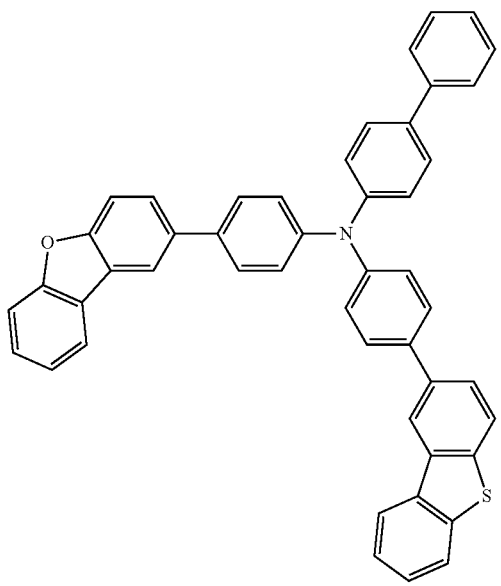
HT22
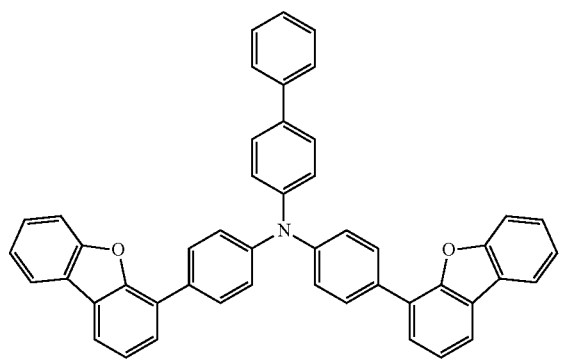
HT23
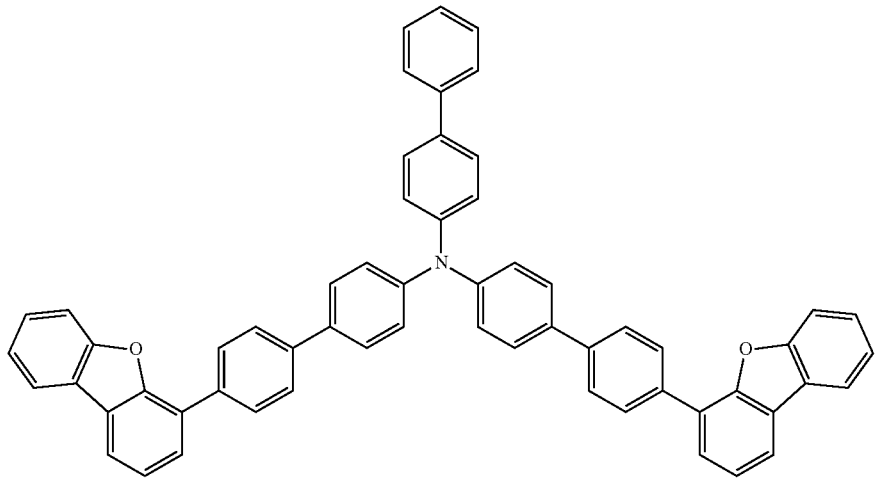
HT24 HT25
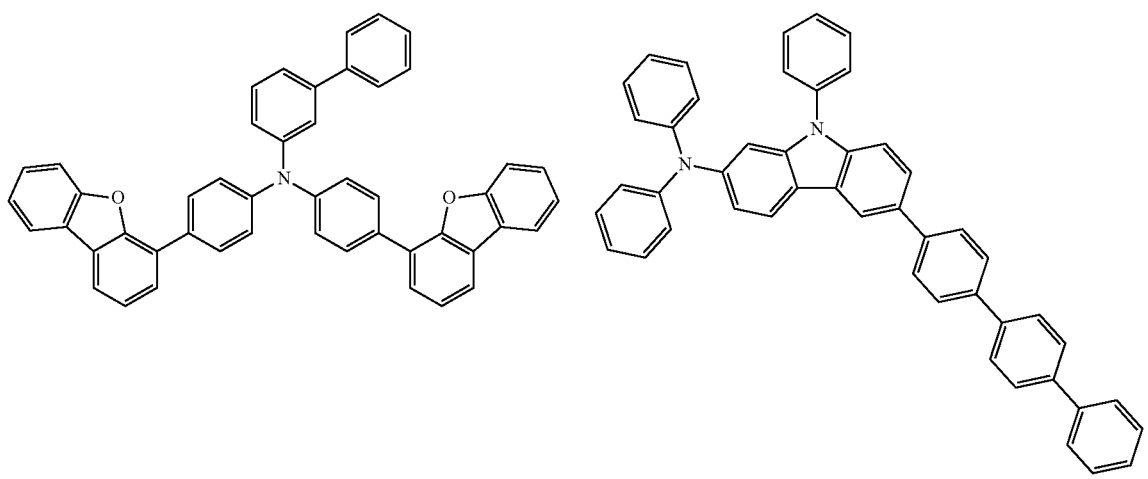

-continued
HT26
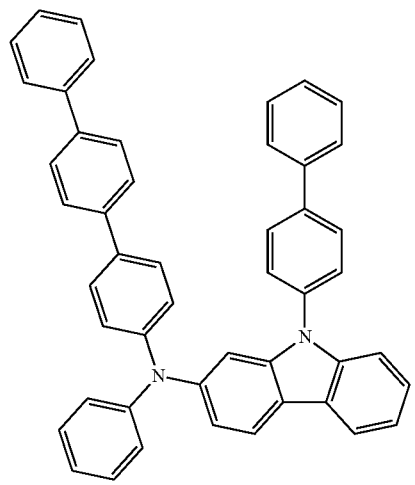
HT27
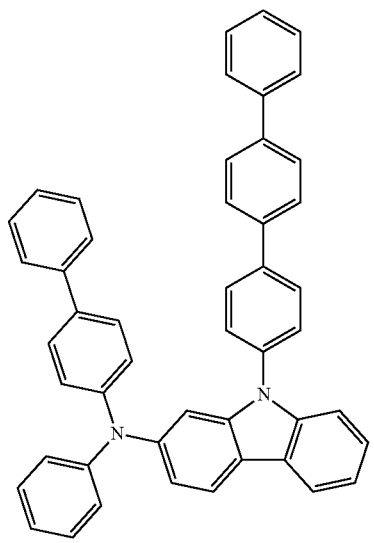
HT28
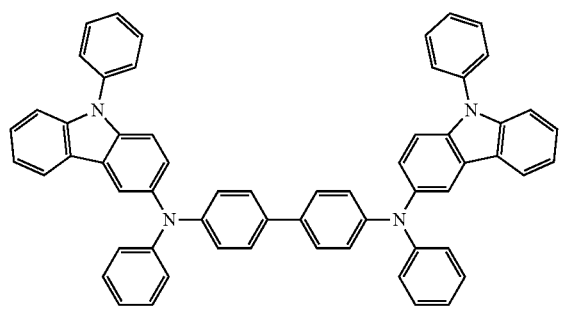
HT29
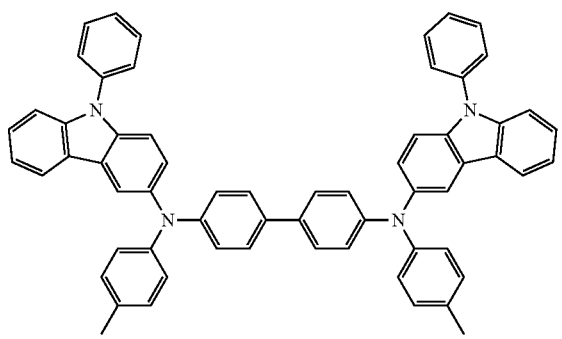
HT30
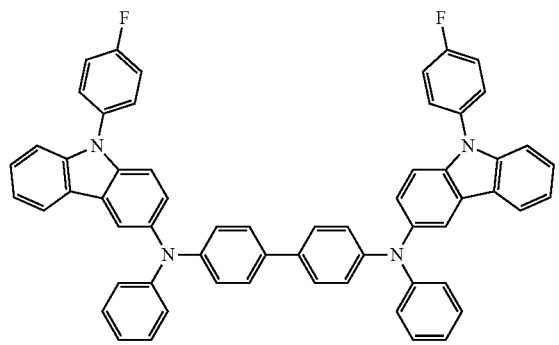
HT31
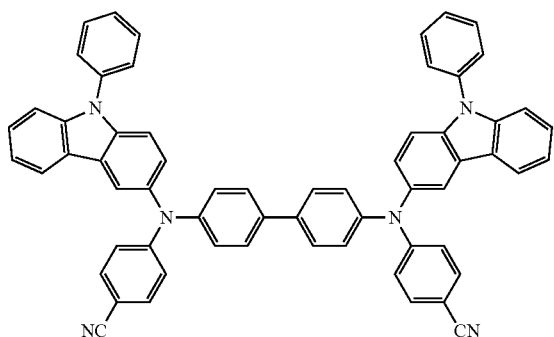

-continued
HT32
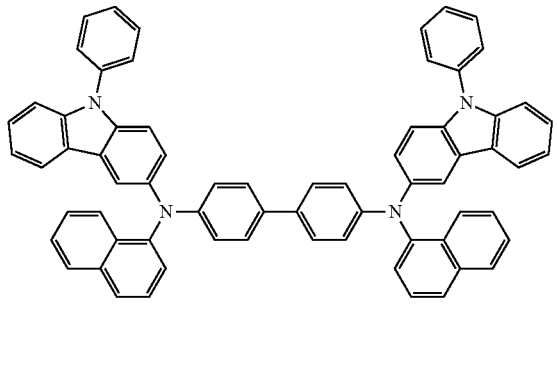
HT33
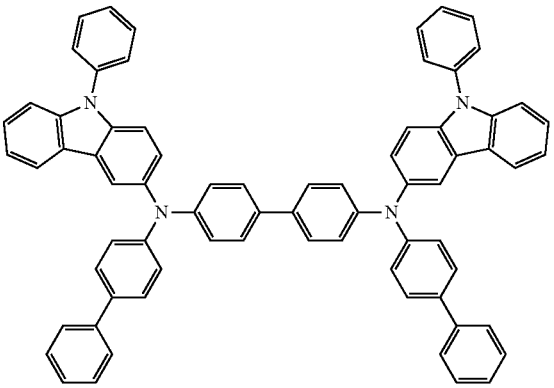
HT34
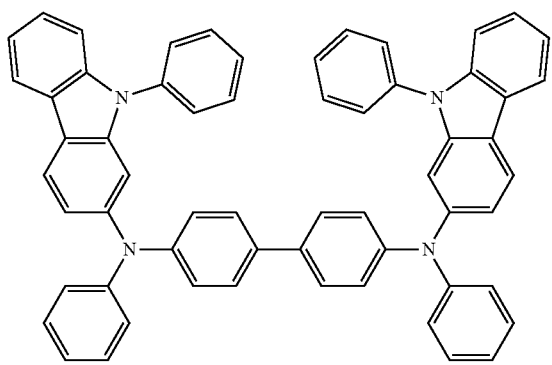
HT35
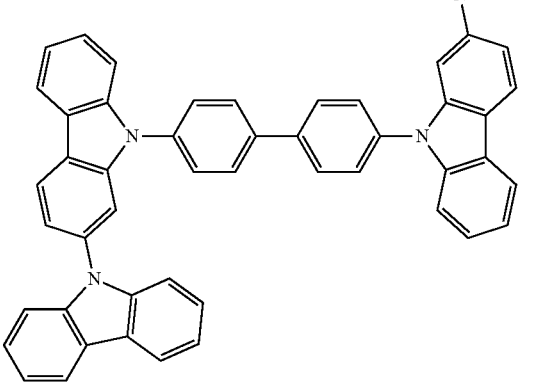
HT36
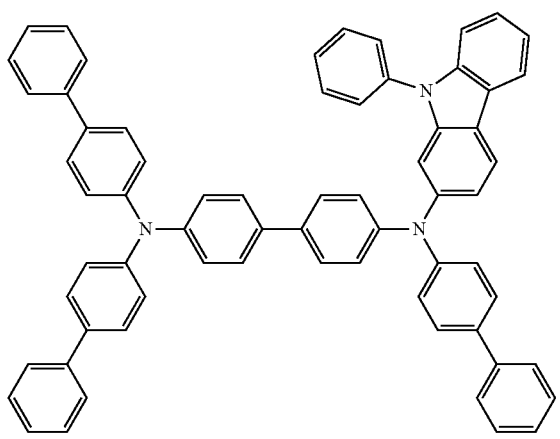
HT37
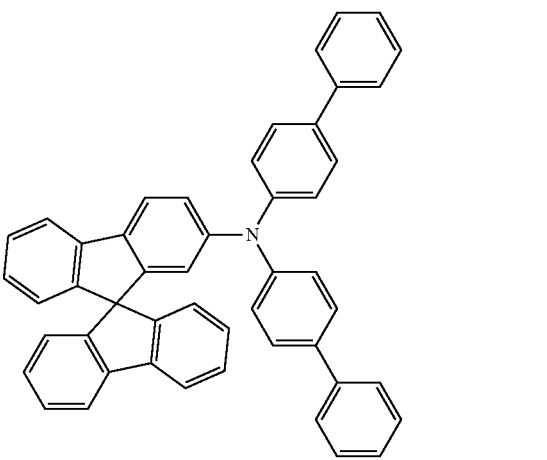

-continued

HT38
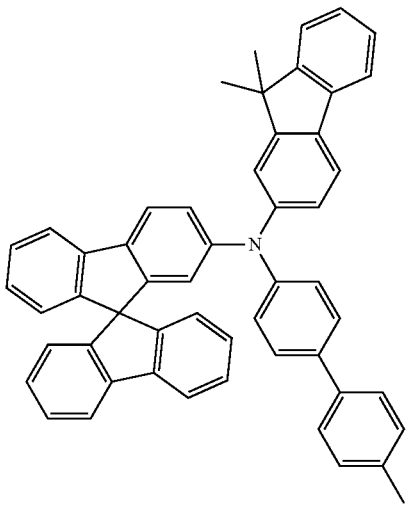

HT39
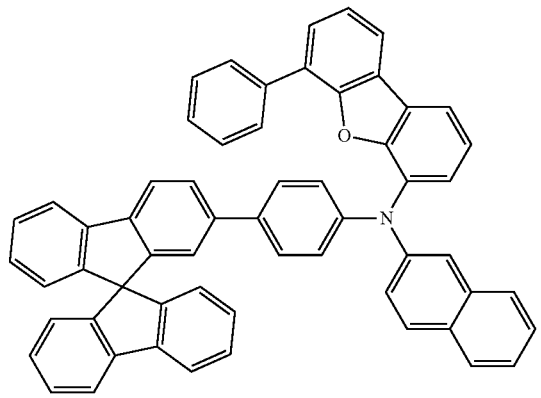

The thickness of the hole transport region may be in a range of about 100 Å to about 10,000 Å, for example, about 100 Å to about 1,000 Å. When the hole transport region includes at least one selected from a hole injection layer and a hole transport layer, the thickness of the hole injection layer may be in a range of about 100 Å to about 9,000 Å, and in some embodiments, about 100 Å to about 1,000 Å; the thickness of the hole transport layer may be in a range of about 50 Å to about 2,000 Å, and in some embodiments, about 100 Å to about 1,500 Å. When the thicknesses of the hole transport region, the hole injection layer and the hole transport layer are within any of these ranges, satisfactory (or suitable) hole transporting characteristics may be obtained without a substantial increase in driving voltage.

The emission auxiliary layer may increase the light-emission efficiency by compensating for an optical resonance distance according to the wavelength of light emitted by an emission layer, and the electron blocking layer may block or reduce the flow of electrons from an electron transport region. The emission auxiliary layer and the electron blocking layer may each independently include any of the materials as described above.

p-Dopant

The hole transport region may further include, in addition to the materials described above, a charge-generation material for the improvement of conductive properties. The charge-generation material may be homogeneously or non-homogeneously dispersed in the hole transport region.

The charge-generation material may be, for example, a p-dopant.

In one embodiment, the p-dopant may have a lowest unoccupied molecular orbital (LUMO) of −3.5 eV or less.

The p-dopant may include at least one selected from a quinone derivative, a metal oxide, and a cyano group-containing compound, but embodiments are not limited thereto.

In some embodiments, the p-dopant may include at least one selected from the group consisting of:

a quinone derivative, such as tetracyanoquinodimethane (TCNQ) and/or 2,3,5,6-tetrafluoro-7,7,8,8-tetracyano-quinodimethane (F4-TCNQ);

a metal oxide, such as tungsten oxide and/or molybdenum oxide;

1,4,5,8,9,11-hexaazatriphenylene-hexacarbonitrile (HAT-CN); and compounds represented by Formula 221, but embodiments are not limited thereto:

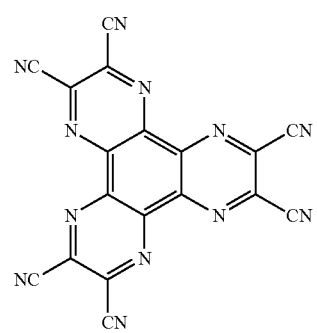

HAT-CN

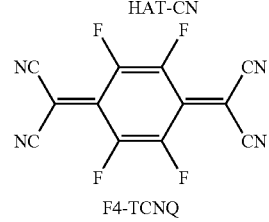

F4-TCNQ

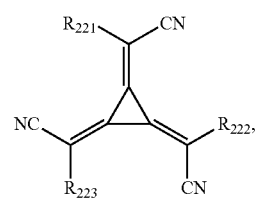

Formula 221 wherein, in Formula 221, $R_{221}$ to $R_{223}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, provided that at least one selected from $R_{221}$ to $R_{223}$ may include at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer in Organic Layer 150

In the light-emitting device 12, an emission unit may include an emission layer, wherein the emission layer may have a stacked structure of two or more layers selected from a red emission layer, a green emission layer, a yellow emission layer, and a blue emission layer, in which the two or more layers may contact each other or may be separated from each other. In one or more embodiments, the emission layer may include two or more materials selected from a red-light emission material, a green-light emission material, a yellow-light emission material, and a blue-light emission material, in which the two or more materials may be mixed together in a single layer.

The emission unit may further include an upper auxiliary layer formed on the emission layer and/or a lower auxiliary layer formed below (e.g., under) the emission layer. The lower auxiliary layer may perform substantially the same functions as the above-described hole transport layer, emission auxiliary layer, and electron blocking layer; and the upper auxiliary layer may perform substantially the same functions as the below-described buffer layer, hole blocking layer, electron control layer, and electron transport layer. The materials for the lower auxiliary layer and the upper auxiliary layer may be the same as those described herein in connection with the materials for the hole transport region and the electron transport region.

The emission layer may include a host and a dopant. The dopant may include at least one selected from a phosphorescent dopant and a fluorescent dopant.

The amount of the dopant in the emission layer may be in a range of about 0.01 to about 15 parts by weight based on 100 parts by weight of the host, but is not limited thereto.

The thickness of the emission layer may be in a range of about 100 Å to about 1,000 Å, in some embodiments, about 200 Å to about 600 Å. When the thickness of the emission layer is within any of these ranges, excellent (or suitable) light-emission characteristics may be obtained without a substantial increase in driving voltage.

Host in Emission Layer

The host may include a compound represented by Formula 301:

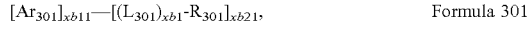

$[Ar_{301}]_{xb11}$—$[(L_{301})_{xb1}$-$R_{301}]_{xb21}$,  Formula 301 wherein, in Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer selected from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$), and xb21 may be an integer selected from 1 to 5, wherein $Q_{301}$ to $Q_{303}$ may be each independently selected from a $C_1$-$C_{10}$ alkyl group, a $C_1$-$C_{10}$ alkoxy group, a phenyl group, a biphenyl group, a terphenyl group, and a naphthyl group, but embodiments are not limited thereto.

In some embodiments, Ar301 in Formula 301 may be selected from the group consisting of:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may be each independently selected from a $C_1$-$C_{10}$ alkyl group, a $C_1$-$C_{10}$ alkoxy group, a phenyl group, a biphenyl group, a terphenyl group, and a naphthyl group, but embodiments are not limited thereto.

When xb11 in Formula 301 is 2 or greater, a plurality of $Ar_{301}$(s) may be bound to a respective one another via a single bond.

In one or more embodiments, the compound represented by Formula 301 may be represented by Formula 301-1 or 301-2:

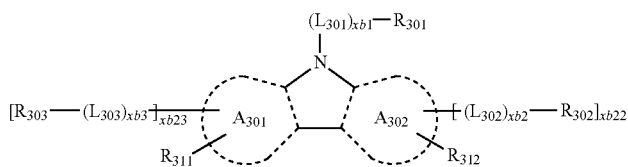

Formula 301-1

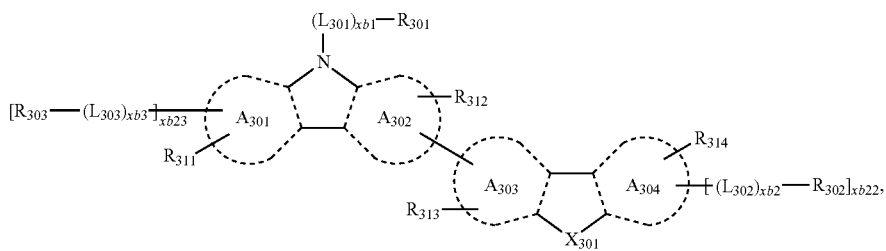

Formula 301-2 wherein, in Formulae 301-1 to 301-2, $A_{301}$ to $A_{304}$ may be each independently selected from a benzene group, a naphthalene group, a phenanthrene group, a fluoranthene group, a triphenylene group, a pyrene group, a chrysene group, a pyridine group, a pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a benzothiophene group, a dibenzothiophene group, a naphthothiophene group, a benzonaphthothiophene group, and a dinaphthothiophene group, $X_{301}$ may be O, S, or N-[$(L_{304})_{xb4}$-$R_{304}$], $R_{311}$ to $R_{314}$ may be each independently selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), xb22 and xb23 may be each independently 0, 1, or 2, descriptions of $L_{301}$, xb1, $R_{301}$, and $Q_{31}$ to $Q_{33}$ may each independently be the same as those provided herein, descriptions of $L_{302}$ to $L_{304}$ may be each independently the same as the description provided herein in connection with $L_{301}$, descriptions of xb2 to xb4 may be each independently the same as the description provided herein in connection with xb1, and descriptions of $R_{302}$ to $R_{304}$ may be each independently the same as the description provided herein in connection with $R_{301}$.

In some embodiments, $L_{301}$ to $L_{304}$ in Formulae 301, 301-1, and 301-2 may be each independently selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may be the same as those described herein.

In some embodiments, $R_{301}$ to $R_{304}$ in Formulae 301, 301-1, and 301-2 may be each independently selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may be the same as those described herein.

In one or more embodiments, the host may include an alkaline earth metal complex. For example, the host may be selected from a beryllium (Be) complex (e.g., Compound H55 illustrated below), a magnesium (Mg) complex, and a zinc (Zn) complex.

The host may include at least one selected from 9,10-di (2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), and Compounds H1 to H55, but embodiments are not limited thereto:

H1

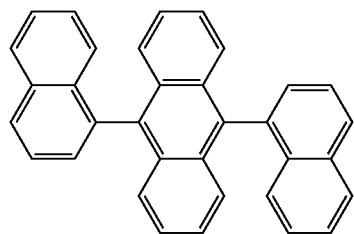

H2

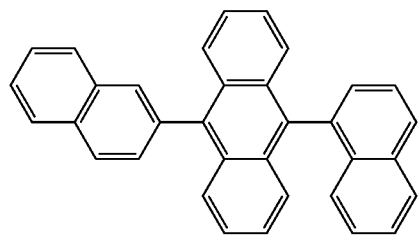

H3

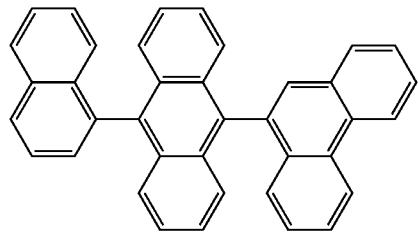

H4

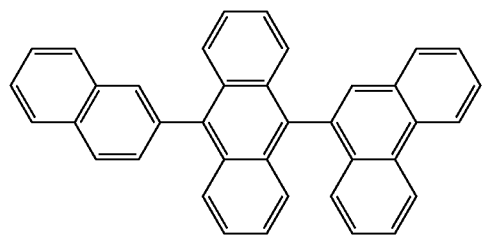

-continued

H5

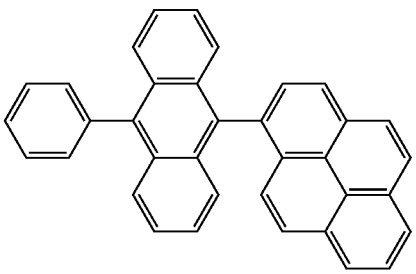

H6

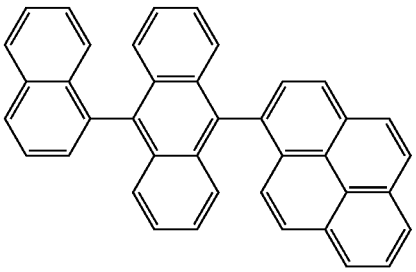

H7

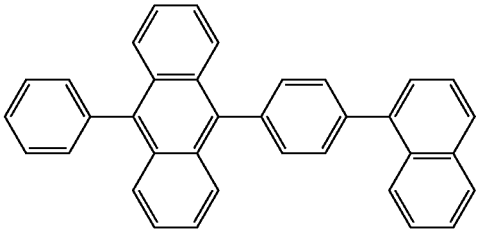

H8

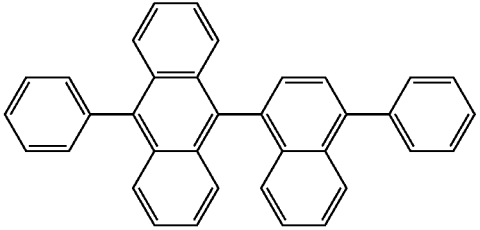

H9

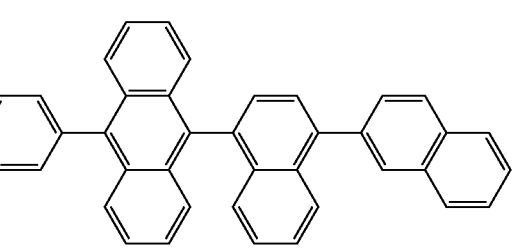

H10

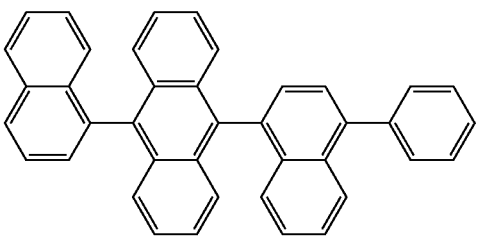

H11
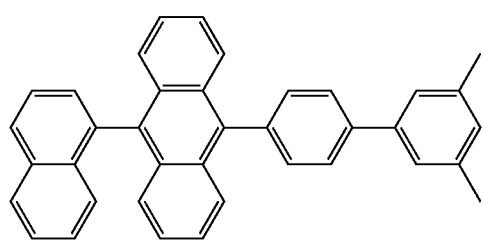
H12
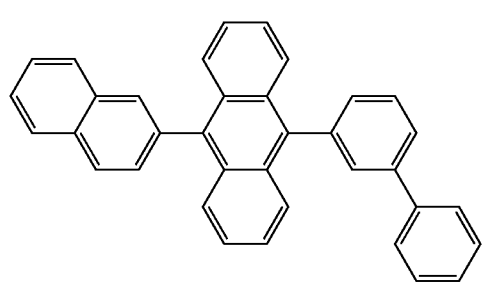
H13
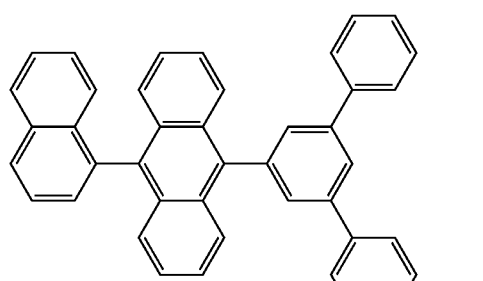
H14
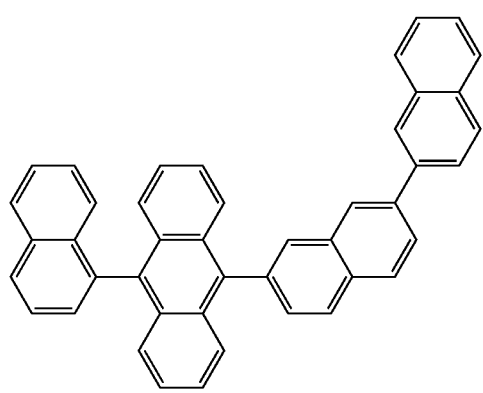
H15
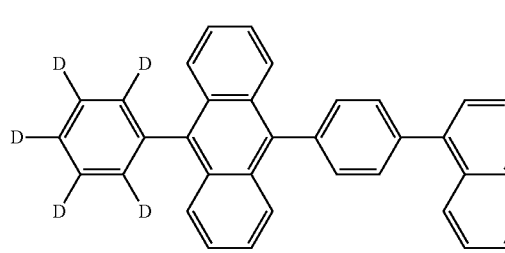
H16
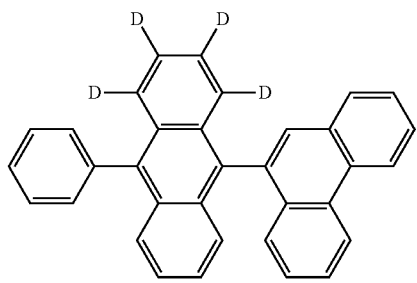
H17
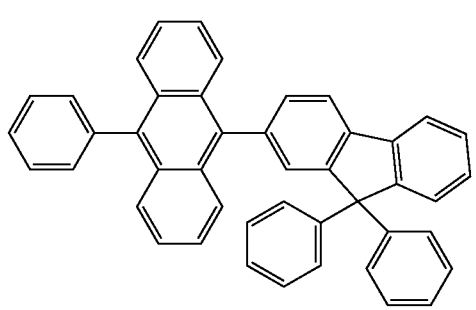
H18
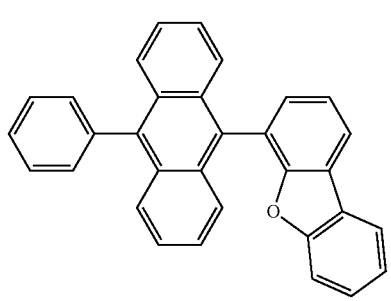
H19
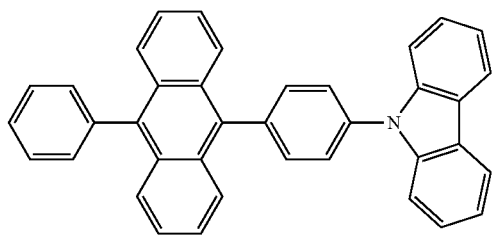
H20
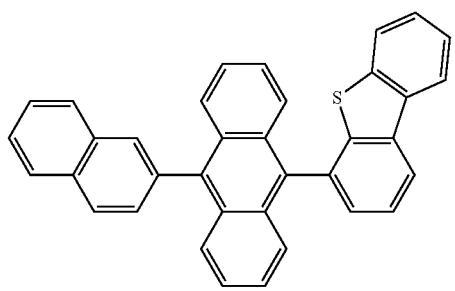

H21
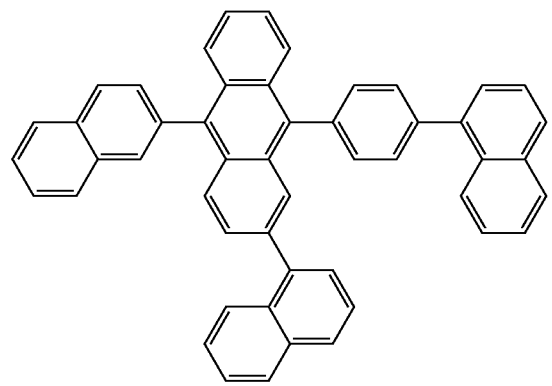
H22
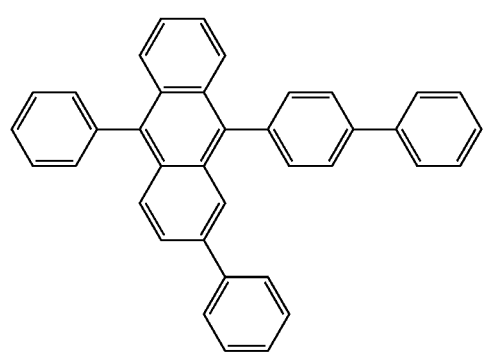
H23
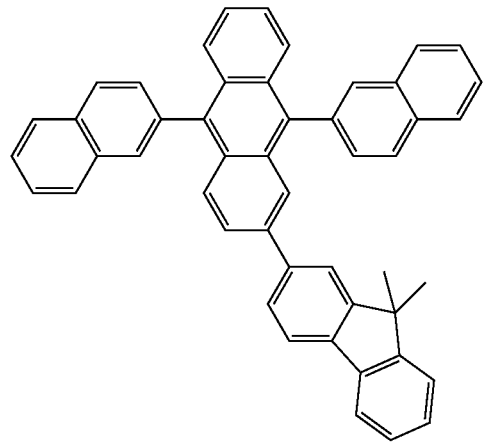
H24
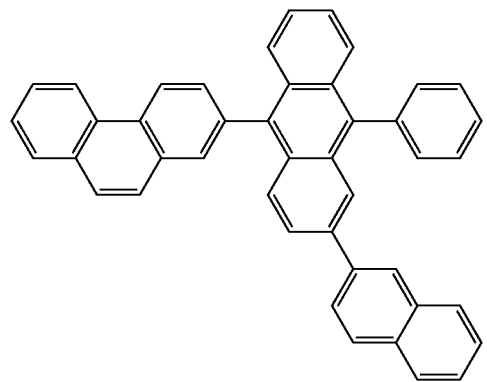
H25
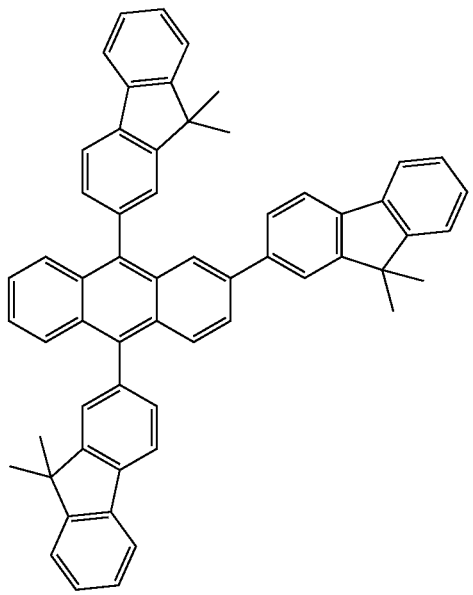
H26
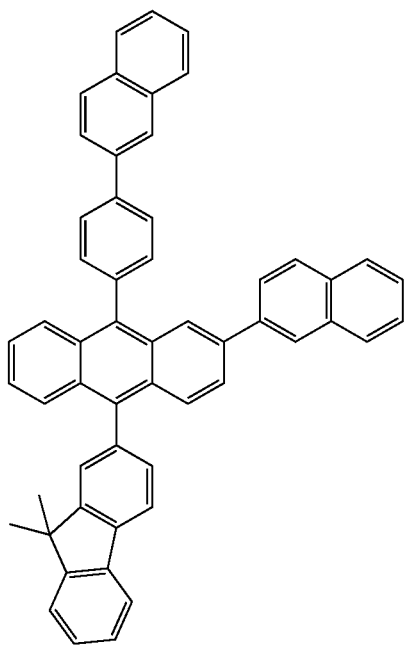

H27
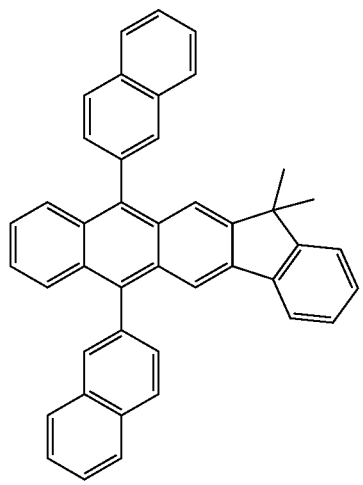
H28
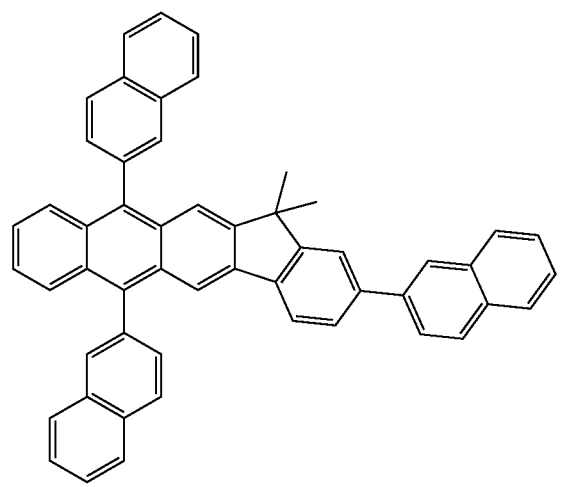
H29
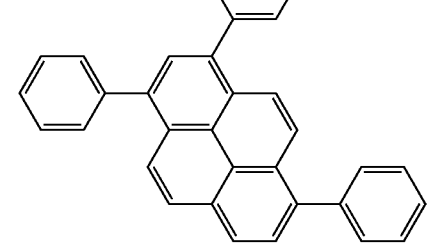
H30
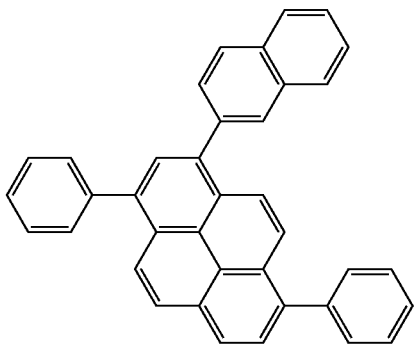
H31
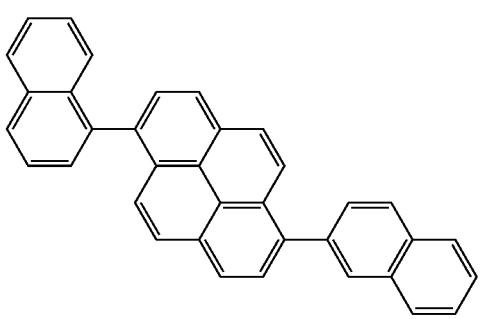
H32
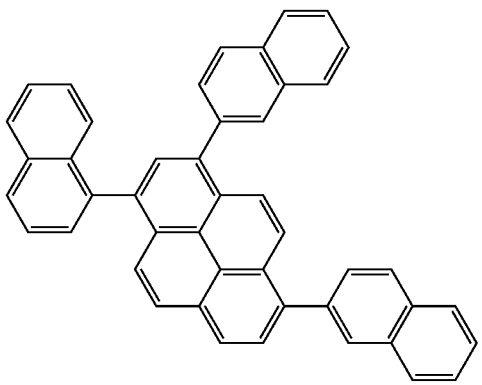
H33
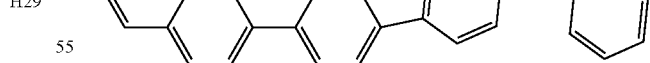
H34
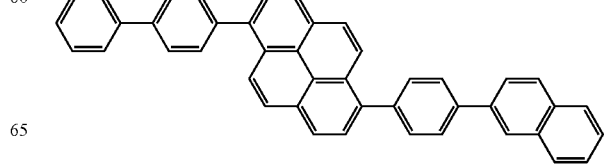

-continued
H35
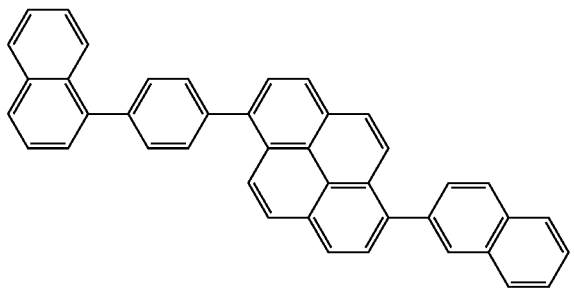
H36
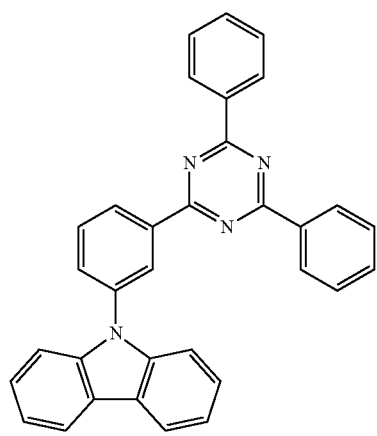
H37
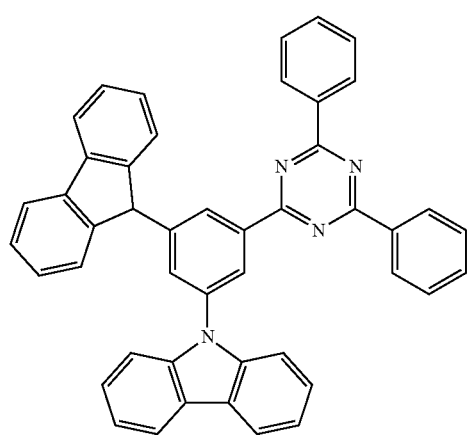
H38
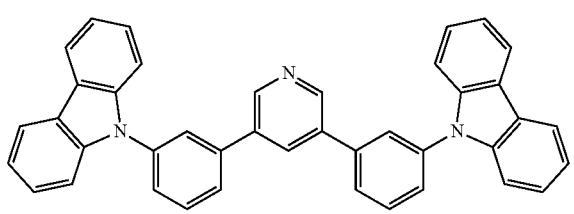
-continued
H39
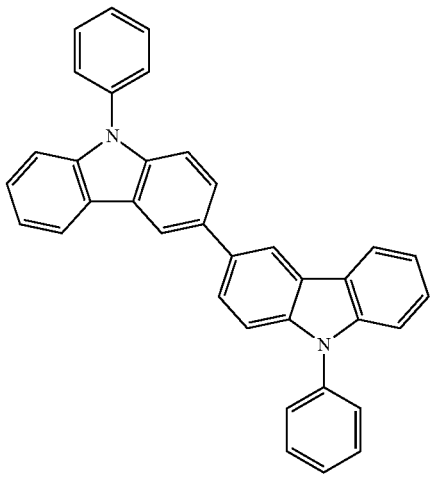
H40
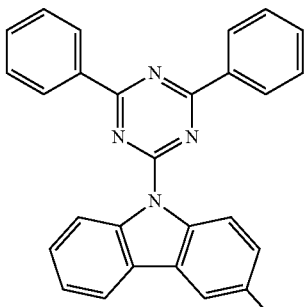
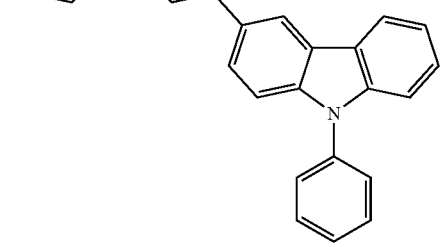
H41
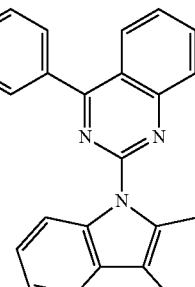
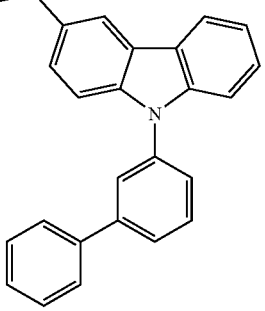

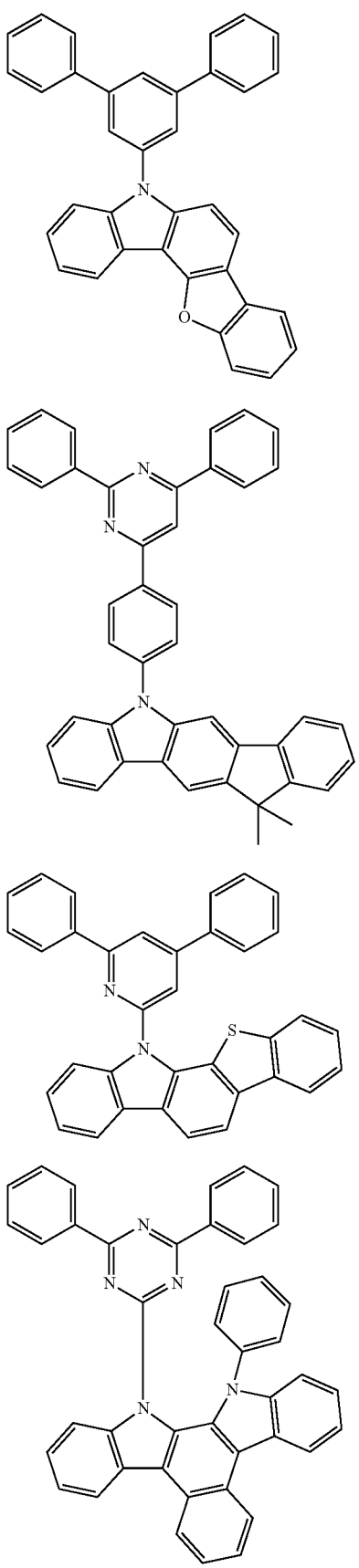
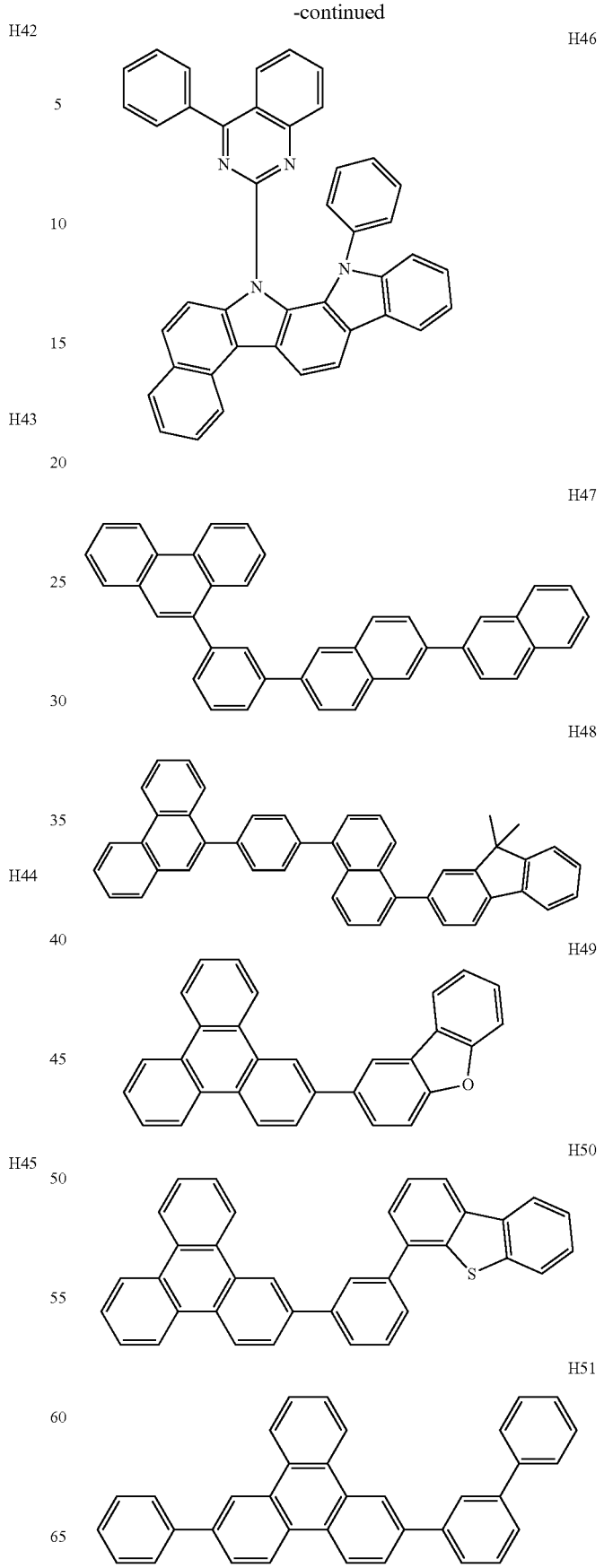

-continued

H52

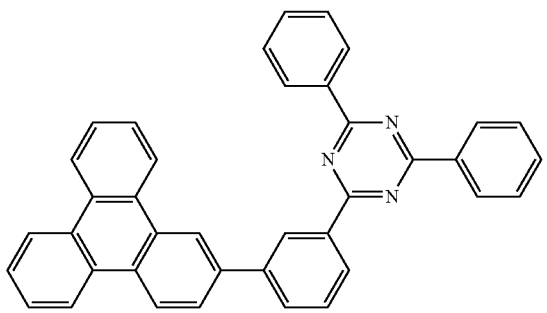

H53

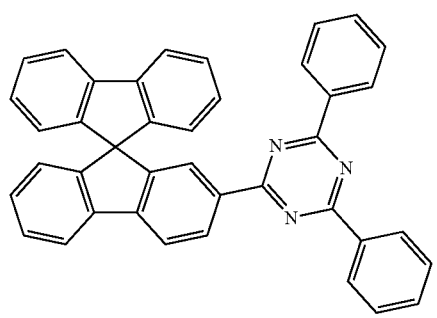

H54

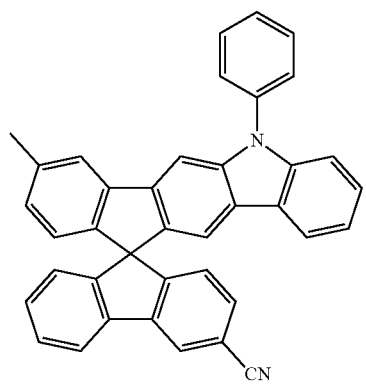

H55

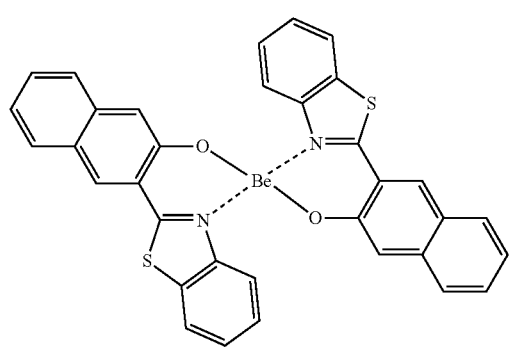

Phosphorescent Dopant Included in an Emission Layer of the Organic Layer 150

The phosphorescent dopant may include an organometallic complex represented by Formula 401:

$$M(L_{401})_{xc1}(L_{402})_{xc2} \quad \text{Formula 401}$$

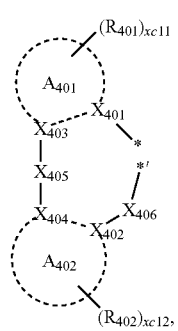

Formula 402 wherein, in Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, and xc1 may be 1, 2, or 3; when xc1 is 2 or greater, a plurality of $L_{401}$(s) may be identical to or different from each other, $L_{402}$ may be an organic ligand, and xc2 may be an integer selected from 0 to 4; when xc2 is 2 or greater, a plurality of $L_{402}$(s) may be identical to or different from each other, $X_{401}$ to $X_{404}$ may be each independently nitrogen (N) or carbon (C), $X_{401}$ and $X_{403}$ are bound to each other via a single bond or a double bond;

$X_{402}$ and $X_{404}$ are bound to each other via a single bond or a double bond, $A_{401}$ and $A_{402}$ may be each independently a $C_5$-$C_{60}$ carbocyclic group or a $C_1$-$C_{60}$ heterocyclic group, $X_{405}$ may be a single bond, *—O—*', *—S—*', —C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', wherein $Q_{411}$ and $Q_{412}$ may be each independently selected from hydrogen, deuterium, a $C_1$-$C_{20}$ alkyl group, a $C_1$-$C_{20}$ alkoxy group, a phenyl group, a biphenyl group, a terphenyl group, and a naphthyl group, $X_{406}$ may be a single bond, O, or S, $R_{401}$ and $R_{402}$ may be each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may be each independently selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may be each independently an integer selected from 0 to 10, and and *¹ in Formula 402 may each independently indicate a binding site to M in Formula 401.

According to an embodiment, $A_{401}$ and $A_{402}$ in Formula 402 may be each independently selected from a benzene group, a naphthalene group, a fluorene group, a spirobifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzoimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In one or more embodiments, in Formula 402, i) $X_{401}$ may be nitrogen, and $X_{402}$ may be carbon, or ii) $X_{401}$ and $X_{402}$ may both be nitrogen.

According to some embodiments, $R_{401}$ and $R_{402}$ in Formula 402 may be each independently selected from the group consisting of:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantyl group, a norbornanyl group, and a norbornenyl group;

a cyclopentyl group, a cyclohexyl group, an adamantyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and $Si(Q_{401})(Q_{402})(Q_{403})$, —$N(Q_{401})(Q_{402})$, —$B(Q_{401})(Q_{402})$, —$C(=O)(Q_{401})$, —$S(=O)_2(Q_{401})$, and —$P(=O)(Q_{401})(Q_{402})$, wherein $Q_{401}$ to $Q_{403}$ may be each independently selected from a $C_1$-$C_{10}$ alkyl group, a $C_1$-$C_{10}$ alkoxy group, a phenyl group, a biphenyl group, and a naphthyl group, but embodiments are not limited thereto.

In one or more embodiments, when xc1 in Formula 401 is 2 or greater, two $A_{401}(s)$ in a plurality of $L_{401}(s)$ may optionally be bound to each other via $X_{407}$ as a linking group, and two $A_{402}(s)$ may optionally be bound to each other via $X_{408}$ as a linking group (see e.g., Compounds PD1 to PD4 and PD7). $X_{407}$ and $X_{408}$ may be each independently selected from a single bond, *—C(=O)—*', *—S—*', *—N($Q_{413}$)—*', *—C($Q_{413}$)($Q_{414}$)—' or *—C($Q_{413}$)=C($Q_{414}$)—*' wherein, $Q_{413}$ and $Q_{414}$ may be each independently selected from hydrogen, deuterium, a $C_1$-$C_{20}$ alkyl group, a $C_1$-$C_{20}$ alkoxy group, a phenyl group, a biphenyl group, a terphenyl group, and a naphthyl group, but embodiments are not limited thereto.

$L_{402}$ in Formula 401 may be any suitable monovalent, divalent, or trivalent organic ligand. In some embodiments, $L_{402}$ may be selected from halogen, diketone (e.g., acetylacetonate), a carboxylic acid (e.g., picolinate), —C(=O), isonitrile, —CN, and phosphorus (e.g., phosphine and/or phosphite), but embodiments are not limited thereto.

In some embodiments, the phosphorescent dopant may include, for example, at least one selected from Compounds PD1 to PD25, but embodiments are not limited thereto:

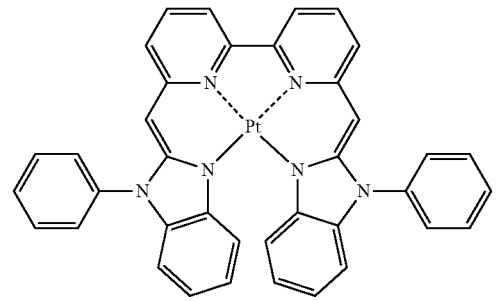

PD1

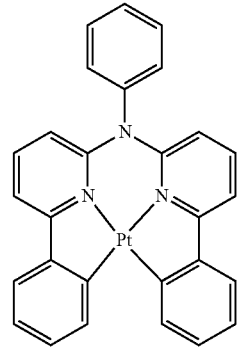

PD2

-continued
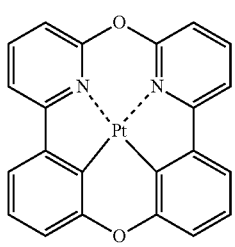
PD3
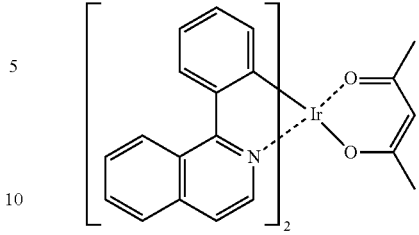
PD9
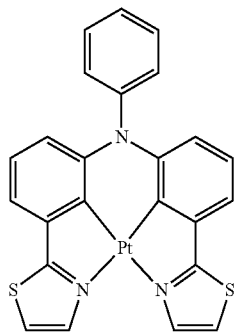
PD4
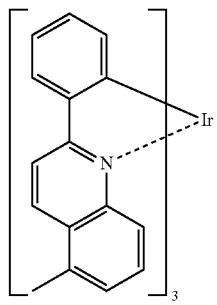
PD10
PD5
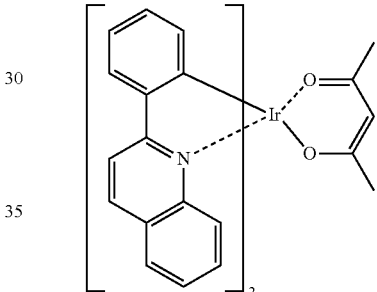
PD11
PD6
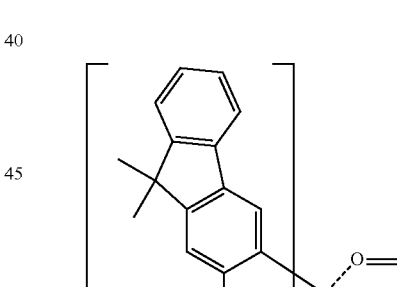
PD12
PD7
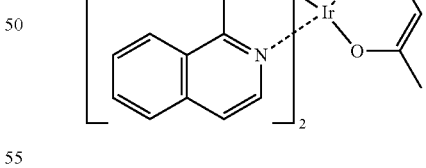
PD8
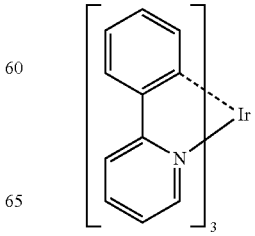
PD13

PD14
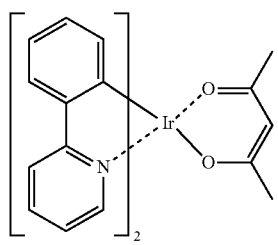
PD15
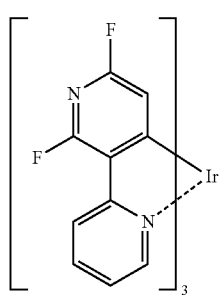
PD16
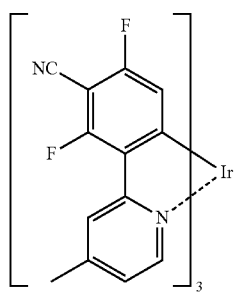
PD17
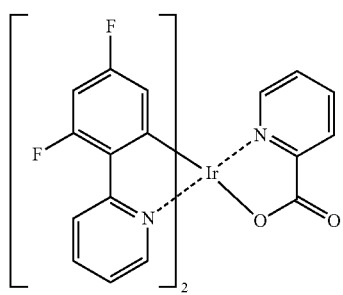
PD18
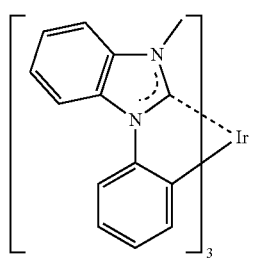
PD19
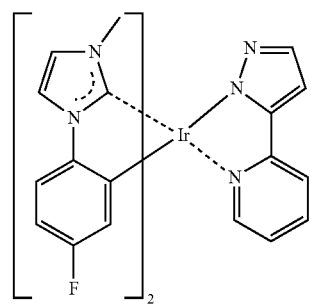
PD20
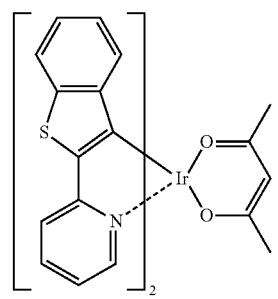
PD21
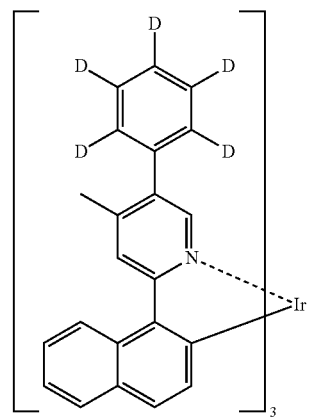
PD22
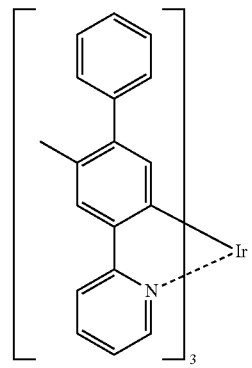

-continued

PD23

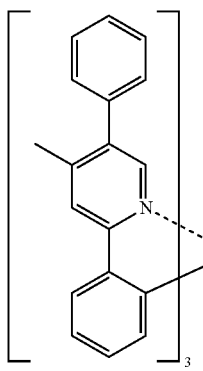

PD24

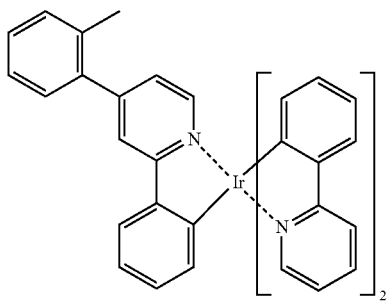

PD25

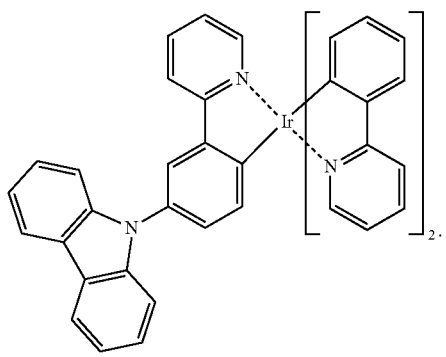

In one embodiment, the emission layer may emit red phosphorescence having a maximum emission wavelength range between about 590 nm and about 780 nm.

In one embodiment, the organometallic compound included in the emission layer, particularly, the organometallic compound emitting light having a long wavelength range between about 590 nm and about 780 nm may be subjected to dissociation of a metal-ligand complex due to UV light. The electronic apparatus according to an embodiment may include the cured product of the composition for forming the organic film in the thin film encapsulation portion, the composition including the UV absorber and the curable material including the (meth)acrylate compound, thereby preventing deterioration of the organometallic compound within the wavelength range of UV light.

Fluorescent Dopant in Emission Layer

The fluorescent dopant may include an arylamine compound or a styrylamine compound.

In some embodiments, the fluorescent dopant may include a compound represented by Formula 501:

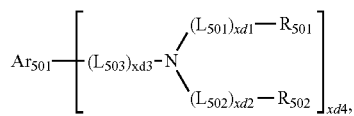

Formula 501 wherein, in Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may be each independently an integer selected from 0 to 3, $R_{501}$ and $R_{502}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer selected from 1 to 6.

In some embodiments, $Ar_{501}$ in Formula 501 may be selected from the group consisting of:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, $L_{501}$ to $L_{503}$ in Formula 501 may be each independently selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

According to some embodiments, $R_{501}$ and $R_{501}$ in Formula 502 may be each independently selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), wherein $Q_{31}$ to $Q_{33}$ may each independently selected from a $C_1$-$C_{10}$ alkyl group, a $C_1$-$C_{10}$ alkoxy group, a phenyl group, a biphenyl group, a terphenyl group, and a naphthyl group.

In one or more embodiments, xd4 in Formula 501 may be 2, but embodiments are not limited thereto.

In some embodiments, the fluorescent dopant may be selected from Compounds FD1 to FD22:

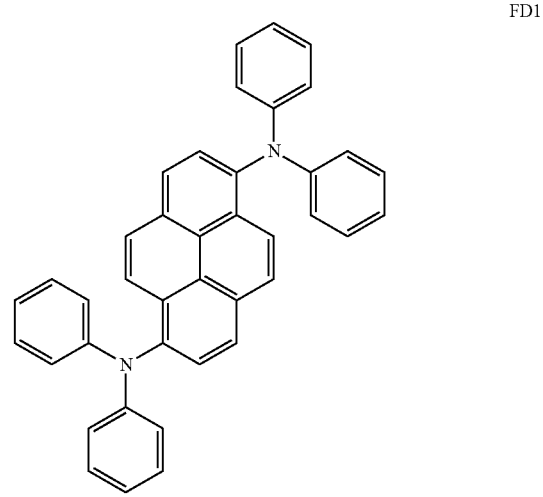

FD1

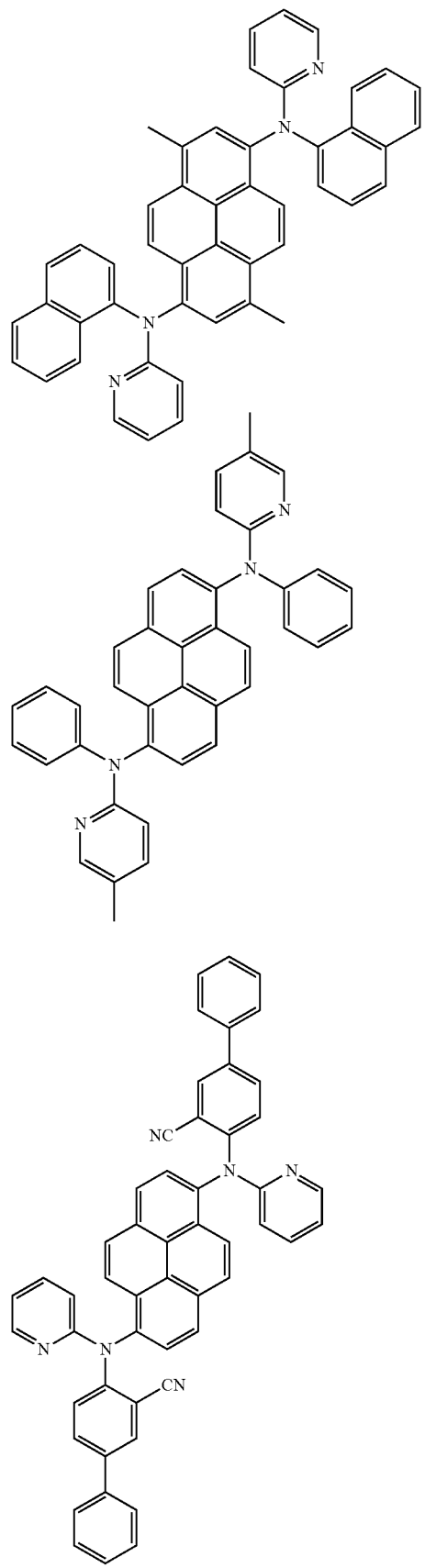
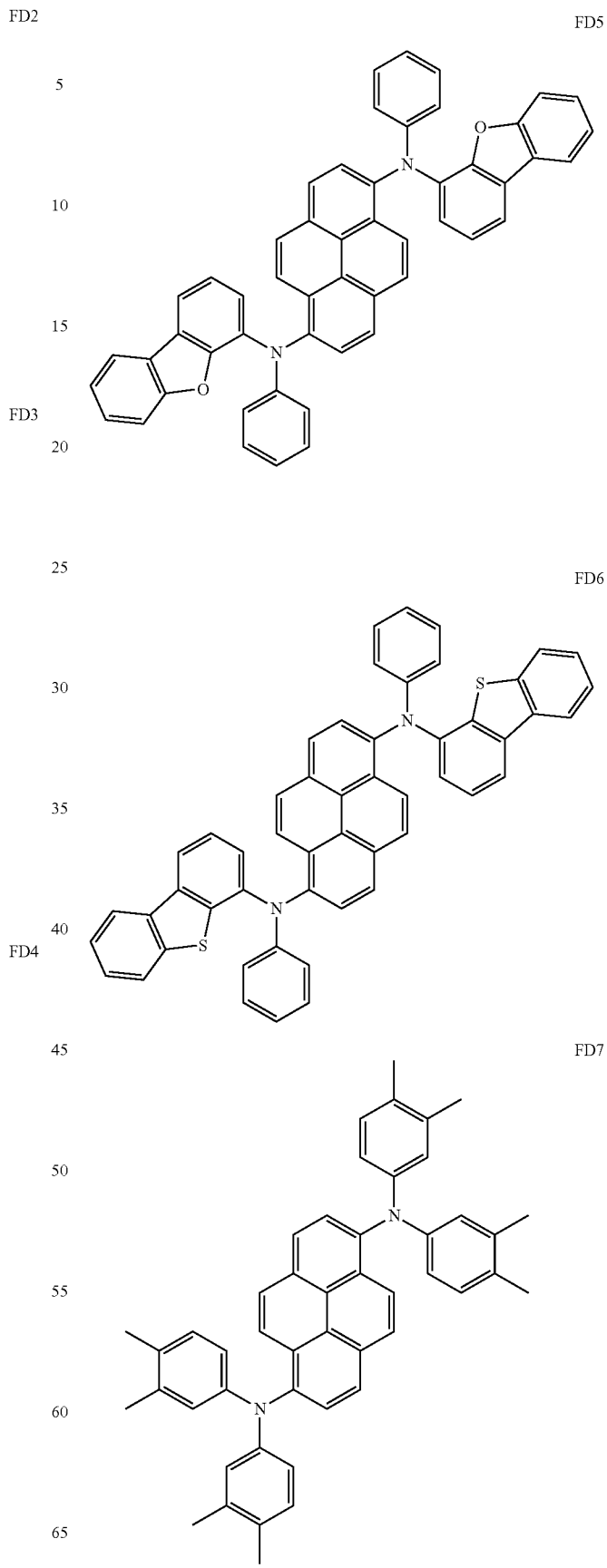

FD8
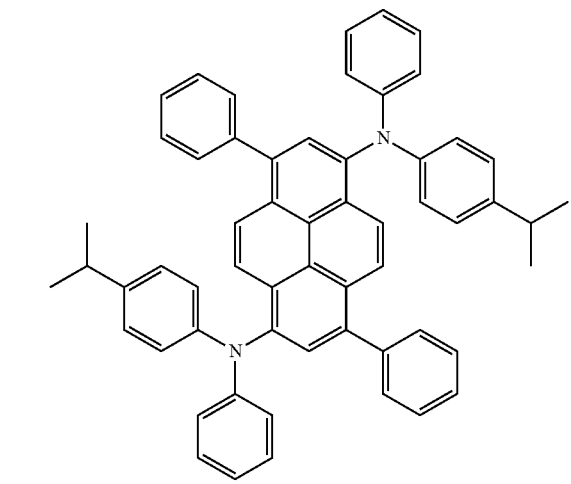
FD9
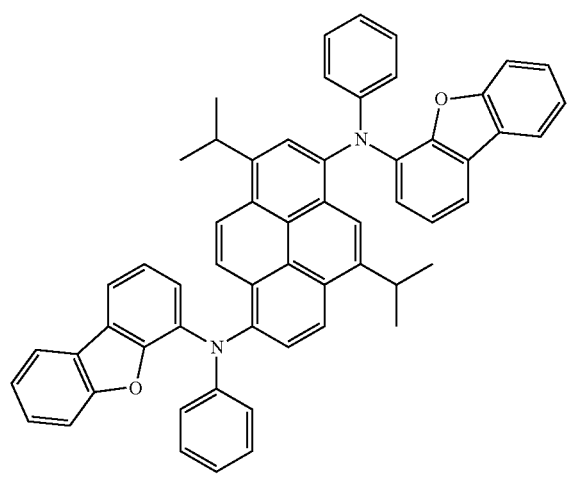
FD10
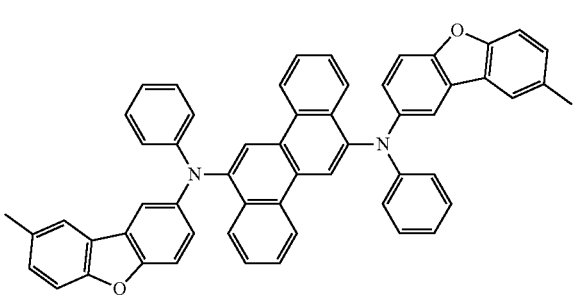
FD11
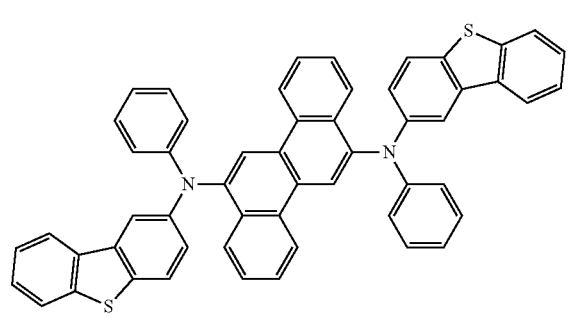
FD12
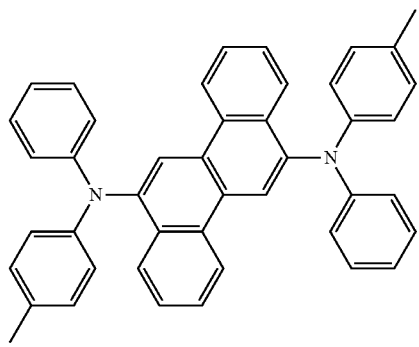
FD13
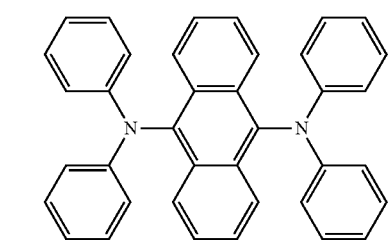
FD14
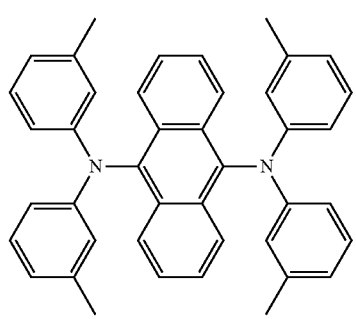
FD15
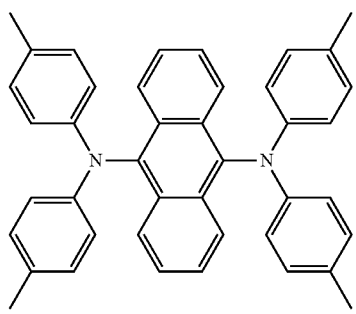
FD16
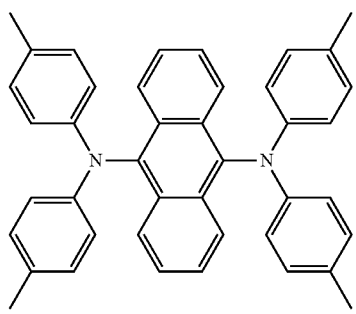

FD17
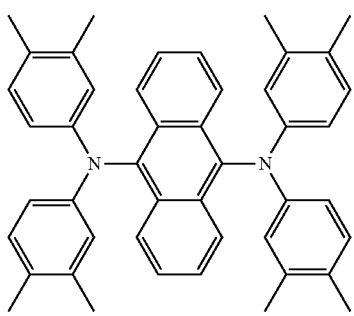
FD20
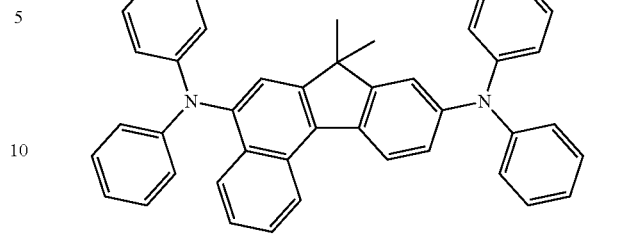
FD18
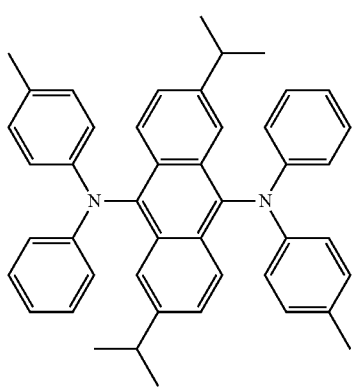
FD21
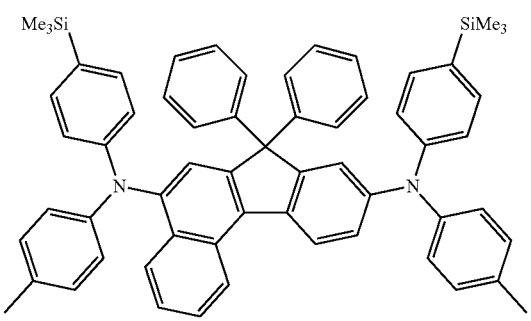
FD19
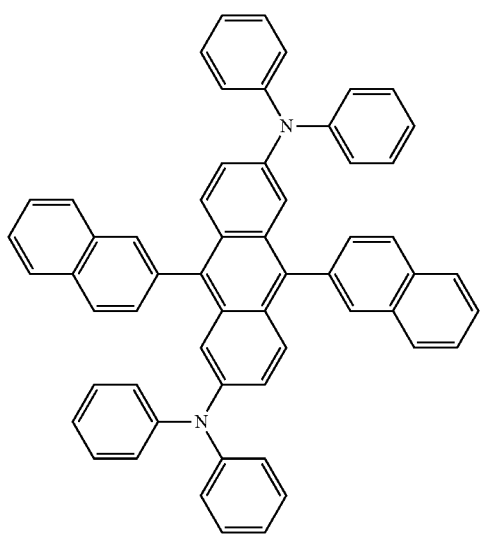
FD22
In some embodiments, the fluorescent dopant may be selected from the compounds below, but embodiments are not limited thereto:
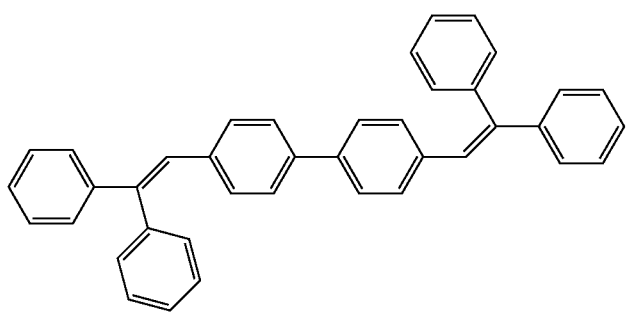
DPVBi

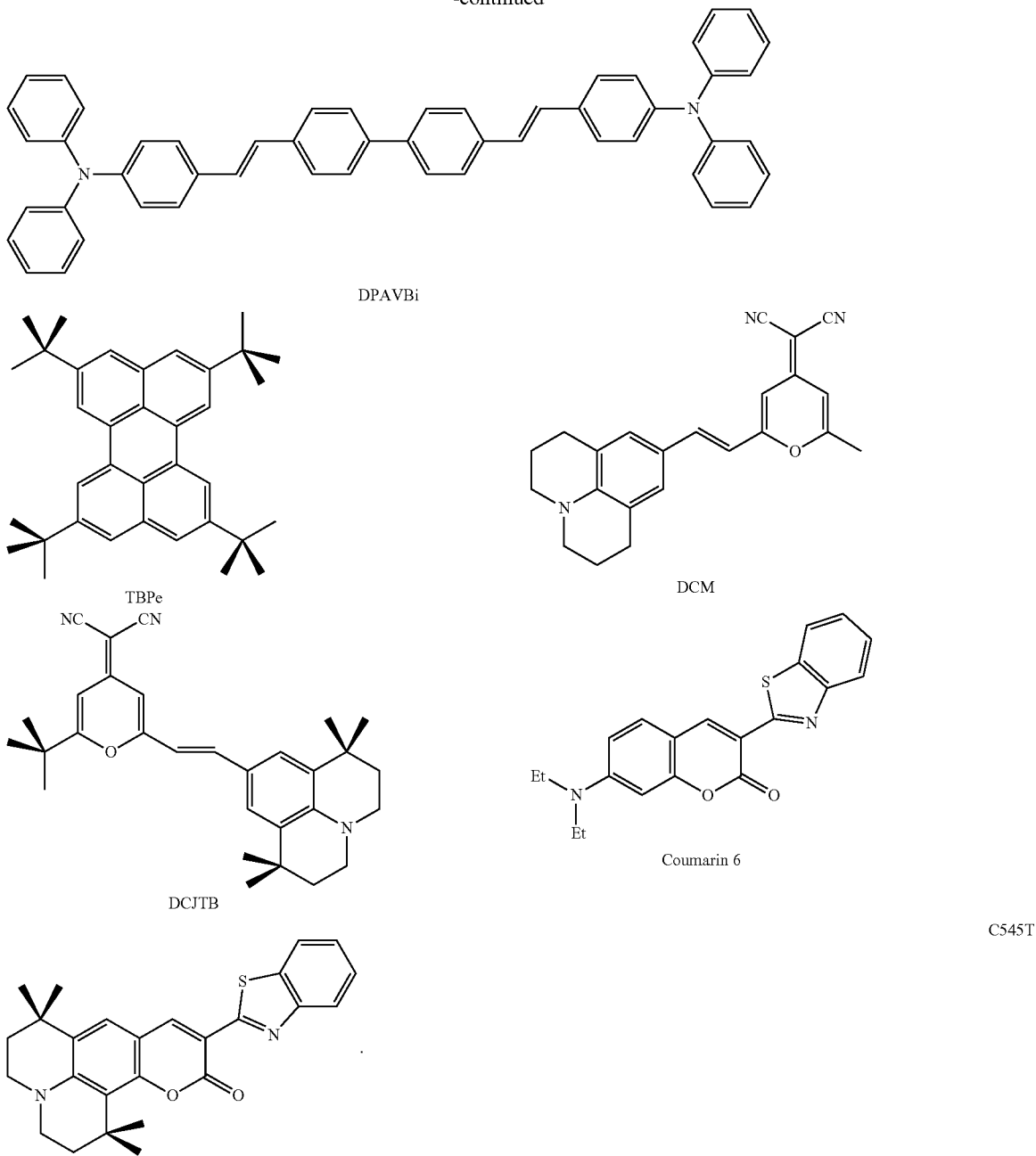

Electron Transport Region in Organic Layer 150

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one selected from a buffer layer, a hole blocking layer, an electron control layer, an electron transport layer, and an electron injection layer, but is not limited thereto.

In some embodiments, the electron transport region may have a structure of electron transport layer/electron injection layer, a structure of hole blocking layer/electron transport layer/electron injection layer, a structure of electron control layer/electron transport layer/electron injection layer, or a structure of buffer layer/electron transport layer/electron injection layer, wherein the layers of these structures are sequentially stacked in these stated orders on an emission layer. However, the structure of the electron transport region is not limited thereto.

The electron transport region (e.g., a buffer layer, a hole blocking layer, an electron control layer, and/or an electron transport layer in the electron transport region) may include a metal-free compound containing at least one π electron-depleted nitrogen-containing ring.

The term "π electron-depleted nitrogen-containing ring" as used herein may refer to a $C_1$-$C_{60}$ heterocyclic group having at least one *—N=* moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed (e.g., fused), or iii) a heteropolycyclic group in which at least one 5-membered to 7-membered heteromonocyclic group having at least one *—N=*' moiety, is condensed (e.g., fused) with at least one $C_5$-$C_{60}$ carbocyclic group.

Non-limiting examples of the π electron-depleted nitrogen-containing ring may include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an isobenzothiazole, a benzoxazole, an isobenzoxazole, a triazole, a tetrazole, an oxadiazole, a triazine, thiadiazole, an imidazopyridine, an imidazopyrimidine, and an azacarbazole, but are not limited thereto.

In some embodiments, the electron transport region may include a compound represented by Formula 601:

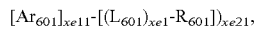
                         Formula 601 wherein, in Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer selected from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), wherein $Q_{601}$ to $Q_{603}$ may be each independently a $C_1$-$C_{10}$ alkyl group, a $C_1$-$C_{10}$ alkoxy group, a phenyl group, a biphenyl group, a terphenyl group, or a naphthyl group, and xe21 may be an integer selected from 1 to 5.

In some embodiments, at least one selected from the xe11 number of $Ar_{601}$(s) and the xe21 number of $R_{601}$(s) may include a π electron-depleted nitrogen-containing ring.

In some embodiments, ring $Ar_{601}$ in Formula 601 may be selected from the group consisting of:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzoimidazole group, an iso-benzothiazole group, a benzoxazole group, an isobenzoxazole group, a triazole group, a tetrazole group, an oxadiazole group, a triazine group, a thiadiazole group, an imidazopyridine group, an imidazopyrimidine group, and indenoquinoline group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzoimidazole group, an iso-benzothiazole group, a benzoxazole group, an isobenzoxazole group, a triazole group, a tetrazole group, an oxadiazole group, a triazine group, a thiadiazole group, an imidazopyridine group, an imidazopyrimidine group, and indenoquinoline group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), wherein $Q_{31}$ to $Q_{33}$ may be each independently selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or greater, a plurality of $Ar_{601}$(s) may be bound to each other via a single bond.

In one embodiment, $Ar_{601}$ in Formula 601 may be an anthracene group.

In some embodiments, the compound represented by Formula 601 may be represented by Formula 601-1:

Formula 601-1

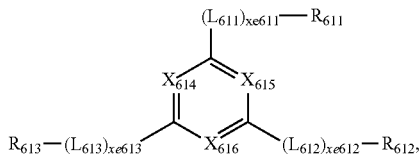

wherein, in Formula 601-1, $X_{614}$ may be N or $C(R_{614})$, $X_{615}$ may be N or $C(R_{615})$, $X_{616}$ may be N or $C(R_{616})$, and at least one selected from $X_{614}$ to $X_{616}$ may be N, descriptions of $L_{611}$ to $L_{613}$ may be each independently the same as the description provided herein in connection with $L_{601}$, descriptions of xe611 to xe613 may be each independently the same as the description provided herein in connection with xe1, descriptions of $R_{611}$ to $R_{613}$ may be each independently substantially the same as the description provided herein in connection with $R_{601}$, and $R_{614}$ to $R_{616}$ may be each independently selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may be each independently selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzoimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments are not limited thereto.

In one or more embodiments, xe1 and xe611 to xe613 in Formulae 601 and 601-1 may be each independently selected from 0, 1, and 2.

In some embodiments, $R_{601}$ and $R_{611}$ to $R_{613}$ in Formulae 601 and 601-1 may be each independently selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=)(Q$_{601}$)(Q$_{602}$), wherein $Q_{601}$ and $Q_{602}$ may be each independently the same as described herein.

The electron transport region may include at least one compound selected from Compounds ET1 to ET36, but embodiments are not limited thereto:

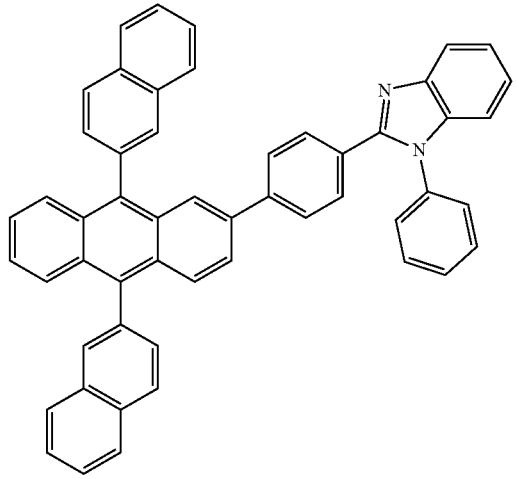

ET1

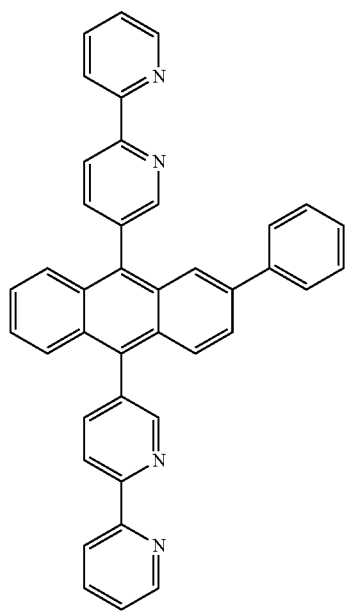
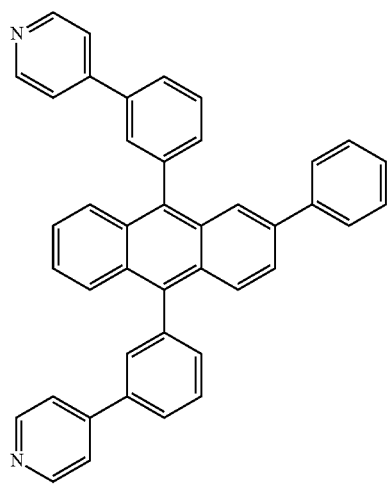
ET3
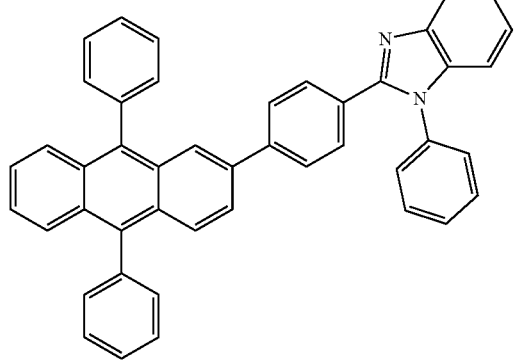
ET4
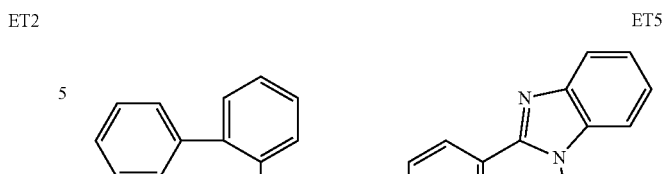
ET5
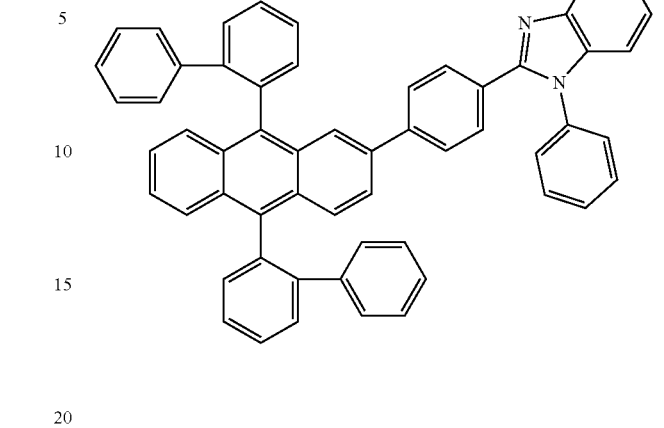
ET6
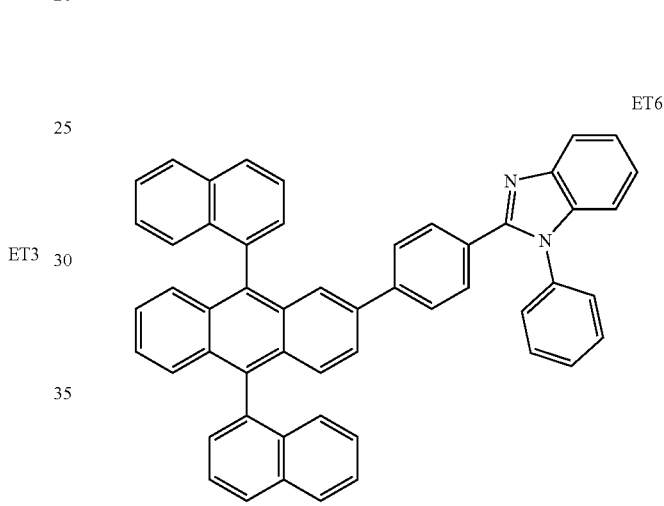
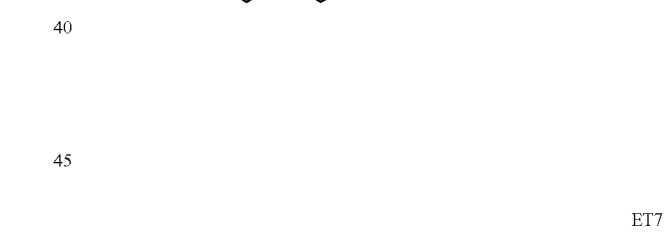
ET7
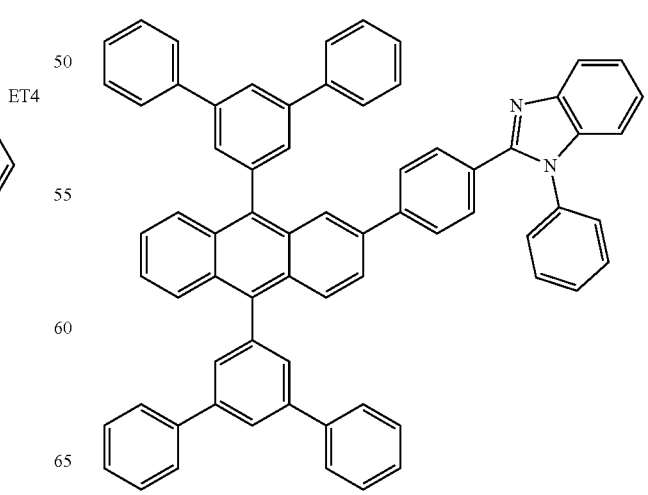

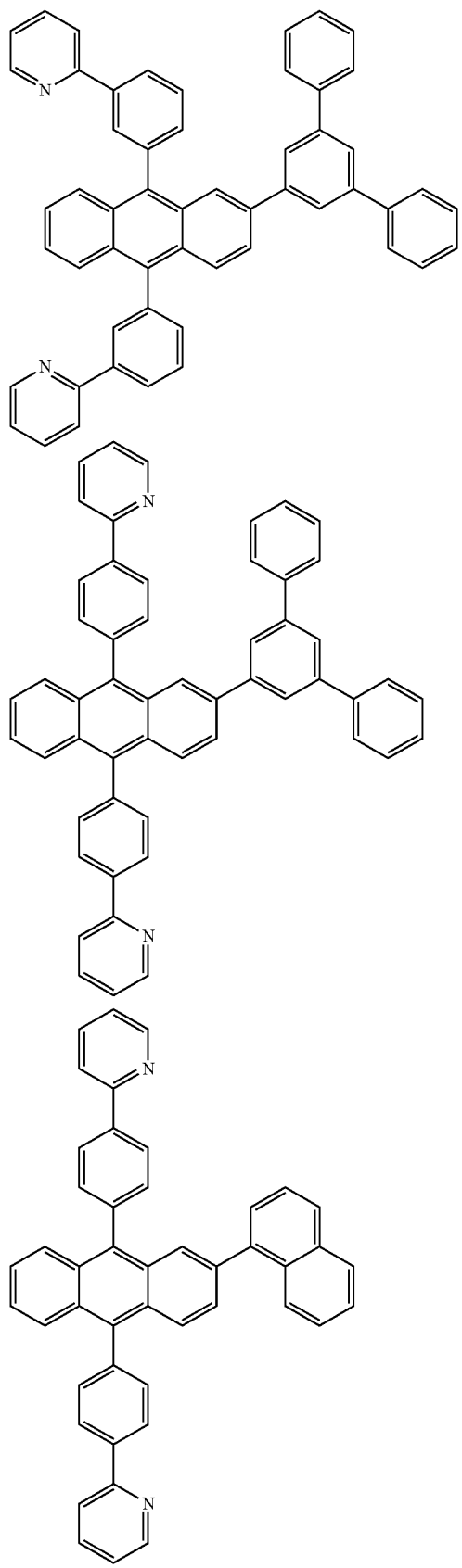
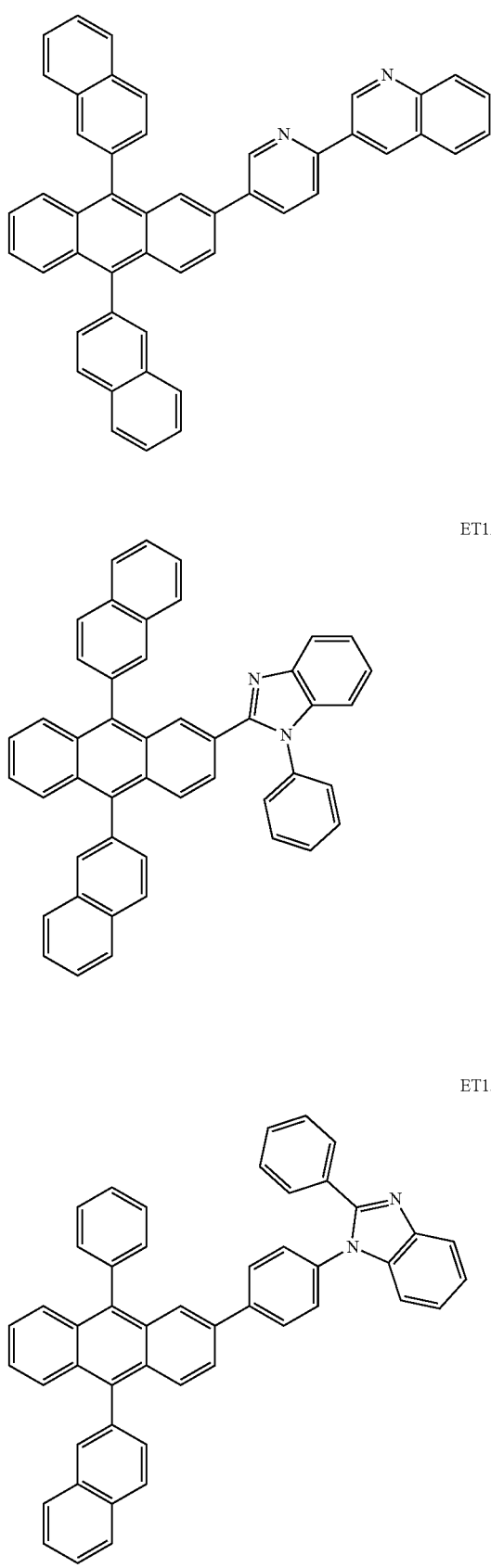

ET14
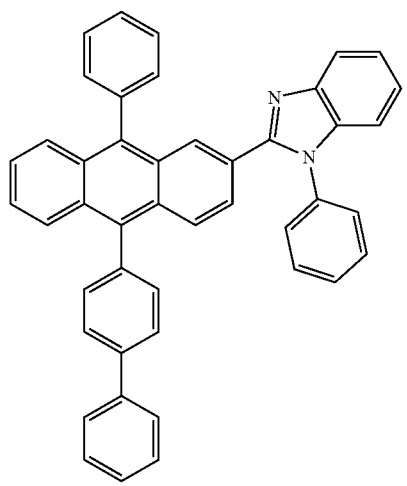
ET17
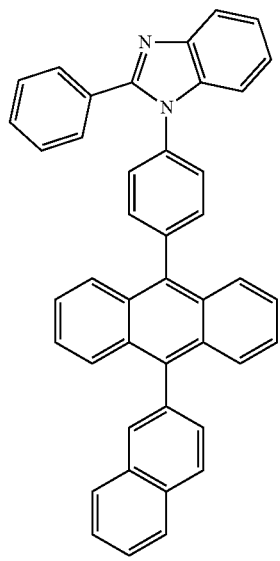
ET15
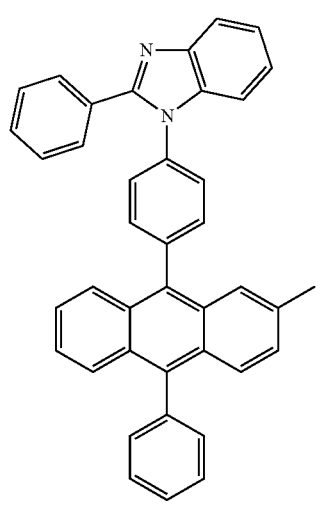
ET18
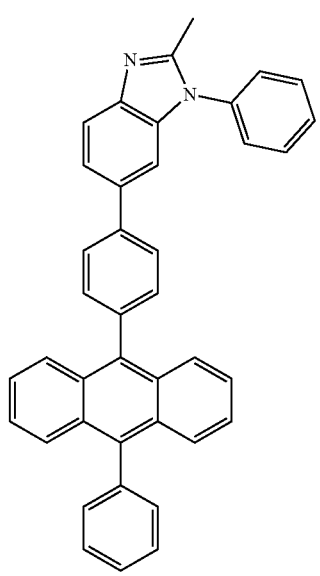
ET16
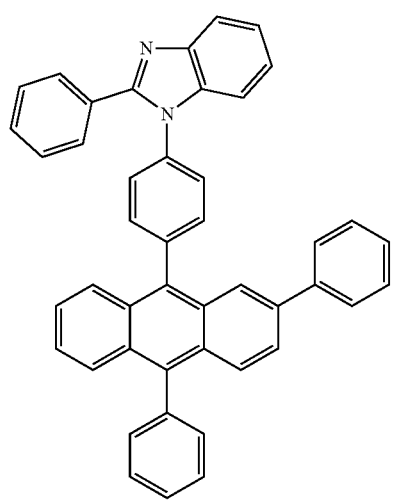
ET19

-continued
ET20
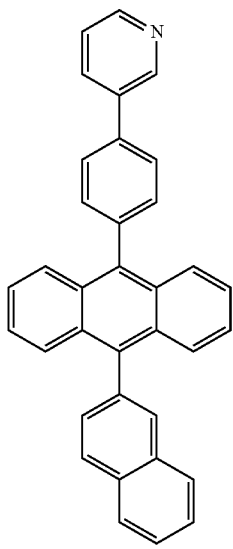
ET23
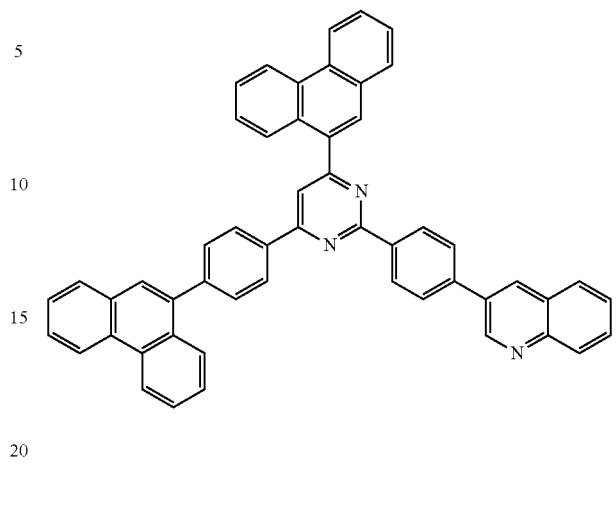
ET21
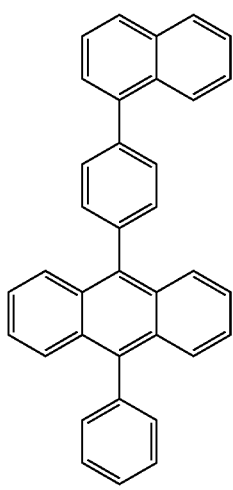
ET24
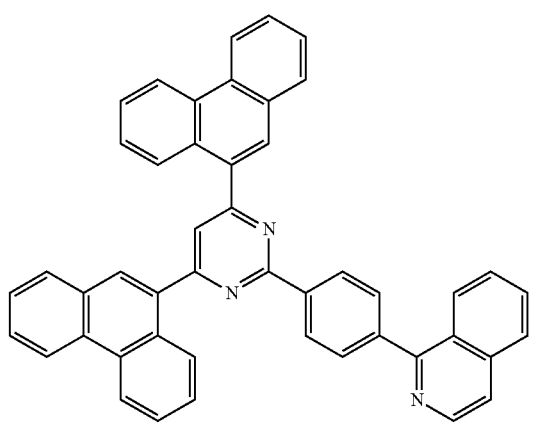
ET22
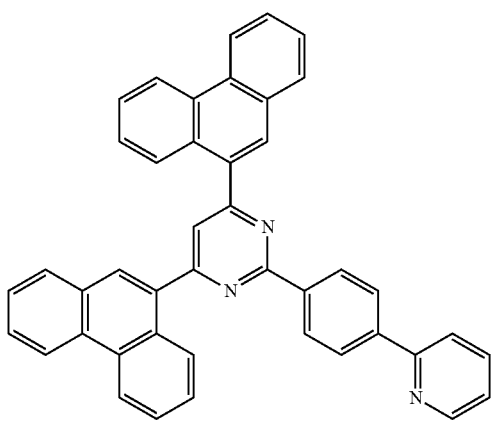
ET25
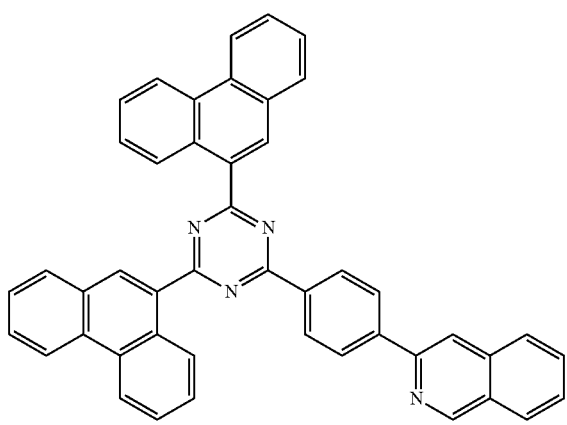

-continued
ET26
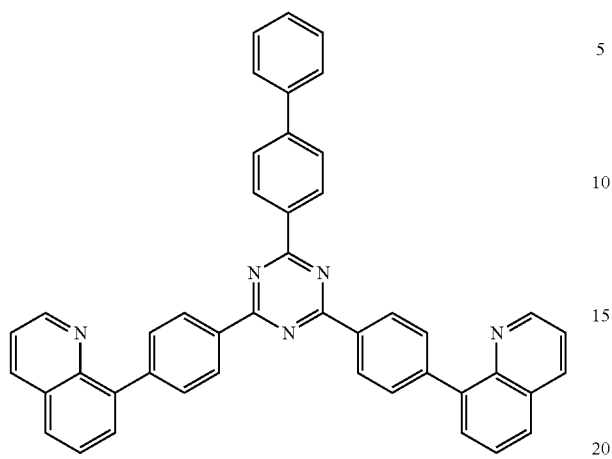
ET27
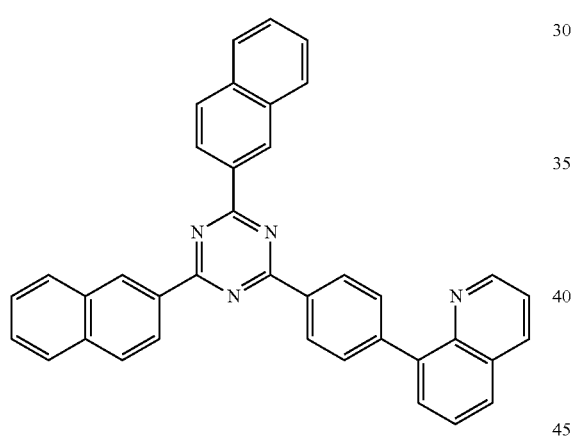
ET28
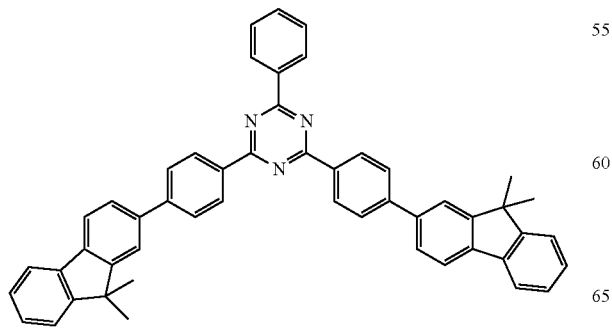
-continued
ET29
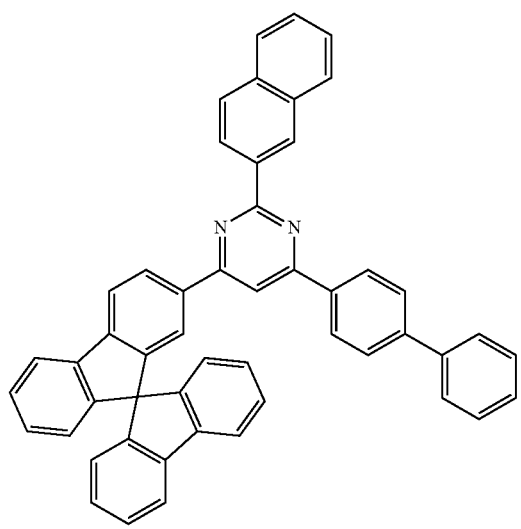
ET30
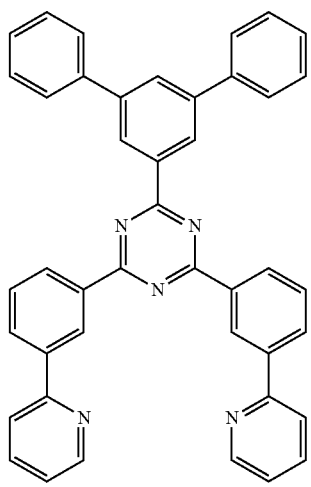
ET31
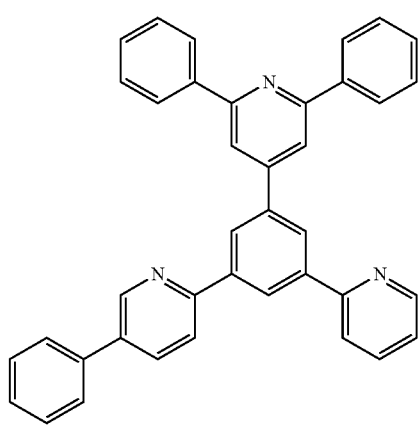

ET32
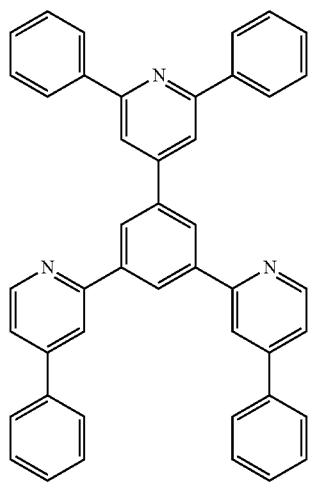
ET35
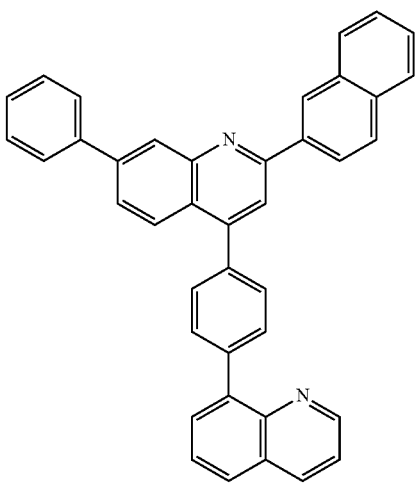
ET33
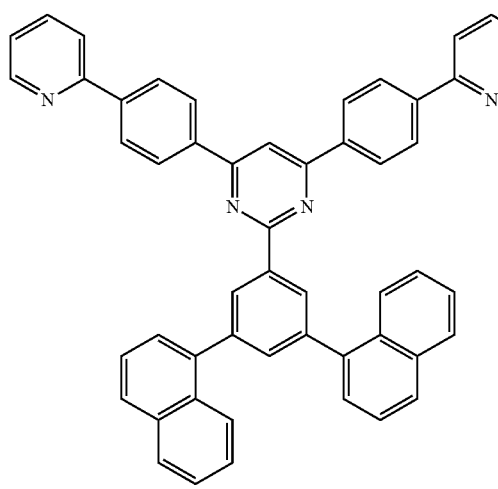
ET36
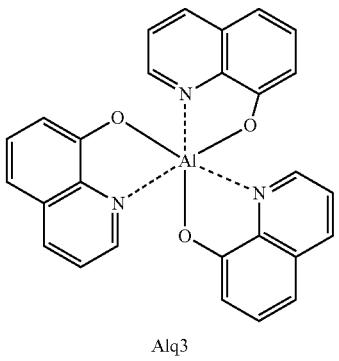
In one or more embodiments, the electron transport region may include at least one compound selected from 2,9-dimethyl-4,7-diphenyl-1,10-phenanthroline (BCP), 4,7-diphenyl-1,10-phenanthroline (Bphen), Alq₃, BAlq, 3-(Biphenyl-4-yl)-5-(4-tert-butylphenyl)-4-phenyl-4H-1,2,4-triazole (TAZ), and NTAZ:
ET34
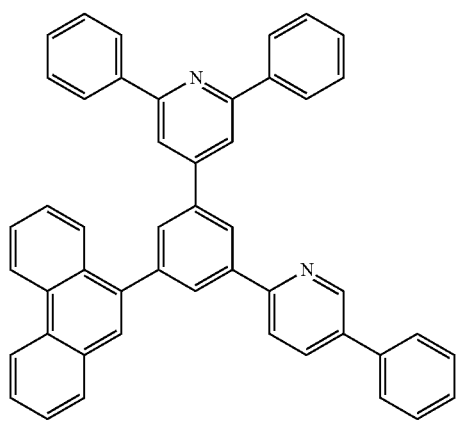

-continued

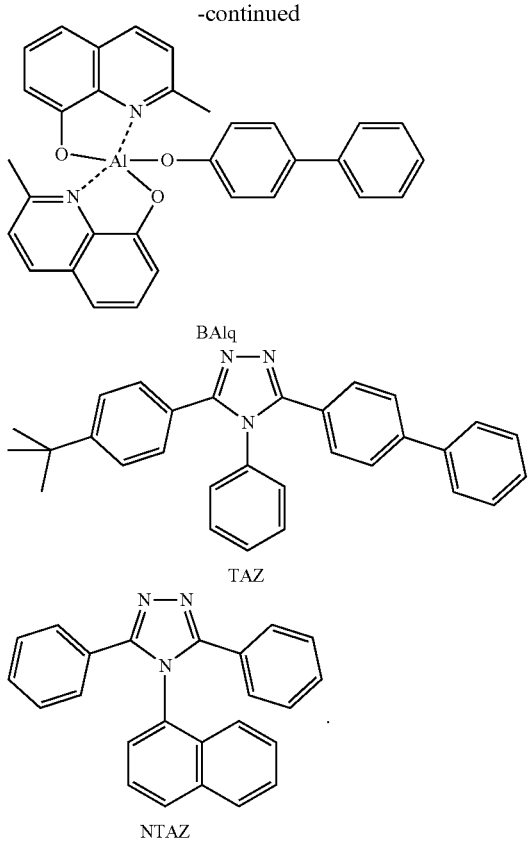

BAlq

TAZ

NTAZ

The thickness of the buffer layer, the hole blocking layer, and the electron control layer may be each independently in a range of about 20 Å to about 1,000 Å. When the thicknesses of the buffer layer, the hole blocking layer, and the electron control layer are each within any of these ranges, the electron transport region may have excellent (or suitable) hole blocking characteristics or electron control characteristics without a substantial increase in driving voltage.

The thickness of the electron transport layer may be in a range of about 100 Å to about 1,000 Å, and in some embodiments, about 150 Å to about 500 Å. When the thickness of the electron transport layer is within any of these ranges, the electron transport layer may have satisfactory (or suitable) electron transport characteristics without a substantial increase in driving voltage.

The electron transport region (e.g., the electron transport layer in the electron transport region) may further include, in addition to the materials described above, a metal-containing material.

The metal-containing material may include at least one selected from an alkali metal complex and an alkaline earth metal complex. The alkali metal complex may include a metal ion selected from an Li ion, a Na ion, a K ion, a Rb ion, and a Cs ion, and the alkaline earth metal complex may include a metal ion selected from a Be ion, a Mg ion, a Ca ion, an Sr ion, and a Ba ion. Ligands respectively coordinated with the metal ion of the alkali metal complex or the alkaline earth metal complex may be each independently selected from a hydroxyquinoline, a hydroxyisoquinoline, a hydroxybenzoquinoline, a hydroxyacridine, a hydroxyphenanthridine, a hydroxyphenyl oxazole, a hydroxyphenyl thiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene, but embodiments are not limited thereto.

In some embodiments, the metal-containing material may include a Li complex. The Li complex may include, for example, Compound ET-D1 (lithium quinolate, LiQ) and/or Compound ET-D2:

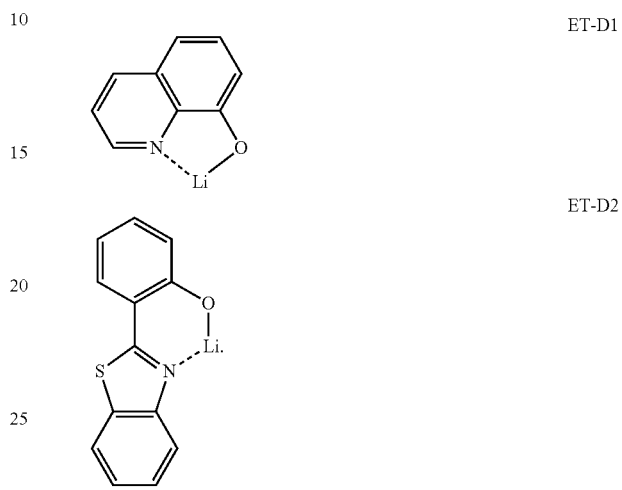

ET-D1

ET-D2

The electron transport region may include an electron injection layer that facilitates injection of electrons from the second electrode 190. The electron injection layer may directly contact the second electrode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare-earth metal, an alkali metal compound, an alkaline earth metal compound, a rare-earth metal compound, an alkali metal complex, an alkaline earth metal complex, a rare-earth metal complex, or a combination thereof.

The alkali metal may be selected from Li, Na, K, Rb, and Cs. In one embodiment, the alkali metal may be selected from Li, Na, and Cs. In one or more embodiments, the alkali metal may be Li or Cs, but is not limited thereto.

The alkaline earth metal may be selected from Mg, Ca, Sr, and Ba.

The rare-earth metal may be selected from Sc, Y, Ce, Tb, Yb, Gd, and Tb.

The alkali metal compound, the alkaline earth metal compound, and the rare-earth metal compound may be each independently selected from oxides and halides (e.g., fluorides, chlorides, bromides, and/or iodines) of the alkali metal, the alkaline earth metal, and the rare-earth metal, respectively.

In some embodiments, the alkali metal compound may be selected from alkali metal oxides (such as $Li_2O$, $Cs_2O$, and/or $K_2O$) and alkali metal halides (such as LiF, NaF, CsF, KF, LiI, NaI, CsI, and/or KI). In one embodiment, the alkali metal compound may be selected from LiF, $Li_2O$, NaF, LiI, NaI, CsI, and KI, but is not limited thereto.

The alkaline earth metal compound may be selected from alkaline earth metal compounds, such as BaO, SrO, CaO, $Ba_xSr_{1-x}O$ (wherein 0<x<1), and/or $Ba_xCa_{1-x}O$ (wherein 0<x<1). In one embodiment, the alkaline earth metal compound may be selected from BaO, SrO, and CaO, but is not limited thereto.

The rare-earth metal compound may be selected from $YbF_3$, $ScF_3$, $ScO_3$, $Y_2O_3$, $Ce_2O_3$, $GdF_3$, and $TbF_3$. In one embodiment, the rare-earth metal compound may be selected from $YbF_3$, $ScF_3$, $TbF_3$, $YbI_3$, $ScI_3$, and $TbI_3$, but is not limited thereto.

The alkali metal complex, the alkaline earth metal complex, and the rare-earth metal complex may include an alkali metal ion, and alkaline earth metal ion, and a rare-earth metal ion, respectively, as described above, and ligands respectively coordinated with the metal ion of the alkali metal complex, the alkaline earth metal complex, and the rare-earth metal complex may each independently be selected from a hydroxyquinoline, a hydroxyisoquinoline, a hydroxybenzoquinoline, a hydroxyacridine, a hydroxyphenanthridine, a hydroxyphenyl oxazole, a hydroxyphenyl thiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene, but are not limited thereto.

The electron injection layer may include an alkali metal, an alkaline earth metal, a rare-earth metal, an alkali metal compound, an alkaline earth metal compound, a rare-earth metal compound, an alkali metal complex, an alkaline earth metal complex, an rare-earth metal complex, or a combination thereof, as described above. In one or more embodiments, the electron injection layer may further include an organic material. When the electron injection layer further includes an organic material, an alkali metal, an alkaline earth metal, a rare-earth metal, an alkali metal compound, an alkaline earth metal compound, a rare-earth metal compound, an alkali metal complex, an alkaline earth metal complex, a rare-earth metal complex, or a combination thereof may be homogeneously or non-homogeneously dispersed in a matrix including the organic material.

A thickness of the electron injection layer may be in a range of about 1 Å to about 100 Å, and in some embodiments, about 3 Å to about 90 Å. When the thickness of the electron injection layer is within any of these ranges, the electron injection layer may have satisfactory (or suitable) electron injection characteristics without a substantial increase in driving voltage.

Second Electrode 190

The second electrode 190 may be disposed on the organic layer 150. The second electrode 190 may be a cathode, which is an electron injection electrode, and in this regard, a material for forming the second electrode 190 may be selected from a metal, an alloy, an electrically conductive compound, and a combination thereof, each having a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but is not limited thereto. The second electrode 190 may be a transmissive electrode, a semi-transmissive electrode, or a reflective electrode.

The second electrode 190 may have a single-layered structure, or a multi-layered structure including two or more layers.

Figure 8:
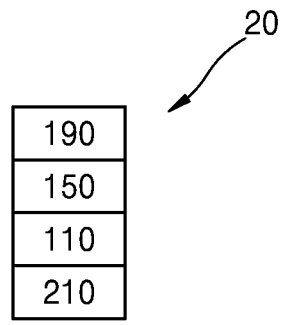
FIG. 8 is a schematic cross-sectional view illustrating a light-emitting device according to an embodiment.
Figure 9:
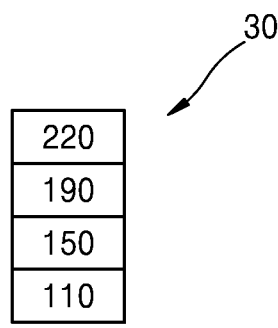
FIG. 9 is a schematic cross-sectional view illustrating a light-emitting device according to an embodiment.
Figure 10:
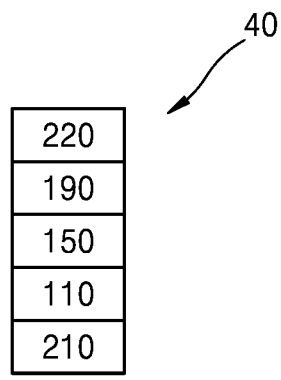
FIG. 10 is a schematic cross-sectional view illustrating a light-emitting device according to an embodiment.

Description of FIGS. 8 to 10

A light-emitting device 20 represented by FIG. 8 includes a first capping layer 210, the first electrode 110, the organic layer 150, and the second electrode 190 sequentially stacked in this stated order. A light-emitting device 30 represented by FIG. 9 includes the first electrode 110, the organic layer 150, the second electrode 190, and a second capping layer 220 sequentially stacked in this stated order. A light-emitting device 40 represented by FIG. 10 includes the first capping layer 210, the first electrode 110, the organic layer 150, the second electrode 190, and the second capping layer 220 sequentially stacked in this stated order.

Regarding FIGS. 8 to 10, descriptions of the first electrode 110, the organic layer 150, and the second electrode 190 may be each independently the same as those provided herein in connection with FIG. 5.

In the light-emitting devices 20 and 40, light emitted from the emission layer in the organic layer 150 may pass through the first electrode 110 (which may be a semi-transmissive electrode or a transmissive electrode) and through the first capping layer 210 to the outside. In the light-emitting devices 30 and 40, light emitted from the emission layer in the organic layer 150 may pass through second electrode 190 (which may be a semi-transmissive electrode or a transmissive electrode) and through the second capping layer 220 to the outside.

The first capping layer 210 and the second capping layer 220 may improve the external luminous efficiency based on the principle of constructive interference.

The first capping layer 210 and the second capping layer 220 may be each independently a capping layer including an organic material, an inorganic capping layer including an inorganic material, or a composite capping layer including an organic material and an inorganic material.

At least one selected from the first capping layer 210 and the second capping layer 220 may include at least one material selected from carbocyclic compounds, heterocyclic compounds, amine-based compounds, porphyrin derivatives, phthalocyanine derivatives, naphthalocyanine derivatives, alkali metal-based complexes, and alkaline earth metal-based complexes. The carbocyclic compound, the heterocyclic compound, and the amine-based compound may each independently be optionally substituted with a substituent containing at least one element selected from O, N, S, selenium (Se), silicon (Si), fluorine (F), chlorine (Cl), bromine (Br), and iodine (I). In one embodiment, at least one selected from the first capping layer 210 and the second capping layer 220 may include an amine-based compound.

In one embodiment, at least one selected from the first capping layer 210 and the second capping layer 220 may include the compound represented by Formula 201 or the compound represented by Formula 202.

In one or more embodiments, at least one selected from the first capping layer 210 and the second capping layer 220 may include a compound selected from Compounds HT28 to HT33 and Compounds CP1 to CP5, but is not limited thereto:

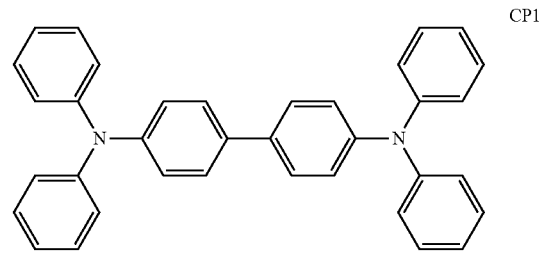

CP1

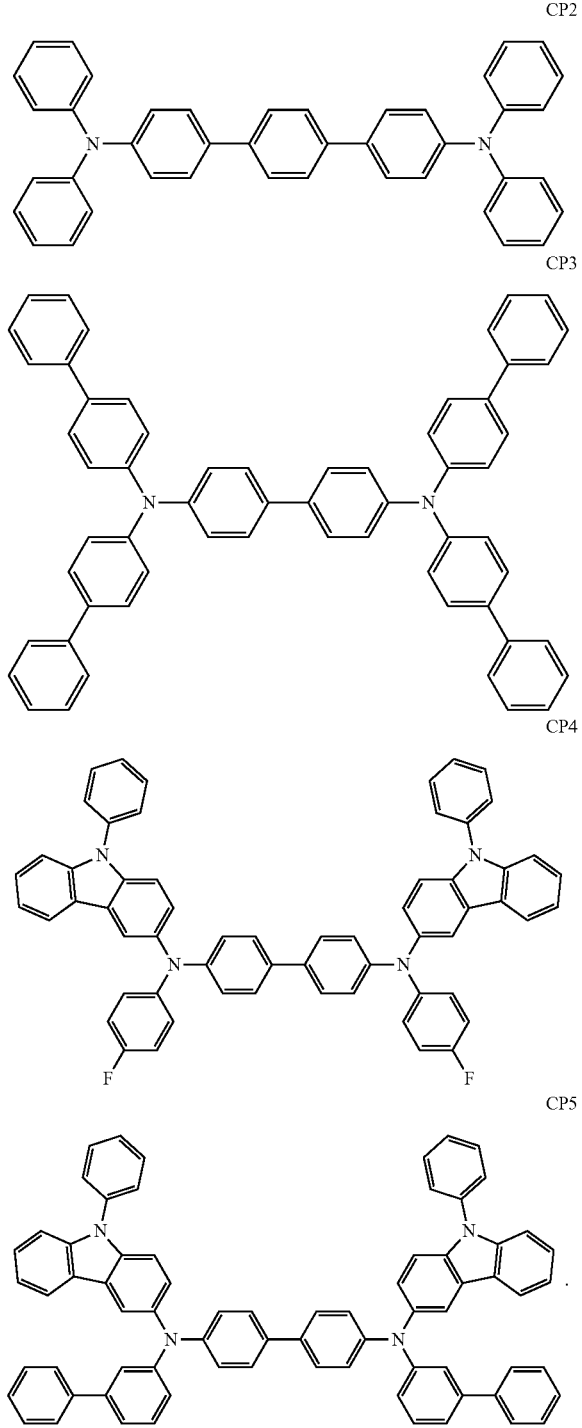

Hereinbefore, the light-emitting device according to an embodiment has been described in connection with FIGS. 5-10. However, embodiments are not limited thereto.

The layers constituting the hole transport region, the emission layer, and the layers constituting the electron transport region may be formed in a specific region using one or more suitable methods such vacuum deposition, spin coating, casting, Langmuir-Blodgett (LB) deposition, ink-jet printing, laser-printing, and/or laser-induced thermal imaging (LITI).

When the layers constituting the hole transport region, the emission layer, and the layers constituting the electron transport region are each independently formed by vacuum deposition, the vacuum deposition may be performed at a deposition temperature of about 100 to about 500° C., at a vacuum degree of about $10^{-8}$ to about $10^{-3}$ torr, and at a deposition rate of about 0.01 to about 100 Å/sec, depending on the compound to be included in each layer and the structure of each layer to be formed.

When the layers constituting the hole transport region, the emission layer, the and layers constituting the electron transport region are each independently formed by spin coating, the spin coating may be performed at a coating rate of about 2,000 revolutions per minute (rpm) to about 5,000 rpm and at a heat treatment temperature of about 80° C. to 200° C., depending on the compound to be included in each layer and the structure of each layer to be formed.

Figure 3:
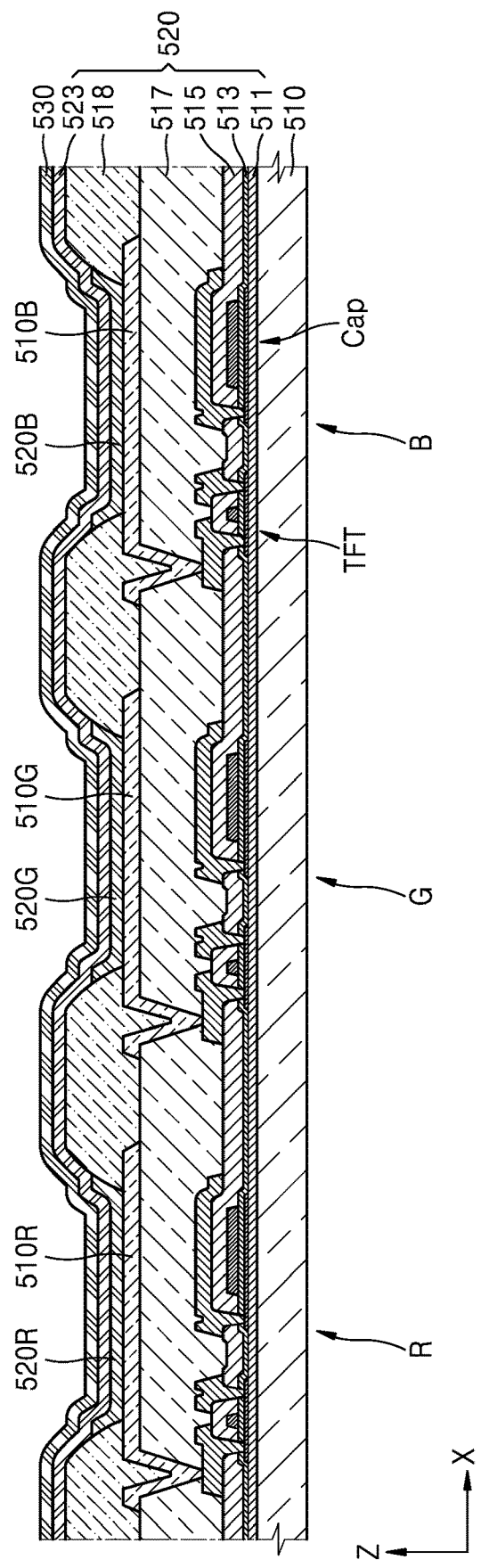
FIG. 3 is a schematic cross-sectional view of a structure of an electronic apparatus according to an embodiment.

FIG. 3 is a schematic cross-sectional view of a structure of an electronic apparatus according to an embodiment.

Referring to FIG. 3, first, a backplane may be formed. Here, the backplane may include at least a portion of a substrate 510, a plurality of first electrodes 510R, 510G, and 510B formed on the substrate 510, and the pixel defined layer 518 formed to expose at least a portion of a plurality of center portions of the plurality of the first electrodes 510R, 510G, 510B. Here, the pixel defined layer 518 may have a protruding shape (in the +z direction) beyond the plurality of the first electrodes 510R, 510G, and 510B, with respect to the substrate 510.

The plurality of the first electrodes 510R, 510G, and 510B may be understood as a plurality of pixel electrodes. Among the plurality of the pixel electrodes, a pixel electrode 510B may be understood as a first pixel electrode, a pixel electrode 510R may be understood as a second pixel electrode, and a pixel electrode 510G may be understood as a third pixel electrode, in consideration that an intermediate layer formed on each of the first to third pixel electrodes may be different from each other. Hereinafter, for convenience, the terms pixel electrodes 510R, 510G, and 510B will be used rather than the terms first, second, and third pixel electrodes. The pixel electrode may be defined the same as the first electrode.

The pixel defined layer 518 of FIG. 3 may have openings corresponding to the respective sub-pixels, and that is, central portions of each of the pixel electrodes 510R, 510G, and 510B, or openings to expose the entire of the pixel electrodes 510R, 510G, and 510B, so as to define a pixel. In addition, the pixel defined layer 518 of FIG. 3 may prevent or reduce the occurrence of arcs at the ends of the pixel electrodes 510R, 510G, and 510B by increasing the distance between the ends of the pixel electrodes 510R, 510G, and 510B and the second electrode above the pixel electrodes 510R, 510G, and 510B.

Such a backplane may further include various other components as needed. For example, as shown in FIG. 3, a thin-film transistor (TFT) or a capacitor (Cap) may be formed on the substrate 510. In addition, the backplane may include a buffer layer 511 formed to prevent impurities from penetrating into a semiconductor layer of a TFT, a gate insulating film 513 for insulating a semiconductor layer of a TFT and a gate electrode, an intermediate insulating layer 515 for insulating a source electrode/drain electrode and a gate electrode of a TFT, a planarization layer 517 having a flat top by covering a TFT, and the like.

As such, following the formation of the backplane, intermediate layers 520R, 520G, and 520B may be formed. The intermediate layers 520R, 520G, and 520B may each have a multi-layered structure including the emission layer. Here, unlike shown in the figure, some of the intermediate layers 520R, 520G, and 520B may serve as common layers that approximately correspond to the entire surface of the substrate 510 while the other intermediate layers 520R, 520G, and 520B may serve as pattern layers that are patterned to correspond to the pixel electrodes 510R, 510G, and 510B.

Following the formation of the intermediate layers 520R, 520G, and 520B, a second electrode 523 may be formed on the intermediate layers 520R, 520G, and 520B.

Although not shown in detail, at least one layer selected from a hole injection layer, a hole transport layer, an emission auxiliary layer, and an electron blocking layer may be included between the emission layer and the first electrode, and at least one layer selected from a buffer layer, a hole blocking layer, an electron transport layer, and an electron injection layer may be included between the emission layer and the second electrode.

In one embodiment, the emission layer may be patterned into a red emission layer, a green emission layer, or a blue emission layer, according to a sub-pixel. In one or more embodiments, the emission layer may have a stacked structure of two or more layers selected from a red emission layer, a green emission layer, and a blue emission layer, in which the two or more layers contact each other or are separated from each other. In one or more embodiments, the emission layer may include two or more materials selected from a red light-emitting material, a green light-emitting material, and a blue light-emitting material, in which the two or more materials are mixed with each other in a single layer to emit white light.

In one embodiment, the emission layer may include an organic material, an inorganic material, or any combination thereof.

Following the formation of the second electrode 523, the plurality of the light-emitting devices 520, each including the pixel electrodes 510R, 510G, and 510B, the intermediate layers 520R, 520G, and 520B, and the second electrode 523, may be covered with the thin film encapsulation portion 530 to protect the plurality of the light-emitting devices from impurities such as external oxygen or moisture.

Each of the plurality of the PAs may be provided with at least one light-emitting device, but embodiments of the present disclosure are not limited thereto. For example, one PA may be provided with at least two light-emitting devices that are stacked each other.

The plurality of the light-emitting devices (for example, at least two light-emitting devices) may each independently emit light having a different wavelength, or
the plurality of the light-emitting devices may include a first light-emitting device and a second light-emitting device, wherein the second light-emitting device absorbs incident light from the first light-emitting device, thereby emitting light having a different wavelength from that of the incident light.

Here, the second light-emitting device may be a light-emitting device including the quantum confined semiconductor nanoparticle or the perovskite compound, but embodiments of the present disclosure are not limited thereto.

The thin film encapsulation portion 530 may extend to cover not only the top surface of the light-emitting device, but also the side surfaces of the light-emitting device, so as to be in contact with a portion of the substrate 500. Accordingly, the penetration of external oxygen and moisture into the light-emitting device 520 may be effectively prevented.

The thin film encapsulation portion 530 may include the organic film including the cured product of the composition for forming the organic film, the composition including at least one UV-absorbing unit represented by one selected from Formulae 11-1 to 11-4.

The electronic apparatus according to an embodiment may be, for example, an organic light-emitting display apparatus including the organic light-emitting device. Such an organic light-emitting display apparatus may include a plurality of the organic light-emitting devices. Therefore, according to an embodiment, an organic light-emitting display device includes: a substrate, an organic light-emitting unit including a plurality of organic light-emitting devices on the substrate; and a thin film encapsulation portion on the organic light-emitting unit sealing the organic light-emitting unit, wherein the thin film encapsulation portion 530 includes a curable material and an UV absorber. The curable material and the UV absorber may respectively be defined the same as described above.

The pixel defined layer may define a plurality of pixel areas and a plurality of non-pixel areas on the substrate.

According to an aspect of the present disclosure, there is provided a method of preparing an electronic apparatus, the method including:
providing a substrate with a pixel defined unit defining a pixel area and a non-pixel area;
providing the pixel area with a light-emitting device; and
providing a thin film encapsulation portion including an organic film and sealing the light-emitting device and the pixel defined unit at the same time,
wherein the providing of the thin film encapsulation portion includes forming the organic film by providing and curing a thin-film sealing composition, so as to cover the light-emitting device and the pixel defined unit at the same time,
wherein the thin-film sealing composition includes at least one UV absorber.

The substrate may be any substrate commonly used in an organic light-emitting display device, and may be an inorganic substrate or an organic substrate, each having excellent mechanical strength, thermal stability, transparency, surface smoothness, ease of handling, and water resistance.

For example, the substrate may be an inorganic substrate made of a transparent glass material containing $SiO_2$ as a main component, but embodiments of the present disclosure are not limited thereto.

For example, may be an organic substrate having an insulating property. An organic material having an insulating property may be, for example, selected from PES, PAR, PEI, PEN, PET, PPS, polyallylate, polyimide, PC, TAC, and CAP, but embodiments of the present disclosure are not limited thereto.

The providing of the substrate with the pixel defined unit defining a pixel area and a non-pixel area may be performed by a photolithography method.

For example, the pixel defined unit may be formed by coating the substrate with a photosensitive material, optionally exposing a pixel area to light by using a photomask exposing a pixel area, and removing the pixel area.

The providing of the thin film encapsulation portion including the organic film may include irradiating light having a wavelength between about 360 nm and about 470 nm. Here, the light may have an exposure amount of about 3,000 mJ, for example, about 1,000 mJ.

According to another aspect of the present disclosure, there is provided a method of preparing an electronic apparatus, the method including:

forming an organic light-emitting device on a substrate, the organic light-emitting device including an emission layer; and forming a thin film encapsulation portion sealing the organic light-emitting device formed on the substrate, the thin film encapsulation portion including an organic film, wherein the forming of the thin film encapsulation portion includes forming the organic film by providing and curing a composition for forming an organic film, so as to cover the organic light-emitting device, the emission layer includes an organometallic compound, the composition for forming the organic film includes a cured product thereof including a curable material and an UV absorber, and the curable material includes a (meth)acrylate compound.

In one embodiment, the forming of the organic film may include irradiating light having a maximum emission wavelength range between about 360 nm and about 470 nm.

The thin film encapsulation portion, the organic light-emitting device, the organometallic compound, the curable material, the UV absorber, and the organic film may respectively be defined the same as described above.

When an electronic apparatus is prepared according to the method described above, UV light entering from the outside may reach the organic light-emitting device, and accordingly, the deterioration of the organometallic compound included in the emission layer may be blocked, thereby preventing damages that may be caused by continuous exposure of the organic light-emitting device to UV light. Accordingly, the organic light-emitting device and the electronic apparatus including the same may have improved durability.

Figure 4:
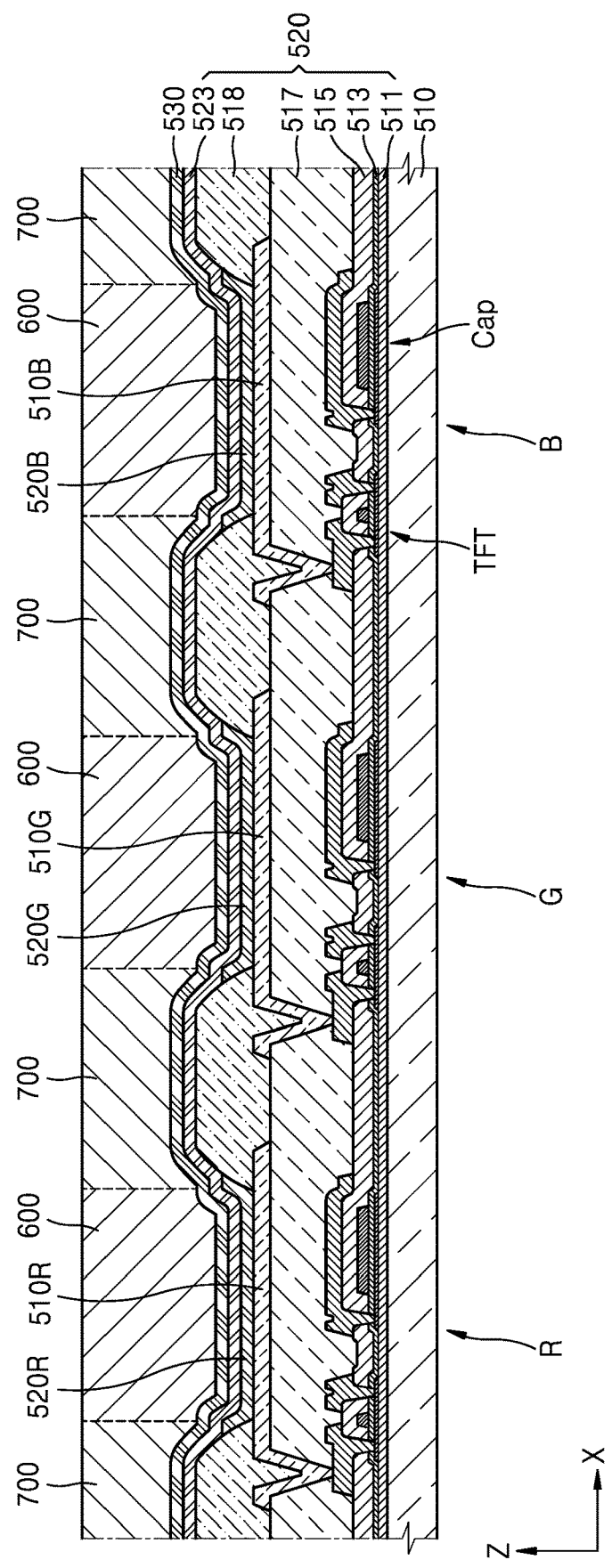
FIG. 4 is a schematic cross-sectional view of a structure of an electronic apparatus according to an embodiment.

FIG. 4 is a schematic cross-sectional view of a structure of an electronic apparatus according to an embodiment.

The electronic apparatus of FIG. 4 is the same electronic apparatus as that of the electronic apparatus of FIG. 3, except that the light blocking pattern 700 and a color conversion layer 600 are additionally disposed on the thin film encapsulation portion 530. The color conversion layer 600 includes at least one quantum dot(s).

Quantum Dot in Color Conversion Layer

The color conversion layer includes at least one quantum dot(s).

The quantum dot is a spherical semiconductor nanomaterial having the size of about several to several hundreds of nm and may include a core formed of a material having a small band gap and a shell disposed to surround the core.

In one or more exemplary embodiments, the quantum dot may have a single structure including a uniform concentration of each element included in the quantum dot or a core-shell structure including a core including a first semiconductor having a crystal structure and a shell including a second semiconductor having a crystal structure, or may be a Perovskite compound.

In one or more exemplary embodiments, the quantum dot, the first semiconductor and the second semiconductor may each independently include Group 12-Group 16-based compounds, Group 13-Group 15-based compounds, Group 13-Group 16-based compounds, Group 14-Group 16-based compounds, Group 14-based compounds, Group 11-Group 13-Group 16-based compounds, Group 11-Group 12-Group 13-Group 16-based compounds, and any combination thereof.

For example, the quantum dot, the first semiconductor and the second semiconductor may each independently include CdS, CdSe, CdTe, ZnS, ZnSe, ZnTe, ZnO, HgS, HgSe, HgTe, MgS, MgSe; CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe MgZnS, and MgZnSe; CdZnSeS, CdZnSeTe, CdZnSTe, CdHgSeS, CdHgSeTe, CdHgSTe, HgZnSeS, HgZnSeTe, and HgZnSTe;

GaN, GaP, GaAs, GaSb, AlN, AlP, AlAs, AlSb, InN, InP, InAs, InSb; GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP; GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb; InZnP;

SnS, SnSe, SnTe, PbS, PbSe, and PbTe; SnSeS, SnSeTe, SnSTe, PbSeS, PbSeTe, PbSTe, SnPbS, SnPbSe, and SnPbTe; SnPbSSe, SnPbSeTe, and SnPbSTe;

Si, Ge, SiC, and SiGe;

AgInS, $AgInS_2$, CuInS, $CuInS_2$, $CuGaO_2$, $AgGaO_2$, and $AgAlO_2$; and any combination thereof.

For example, the quantum dot, the first semiconductor may include GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any combination thereof, and the second semiconductor may include CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe MgZnS, MgZnSe, CdZnSeS, CdZnSeTe, CdZnSTe, CdHgSeS, CdHgSeTe, CdHgSTe, HgZnSeS, HgZnSeTe, HgZnSTe, and any combination thereof.

The Perovskite compound is a material having a three-dimensional crystal structure related to a crystal structure of $CaTiO_3$.

For example, the Perovskite compound may be represented by Formula 4:

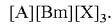

[A][Bm][X]$_3$.  Formula 4

In Formula 4,

A may be at least one monovalent organic-cation, a monovalent inorganic-cation, or any combination thereof, B may be at least one divalent inorganic-cation, m may a real number satisfying 0<m≤1, and X may be at least one monovalent anion.

An average particle diameter (D50) of the quantum dot may be in a range of about 1 to about 10 nm.

General Definition of Substituents

The term "$C_1$-$C_{60}$ alkyl group" as used herein may refer to a linear or branched aliphatic hydrocarbon monovalent group having 1 to 60 carbon atoms. Non-limiting examples thereof may include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein may refer to a divalent group having the same structure as the $C_1$-$C_{60}$ alkyl group.

The term "$C_2$-$C_{60}$ alkenyl group" as used herein may refer to a hydrocarbon group having at least one carbon-carbon double bond at one or more positions along the hydrocarbon chain of the $C_2$-$C_{60}$ alkyl group (e.g., in the middle and/or at either terminus of the $C_2$-$C_{60}$ alkyl group). Non-limiting examples thereof may include an ethenyl group, a propenyl group, and a butenyl group. The term "$C_2$-$C_{60}$ alkenylene group" as used herein may refer to a divalent group having the same structure as the $C_2$-$C_{60}$ alkenyl group.

The term "$C_2$-$C_{60}$ alkynyl group" as used herein may refer to a hydrocarbon group having at least one carbon-carbon triple bond at one or more positions along the hydrocarbon chain of the $C_2$-$C_{60}$ alkyl group (e.g., in the middle and/or at either terminus of the $C_2$-$C_{60}$ alkyl group). Non-limiting examples thereof may include an ethynyl group and a propynyl group. The term "$C_2$-$C_{60}$ alkynylene group" as used herein may refer to a divalent group having the same structure as the $C_2$-$C_{60}$ alkynyl group.

The term "$C_1$-$C_{60}$ alkoxy group" as used herein may refer to a monovalent group represented by —$OA_{101}$ (where $A_{101}$ is the $C_1$-$C_{60}$ alkyl group). Non-limiting examples thereof may include a methoxy group, an ethoxy group, and an isopropyloxy group.

The term "$C_3$-$C_{10}$ cycloalkyl group" as used herein may refer to a monovalent saturated hydrocarbon monocyclic group including 3 to 10 carbon atoms. Non-limiting examples thereof may include a cyclopropyl group, a cyclobutyl group, a cyclopentyl group, a cyclohexyl group, and a cycloheptyl group. The term "$C_3$-$C_{10}$ cycloalkylene group" as used herein may refer to a divalent group having the same structure as the $C_3$-$C_{10}$ cycloalkyl group.

The term "$C_1$-$C_{10}$ heterocycloalkyl group" as used herein may refer to a monovalent monocyclic group including at least one heteroatom selected from N, O, Si, P, and S as a ring-forming atom and 1 to 10 carbon atoms. Non-limiting examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein may refer to a divalent group having the same structure as the $C_1$-$C_{10}$ heterocycloalkyl group.

The term "$C_3$-$C_{10}$ cycloalkenyl group" as used herein may refer to a monovalent monocyclic group that has 3 to 10 carbon atoms and at least one double bond in its ring, and is not aromatic. Non-limiting examples thereof may include a cyclopentenyl group, a cyclohexenyl group, and a cycloheptenyl group. The term "$C_3$-$C_{10}$ cycloalkenylene group" as used herein may refer to a divalent group having the same structure as the $C_3$-$C_{10}$ cycloalkenyl group.

The term "$C_1$-$C_{10}$ heterocycloalkenyl group" as used herein may refer to a monovalent monocyclic group including at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group" as used herein may refer to a divalent group having the same structure as the $C_1$-$C_{10}$ heterocycloalkyl group.

The term "$C_6$-$C_{60}$ aryl group" as used herein may refer to an aromatic monovalent group having 6 to 60 carbon atoms. The term "$C_6$-$C_{60}$ arylene group" as used herein may refer to an aromatic divalent group having 6 to 60 carbon atoms. Non-limiting examples of the $C_6$-$C_{60}$ aryl group may include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include a plurality of rings, the respective rings may be fused to each other.

The term "$C_1$-$C_{60}$ heteroaryl group" as used herein may refer to a monovalent group having a heterocyclic aromatic system that has at least one heteroatom selected from N, O, Si, P, and S as a ring-forming atom and 1 to 60 carbon atoms. The term "$C_1$-$C_{60}$ heteroarylene group" as used herein may refer to a divalent group having a heterocyclic aromatic system including at least one heteroatom selected from N, O, Si, P, and S as a ring-forming atom and 1 to 60 carbon atoms. Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include a plurality of rings, the respective rings may be fused to each other.

The term "$C_6$-$C_{60}$ aryloxy group" as used herein may refer to a group represented by —$OA_{102}$ (where $A_{102}$ is the $C_6$-$C_{60}$ aryl group). The term "$C_6$-$C_{60}$ arylthio group" as used herein may refer to a group represented by —$SA_{103}$ (where $A_{103}$ is the $C_6$-$C_{60}$ aryl group).

The term "monovalent non-aromatic condensed polycyclic group" as used herein may refer to a monovalent group that has a plurality of rings condensed (e.g., fused) to each other, and has only carbon atoms (e.g., 8 to 60 carbon atoms) as ring forming atoms, wherein the molecular structure as a whole is non-aromatic (e.g., does not have overall aromaticity). A non-limiting example of the monovalent non-aromatic condensed polycyclic group may be a fluorenyl group. The term "divalent non-aromatic condensed polycyclic group" as used herein may refer to a divalent group having the same structure as the monovalent non-aromatic condensed polycyclic group.

The term "monovalent non-aromatic condensed heteropolycyclic group" as used herein may refer to a monovalent group that has two or more rings condensed (e.g., fused) with each other, and has at least one heteroatom selected from N, O, Si, P, and S as a ring-forming atom, other than carbon atoms (e.g., 1 to 60 carbon atoms), wherein the molecular structure as a whole is non-aromatic (e.g., does not have overall aromaticity). A non-limiting example of the monovalent non-aromatic condensed heteropolycyclic group may be a carbazolyl group. The term "divalent non-aromatic condensed heteropolycyclic group" as used herein may refer to a divalent group having the same structure as the monovalent non-aromatic condensed heteropolycyclic group.

The term "$C_5$-$C_{60}$ carbocyclic group" as used herein may refer to a monocyclic or polycyclic group having 5 to 60 carbon atoms only as ring-forming atoms. The term "$C_5$-$C_{60}$ carbocyclic group" as used herein may refer to an aromatic carbocyclic group or a non-aromatic carbocyclic group. The term "$C_5$-$C_{60}$ carbocyclic group" as used herein may refer to a ring (such as a benzene group), a monovalent group (such as a phenyl group), or a divalent group (such as a phenylene group). In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein may refer to a group having the same structure as a $C_1$-$C_{60}$ carbocyclic group, except that as a ring-forming atom, at least one heteroatom selected from N, O, Si, P, and S is used in addition to carbon atoms (e.g., 1 to 60 carbon atoms).

In the present specification, at least one of substituents of the substituted $C_5$-$C_{60}$ carbocyclic group, substituted $C_1$-$C_{60}$ heterocyclic group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from the group consisting of:
  deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;
  a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_6o$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);
  a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;
  a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_6o$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and
  Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$),
  wherein $Q_{11}$ to $Q_{13}$, $Q_{21}$ to $Q_{23}$, and $Q_{31}$ to $Q_{33}$ may be each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The term "Ph" as used herein may refer to a phenyl group. The term "Me" as used herein may refer to a methyl group. The term "Et" as used herein may refer to an ethyl group. The term "ter-Bu" or "But" as used herein may refer to a tert-butyl group. The term "OMe" as used herein may refer to a methoxy group, and "D" may refer to deuterium.

The term "biphenyl group" as used herein may refer to a phenyl group substituted with a phenyl group. The "biphenyl group" may be a substituted phenyl group having a $C_6$-$C_{60}$ aryl group as a substituent.

The term "terphenyl group" as used herein may refer to a phenyl group substituted with a biphenyl group. The "terphenyl group" may be a substituted phenyl group having a $C_6$-$C_{60}$ aryl group substituted with a $C_6$-$C_{60}$ aryl group as a substituent.

The symbols * and *' as used herein, unless defined otherwise, refer to a binding site to an adjacent atom in a corresponding formula.

Hereinafter a compound and a light-emitting device according to one or more embodiments will be described in more detail with reference to Synthesis Examples and Examples. The expression "B was used instead of A" used in describing Synthesis Examples may refer to a molar equivalent of A being identical to a molar equivalent of B.

EXAMPLES

Example 1

As a substrate and an anode, a Corning 15 Ohms per square centimeter (Ω/cm$^2$) (150 Å) ITO glass substrate was cut to a size of 50 millimeters (mm)×50 mm×0.7 mm, sonicated by using isopropyl alcohol and deionized water for 5 minutes, respectively, and cleaned by exposure to ultraviolet rays with ozone. Then, the glass substrate was mounted on a vacuum deposition device.

TATC (100 Å), HAT-CN (50 Å), and NPB (100 Å) were sequentially deposited on the ITO anode to form a hole transport region.

HTL1 (100 Å) was deposited on the hole transport region to form a lower auxiliary layer, AND (ADN) and DPAVBi (the amount of DPAVBi was 5 percent by weight (wt %)) were co-deposited at a total thickness of 200 Å to form an emission layer, and Alq (50 Å) was deposited on the emission layer to form an upper auxiliary layer, to thereby form a first emission unit.

Compound 1 and Yb (the amount of Yb was 2 wt %) were co-deposited on the first emission unit at a total thickness of 150 Å to form an n-type charge generating layer, and HAT-CN (100 Å) was deposited on the n-type charge generating layer to form a p-type charge generating layer, to thereby form a first charge generating layer.

HTL1 (200 Å) was deposited on the first charge generating layer to form a lower auxiliary layer, CBP and (BT)$_2$Ir(acac) (the amount of (BT)$_2$Ir(acac) was 15 wt %) were co-deposited on the lower auxiliary layer at a total thickness of 200 Å to form an emission layer, and Alq (50 Å) was deposited on the emission layer to form an upper auxiliary layer, to thereby form a second emission unit.

Compound 1 and Yb (the amount of Yb was 2 wt %) were co-deposited on the second emission unit at a total thickness of 150 Å to form an n-type charge generating layer, and HAT-CN (100 Å) was deposited on the n-type charge generating layer to form a p-type charge generating layer, to thereby form a second charge generating layer.

NPB (100 Å) and HTL1 (100 Å) were sequentially deposited on the second charge generating layer to form a lower auxiliary layer, and AND (ADN) and DPAVBi (the amount of DPAVBi was 5 wt %) were co-deposited on the lower auxiliary layer at a total thickness of 200 Å to form an emission layer, to thereby form a third emission unit.

Alq (50 Å) was deposited on the third emission unit to form a first electron transport layer, Compound 1 and Yb (the amount of Yb was 2 wt %) were co-deposited on the first electron transport layer at a total thickness of 200 Å to form a second electron transport layer, and LiF (15 Å) was deposited on the second electron transport layer to form an electron injection layer, to thereby form an electron transport region.

Al (100 Å) was deposited on the electron transport region to form a cathode, thereby completing the manufacture of a light-emitting device.

Examples 2 and 3 and Comparative Example 1

Light-emitting devices were manufactured in the same (or substantially the same) manner as in Example 1, except that the materials shown in Table 1 were used in the n-type charge generating layer and in the second electron transport layer.

Evaluation Example 1

The driving voltage (V), efficiency (cd/A), and lifespan (T97) of the light-emitting devices manufactured in Examples 1 to 3 and Comparative Example 1 were measured by using Keithley source-measure unit (SMU) 236 and a luminance meter PR650. The results thereof are shown in Table 1.

Referring to Table 1, it was found that the light-emitting devices of Examples 1 to 3 had a low driving voltage, high efficiency, and/or long lifespan, as compared with the light-emitting devices of Comparative Example 1.

Example 4

As a substrate and an anode, a Corning 15 Ω/cm² (150 Å) ITO glass substrate was cut to a size of 50 mm×50 mm×0.7 mm, sonicated by using isopropyl alcohol and deionized water for 5 minutes, respectively, and cleaned by exposure to ultraviolet rays with ozone. Then, the glass substrate was mounted on a vacuum deposition device.

TATC (100 Å), HAT-CN (50 Å), and NPB (100 Å) were sequentially deposited on the ITO anode to form a hole transport region.

HTL1 (200 Å) was deposited on the hole transport region to form a lower auxiliary layer, CBP and $(BT)_2Ir(acac)$ (the amount of $(BT)_2Ir(acac)$ was 15 wt %) were co-deposited on the lower auxiliary layer at a total thickness of 200 Å to form an emission layer, and Alq (50 Å) was deposited on the emission layer to form an upper auxiliary layer, to thereby form a first emission unit.

Compound 1 and Yb (the amount of Yb was 2 wt %) were co-deposited on the first emission unit at a total thickness of 150 Å to form an n-type charge generating layer, and HAT-CN (100 Å) was deposited on the n-type charge generating layer to form a p-type charge generating layer, to thereby form a charge generating layer.

NPB (100 Å) and HTL1 (100 Å) were sequentially deposited on the charge generating layer to form a lower auxiliary layer, and AND (ADN) and DPAVBi (the amount of DPAVBi was 5 wt %) were co-deposited on the lower auxiliary layer at a total thickness of 200 Å to form an emission layer, to thereby form a second emission unit.

Alq (50 Å) was deposited on the second emission unit to form a first electron transport layer, Compound 4 was deposited on the first electron transport layer at a thickness of 200 Å to form a second electron transport layer, and LiF (15 Å) was deposited on the second electron transport layer to form an electron injection layer, to thereby form an electron transport region.

Al (100 Å) was deposited on the electron transport region to form a cathode, thereby completing the manufacture of a light-emitting device.

TABLE 1

|  | n-type charge generating layer for the first charge generating layer (weight ratio) | n-type charge generating layer for the second charge generating layer (weight ratio) | Second electron transport layer (weight ratio) | Driving voltage (V) | Efficiency (cd/A) | Lifespan (T97) |
|---|---|---|---|---|---|---|
| Example 1 | Comound 1:Yb (100:2) | Compound 1:Yb (100:2) | Compound 1:Yb (100:2) | 14 | 36 | 77 |
| Example 2 | Compound 1:Yb (100:2) | Compound 1:Yb (100:2) | Liq:Compound 3 (1:1) | 14.5 | 34 | 80 |
| Example 3 | Compound 4:Yb (100:2) | Compound 4:Yb (100:2) | Compound 14 | 14.3 | 34 | 78 |
| Comparative Example 1 | Compound 1:Li (100:2) | Compound 1:Li (100:2) | Compound 1:Li (100:2) | 15 | 35 | 60 |

Examples 5 and 6 and Comparative Example 2

Light-emitting devices were manufactured in the same (or substantially the same) manner as in Example 2, except that the materials shown in Table 2 were used in the n-type charge generating layer and in the second electron transport layer.

Example 7

A light-emitting device was manufactured in the same (or substantially the same) manner as in Example 4, except that, in forming a first emission unit, HTL1 (200 Å) was deposited to form a lower auxiliary layer, CBP and (piq)$_2$Ir(acac) (the amount of (piq)$_2$Ir(acac) was 1 wt %) were co-deposited on the lower auxiliary layer at a total thickness of 100 Å, and then CBP and Ir(ppy)$_3$ (the amount of Ir(ppy)$_3$ was 7 wt %) were co-deposited at a total thickness of 200 Å to form an emission layer, and mCBP (50 Å) was deposited on the emission layer to form an upper auxiliary layer.

Examples 8 and 9 and Comparative Examples 3 and 4

Light-emitting devices were manufactured in the same (or substantially the same) manner as in Example 7, except that the materials shown in Table 2 were used in the n-type charge generating layer and in the second electron transport layer.

Example 10

A light-emitting device was manufactured in the same (or substantially the same) manner as in Example 4, except that, in forming a hole transport region, m-TDATA and F4-TCNQ (the amount of F4-TCNQ was 3 wt %) were co-deposited on the ITO anode at a total thickness of about 150 Å, and then NPB was deposited thereon at a thickness of 200 Å, instead of sequentially depositing TATC (100 Å), HAT-CN (50 Å), and NPB (100 Å) on the ITO anode.

Comparative Example 5

A light-emitting device was manufactured in the same (or substantially the same) manner as in Example 10, except that the materials shown in Table 2 were used in the n-type charge generating layer and in the second electron transport layer.

Evaluation Example 2

The driving voltage (V), efficiency (cd/A), and lifespan (T97) of the light-emitting devices manufactured in Examples 4 to 10 and Comparative Examples 2 to 5 were measured by using Keithley source-measure unit (SM U) 236 and a luminance meter PR650. The results thereof are shown in Table 2.

TABLE 2

|  | n-type charge generating layer (weight ratio) | Second electron transport layer (weight ratio) | Driving voltage (V) | Efficiency (cd/A) | Lifespan (T97) |
|---|---|---|---|---|---|
| Example 4 | Compound 1:Yb (100:2) | Compound 4 | 11 | 29.5 | 61 |
| Example 5 | Compound 2:Yb (100:2) | Alq$_3$:Compound 3 (1:1) | 10 | 31 | 65 |
| Example 6 | Compound 4:Yb (100:2) | Liq:Compound 16 (1:1) | 11 | 30 | 67 |
| Comparative Example 2 | Compound 1:Li (100:2) | Compound 1:Li (100:2) | 11 | 30 | 45 |
| Example 7 | Compound 1:Yb (100:2) | Compound 4 | 9.5 | 33 | 66 |
| Example 8 | Compound 16:Yb (100:2) | Compound 14 | 10 | 31 | 70 |
| Example 9 | Compound 3:Liq (1:1) | Compound 3:Li (100:2) | 11.5 | 30 | 40 |
| Comparative Example 3 | Alq$_3$:Li (100:2) | Compound 3:Li (100:2) | 12 | 29 | 35 |
| Comparative Example 4 | Compound 1:Li (100:2) | Compound 1:Li (100:2) | 10 | 32 | 51 |
| Example 10 | Compound 1:Yb (100:2) | Compound 4 | 9.3 | 34 | 65 |
| Comparative Example 5 | Compound 1:Li (100:2) | Compoun 1:Li (100:2) | 9.5 | 32 | 40 |

Referring to Table 2, it was found that the light-emitting devices of Examples 4 to 10 had a low driving voltage, high efficiency, and/or long lifespan, as compared with the light-emitting devices of respective Comparative Examples 2 to 5.
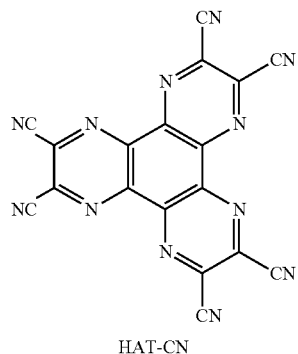
HAT-CN
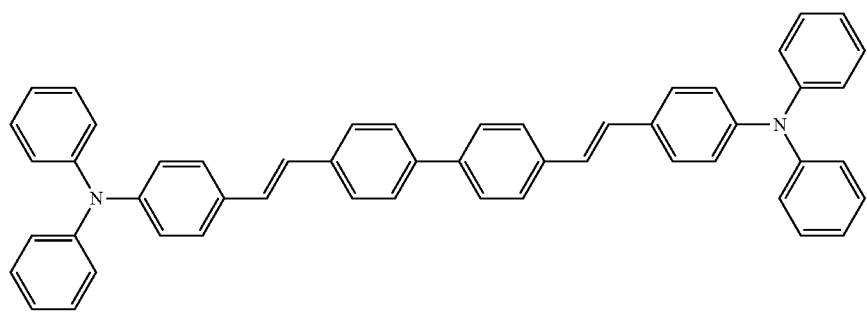
DPAVBi
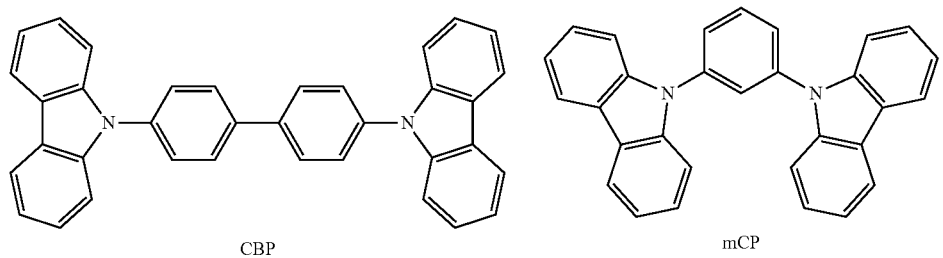
CBP                mCP
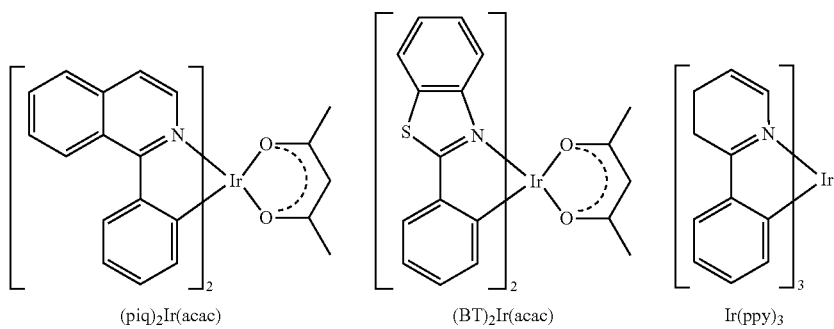
(piq)$_2$Ir(acac)     (BT)$_2$Ir(acac)     Ir(ppy)$_3$ -continued
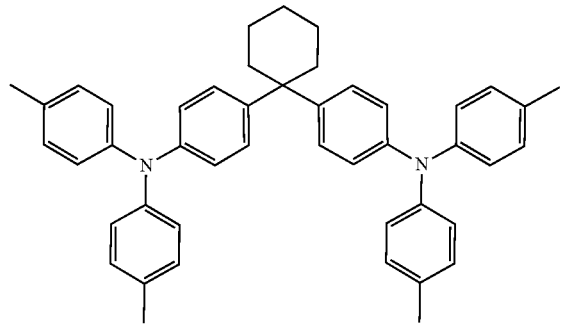
TAPC
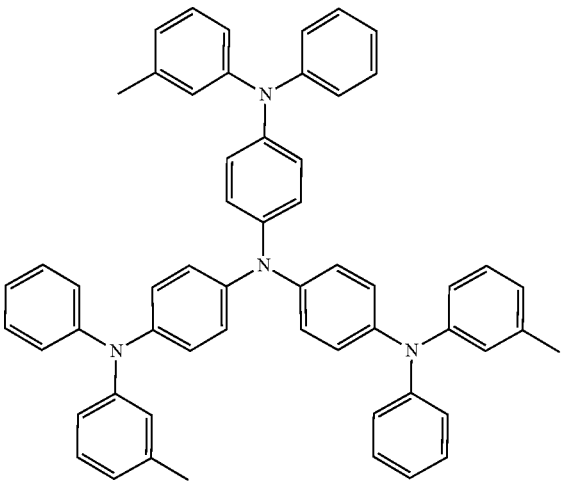
m-TDATA
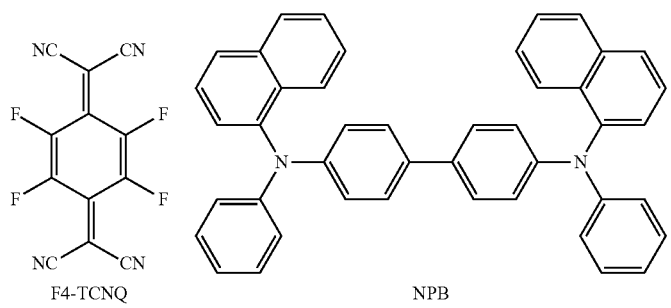
F4-TCNQ          NPB
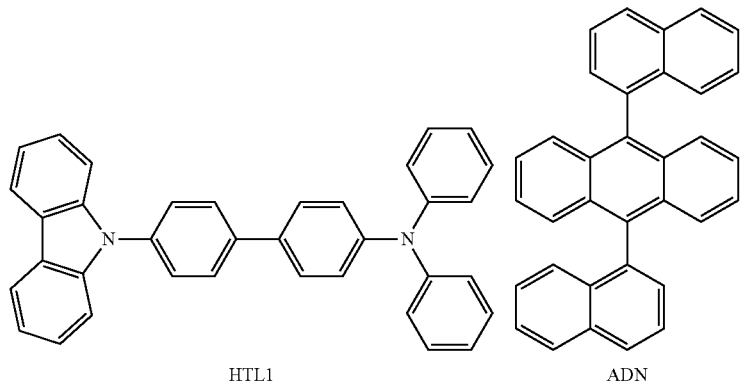
HTL1          ADN
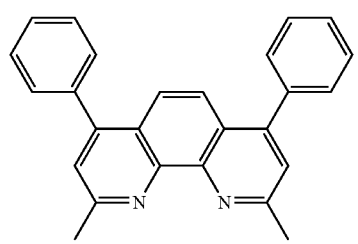
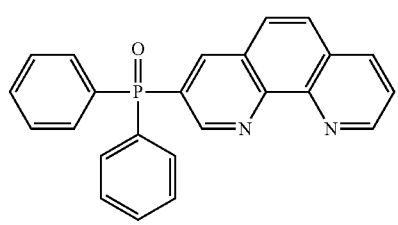

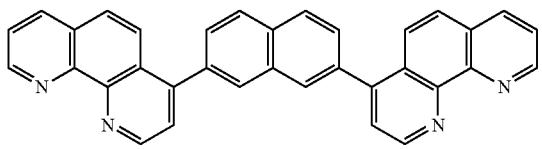

4

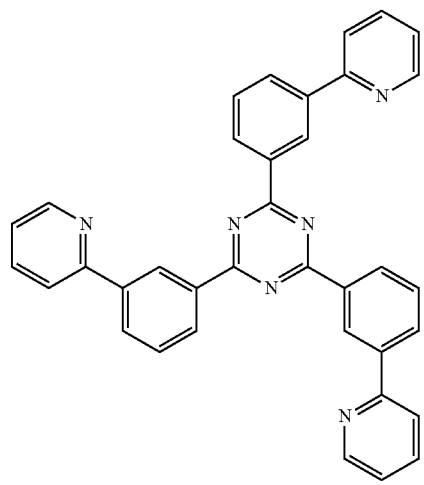

14

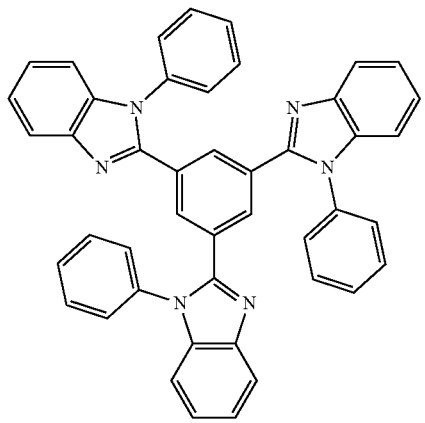

16

As described above, the light-emitting device according to embodiments of the present invention may have a low-driving voltage, improved efficiency, and long lifespan.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

It will be understood that when an element such as a layer, film, region, or substrate is referred to as being "on" or "over" another element, it can be directly on the other element or intervening elements may also be present. In contrast, when an element is referred to as being "directly on" or "directly contacting" another element, there are no intervening elements present.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims and equivalents thereof.

What is claimed is:

1. An electronic apparatus comprising:
a substrate;
a light-emitting device disposed on the substrate; and
a thin film encapsulation portion sealing the light-emitting device and comprising at least one organic film,
wherein the organic film comprises a cured product of a composition for forming an organic film, the composition comprising a curable material and an ultraviolet (UV) absorber, and the light emitting device comprising:
a first electrode;
a second electrode facing the first electrode;
m emission units stacked between the first electrode and the second electrode; and
m−1 charge generating layer(s) between each of the two adjacent emission units from among the m emission units, m−1 charge generating layer(s) comprising m−1 n-type charge generating layer(s) and m−1 p-type charge generating layer(s),
wherein m is an integer of 2 or greater,
a maximum emission wavelength of light emitted from at least one of the m emission units differs from that of light emitted from at least one of the other emission units,
at least one of the m−1 n-type charge generating layer(s) comprises a metal-containing material and an electron transporting metal-non-containing material,
the metal-containing material comprised in the m−1 n-type charge generating layer(s) comprises a metal, a metal complex, or a combination thereof,
the metal comprised in the m−1 n-type charge generating layer(s) comprises lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu), or a combination thereof, and
the metal complex comprised in the m−1 n-type charge generating layer(s) comprises an alkali metal, an alkaline earth metal, a rare-earth metal, a transition metal, a late transition metal, or a combination thereof, and at least one organic ligand selected from a hydroxyquinoline, a hydroxyisoquinoline, a hydroxy benzoquinoline, a hydroxyacridine, a hydroxyphenanthridine, a hydroxyphenyl oxazole, a hydroxyphenyl thiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene, and
the light emitting device further comprises:
an electron transport layer between the second electrode and an emission unit adjacent to the second electrode from among the m emission units,
wherein the electron transport layer comprises a metal-containing material and an electron transporting metal-non-containing material,
the metal-containing material comprised in the electron transport layer comprises a metal, a metal complex, or a combination thereof,
the metal comprised in the electron transport layer comprises an alkali metal, an alkaline earth metal, a rare-earth metal, a transition metal, a late transition metal, or a combination thereof,
the metal complex comprised in the electron transport layer comprises an alkali metal, an alkaline earth metal, a rare-earth metal, a transition metal, a late transition metal, or a combination thereof, and
the electron transporting metal-non-containing material is an organic compound comprising at least one selected from a phenanthroline ring, an imidazole ring, a pyridine ring, a pyrazine ring, a pyrimidine ring, a pyridazine ring, and a triazine ring, and
the electron transporting metal-non-containing material comprised in the electron transport layer does not include the following compounds:

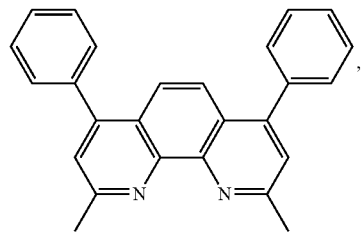 [SMILES: Cc1cc(-c2ccccc2)c2ccc3c(-c4ccccc4)cc(C)nc3c2n1]

wherein the metal-containing material comprised in the at least one of the m−1 n-type charge generating layer(s) differs from the metal-containing material comprised in the electron transport layer;
the electron transporting metal-non-containing material comprised in the at least one of the m−1 n-type charge generating layer(s) differs from the electron transporting metal-non-containing material comprised in the electron transport layer; or
the metal-containing material comprised in the at least one of the m−1 n-type charge generating layer(s) differs from the metal-containing material comprised in the electron transport layer, and the electron transporting metal-non-containing material comprised in the at least one of the m−1 n-type charge generating layer(s) differs from the electron transporting metal-non-containing material comprised in the electron transport layer; and
at least one of the m−1 n-type charge generating layer(s) and the electron transport layer does not include a metal complex comprising lithium(Li).

2. The electronic apparatus of claim 1, further comprising a pixel defined layer defining a plurality of pixel areas and a plurality of non-pixel areas on the substrate, and
wherein the light-emitting device is arranged on the substrate to be surrounded by the pixel defined layer.

3. The electronic apparatus of claim 2, wherein
the thin film encapsulation portion further comprises at least one inorganic film, and
the thin film encapsulation portion comprises a sealing unit in which the organic film and the inorganic film are stacked, in the number of n, n being an integer of 1 or more.

4. The electronic apparatus of claim 3, wherein the inorganic film comprises at least one selected from a metal, a metal halide, a metal nitride, a metal oxide, a metal oxynitride, a silicon nitride, a silicon oxide, and a silicon oxynitride.

5. The electronic apparatus of claim 3, wherein the thin film encapsulation portion further comprises one of a lower inorganic film and a lower organic film that are disposed between the pixel defined layer and the sealing unit, or between the light-emitting device and the sealing unit.

6. The electronic apparatus of claim 3, wherein at least one of a capping layer and a protection layer is further arranged between the pixel defined layer and the sealing unit, or between the light-emitting device and the sealing unit.

7. The electronic apparatus of claim 1, wherein the curable material comprises an acrylate-based material, an epoxy compound-based material or a combination thereof.

8. The electronic apparatus of claim 1, wherein the UV absorber comprises an UV-absorbing compound,
wherein the UV-absorbing compound comprises at least one UV absorbing unit represented by one selected from Formulae 11-1 in 11-4:

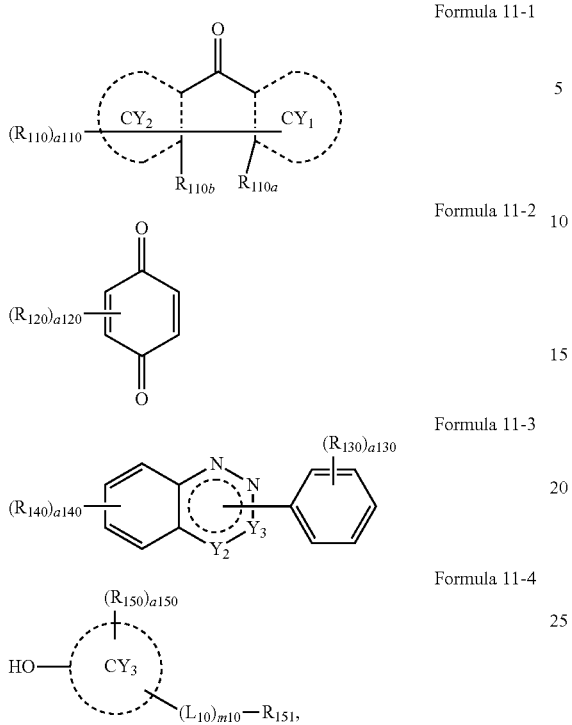

Formula 11-1
Formula 11-2
Formula 11-3
Formula 11-4 wherein, in Formulae 11-1 to 11-4, $CY_1$ to $CY_3$ are each independently selected from a benzene group, a naphthalene group, an anthracene group, a pyrene group, and a phenanthrene group, $L_{10}$ is —O—, —S—, S($=$O)$_2$—, —C($=$O)—, —C($=$O)O—, —C($=$O)NH—, a $C_1$-$C_{30}$ hydrocarbon group, a $C_5$-$C_{60}$ carbocyclic group, or a $C_2$-$C_{30}$ heterocyclic group, m10 is an integer of 0 to 5, wherein $L_{10}$ is a single bond when m10 is 0, $R_{110a}$ and $R_{110b}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cyclo alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, Si($Q_1$)($Q_2$)($Q_3$), —N($Q_1$)($Q_2$), —B($Q_1$)($Q_2$), —C($=$O)($Q_1$), —S($=$O)$_2$($Q_1$), and —P($=$O)($Q_1$)($Q_2$), $R_{110a}$ and $R_{110b}$ are optionally linked to form a —($Y_1$)$_{k1}$— linking group, $Y_1$ is —O—, —S—, or, —C($=$O)—, k1 is an integer of 1 to 3, one of $Y_2$ and $Y_3$ is nitrogen (N), and the other one is a single bond, a double bond, or —C($=$O)—, $R_{110}$, $R_{120}$, $R_{130}$, $R_{140}$, $R_{150}$, and $R_{151}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cyclo alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, Si($Q_1$)($Q_2$)($Q_3$), —N($Q_1$)($Q_2$), —B($Q_1$)($Q_2$), —C($=$O)(Qi), —S($=$O)$_2$($Q_1$), and —P($=$O)($Q_1$)($Q_2$), a110 is an integer of 1 to 8, a120 and a140 are each an integer of 1 to 4, a130 is an integer of 1 to 5, a150 is an integer of 1 to 10, at least one of $R_{110}$(s) in the number of a110 is a hydroxyl group, at least one of $R_{120}$(s) in the number of a120 is a hydroxyl group, and at least one of $R_{130}$(s) in the number of a130 is a hydroxyl group.

9. The light-emitting device of claim 1, wherein when the metal-containing material comprised in the at least one of the m−1 n-type charge generating layer(s) comprises the metal complex, the metal complex comprises a metal selected from lithium (Li), aluminum (Al), titanium (Ti), zirconium (Zr), hafnium (Hf), zinc (Zn), and copper (Cu).

10. The light-emitting device of claim 1, wherein a lowest unoccupied molecular orbital (LUMO) energy level of the electron transporting metal-non-containing material is about −4.0 electron volts (eV) or greater.

11. The light-emitting device of claim 1, wherein the electron transporting metal-non-containing material is an organic compound comprising at least one π electron-depleted nitrogen-containing ring.

12. Light-emitting device of claim 1, wherein when the metal-containing material comprises the metal, a weight ratio of the metal to the electron transporting metal-non-containing material is in a range of about 0.01:100 to about 15:100.

13. The light-emitting device of claim 1, wherein when the metal-containing material comprises the metal complex, a weight ratio of the metal complex to the electron transporting metal-non-containing material is in a range of about 1:100 to about 100:1.

14. The light-emitting device of claim 1, further comprising:
a hole transport region between the first electrode and an emission unit adjacent to the first electrode from among the m emission units, and a p-dopant in the hole transport region, the LUMO energy level of the hole transport region being about −3.5 eV or less.

15. An electronic apparatus comprising:
a substrate;
a light-emitting device disposed on the substrate; and
a color conversion layer disposed on the light-emitting device and
wherein the color conversion layer comprises at least one quantum dot(s),
and the light emitting device comprising:
a first electrode;
a second electrode facing the first electrode;
m emission units stacked between the first electrode and the second electrode; and
m−1 charge generating layer(s) between each of the two adjacent emission units from among the m emission units, m−1 charge generating layer(s) comprising m−1 n-type charge generating layer(s) and m−1 p-type charge generating layer(s),
wherein m is an integer of 2 or greater,
a maximum emission wavelength of light emitted from at least one of the m emission units differs from that of light emitted from at least one of the other emission units,
at least one of the m−1 n-type charge generating layer(s) comprises a metal-containing material and an electron transporting metal-non-containing material,
the metal-containing material comprised in the m−1 n-type charge generating layer(s) comprises a metal, a metal complex, or a combination thereof,
the metal comprised in the m−1 n-type charge generating layer(s) comprises lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu), or a combination thereof, and
the metal complex comprised in the m−1 n-type charge generating layer(s) comprises an alkali metal, an alkaline earth metal, a rare-earth metal, a transition metal, a late transition metal, or a combination thereof, and at least one organic ligand selected from a hydroxyquinoline, a hydroxyisoquinoline, a hydroxy benzoquinoline, a hydroxyacridine, a hydroxyphenanthridine, a hydroxyphenyl oxazole, a hydroxyphenyl thiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene, and
the light emitting device further comprises:
an electron transport layer between the second electrode and an emission unit adjacent to the second electrode from among the m emission units,
wherein the electron transport layer comprises a metal-containing material and an electron transporting metal-non-containing material,
the metal-containing material comprised in the electron transport layer comprises a metal, a metal complex, or a combination thereof,
the metal comprised in the electron transport layer comprises an alkali metal, an alkaline earth metal, a rare-earth metal, a transition metal, a late transition metal, or a combination thereof,
the metal complex comprised in the electron transport layer comprises an alkali metal, an alkaline earth metal, a rare-earth metal, a transition metal, a late transition metal, or a combination thereof, and
the electron transporting metal-non-containing material is an organic compound comprising at least one selected from a phenanthroline ring, an imidazole ring, a pyridine ring, a pyrazine ring, a pyrimidine ring, a pyridazine ring, and a triazine ring, and
the electron transporting metal-non-containing material comprised in the electron transport layer does not include the following compounds:

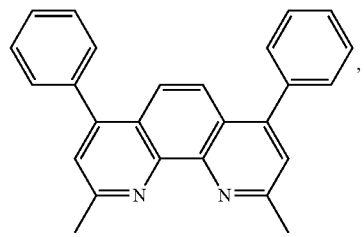 [SMILES: Cc1cc(-c2ccccc2)c2ccc3c(-c4ccccc4)cc(C)nc3c2n1]

wherein the metal-containing material comprised in the at least one of the m−1 n-type charge generating layer(s) differs from the metal-containing material comprised in the electron transport layer;
the electron transporting metal-non-containing material comprised in the at least one of the m−1 n-type charge generating layer(s) differs from the electron transporting metal-non-containing material comprised in the electron transport layer; or
the metal-containing material comprised in the at least one of the m−1 n-type charge generating layer(s) differs from the metal-containing material comprised in the electron transport layer, and the electron transporting metal-non-containing material comprised in the at least one of the m−1 n-type charge generating layer(s) differs from the electron transporting metal-non-containing material comprised in the electron transport layer; and
at least one of the m−1 n-type charge generating layer(s) and the electron transporting layer does not include a metal complex comprising lithium(Li).

16. The electronic apparatus of claim 15, wherein the substrate comprises a plurality of subpixel areas.

17. Electronic apparatus of claim 16, wherein the color conversion layer comprises a plurality of color conversion areas respectively corresponding to the plurality of subpixel areas.

18. The electronic apparatus of claim 17, wherein at least one of the color conversion area(s) comprises the quantum dot(s).

19. The electronic apparatus of claim 15, wherein the quantum dot comprises Group 13-Group 16-based compounds, Group 12-Group 16-based compounds, Group 13-Group 15-based compounds, Group 11-Group 13-Group 16-based compounds, Group 14-Group 16-based compounds, Group 14-based compounds, or any combination thereof.

20. An electronic apparatus comprising:
a substrate;
a light-emitting device disposed on the substrate;
a thin film encapsulation portion sealing the light-emitting device and comprising at least one organic film; and
a color conversion layer disposed on the thin film encapsulation portion and wherein the organic film comprises a cured product of a composition for forming an organic film, the composition comprising a curable material and an ultraviolet (UV) absorber, the color conversion layer comprises at least one quantum dot(s), and the light emitting device comprising:

a first electrode;

a second electrode facing the first electrode;

m emission units stacked between the first electrode and the second electrode; and m−1 charge generating layer(s) between each of the two adjacent emission units from among the m emission units, m−1 charge generating layer(s) comprising m−1 n-type charge generating layer(s) and m−1 p-type charge generating layer(s), wherein m is an integer of 2 or greater, a maximum emission wavelength of light emitted from at least one of the m emission units differs from that of light emitted from at least one of the other emission units, at least one of the m−1 n-type charge generating layer(s) comprises a metal-containing material and an electron transporting metal-non-containing material, the metal-containing material comprised in the m−1 n-type charge generating layer(s) comprises a metal, a metal complex, or a combination thereof, the metal comprised in the m−1 n-type charge generating layer(s) comprises lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu), or a combination thereof, and the metal complex comprised in the m−1 n-type charge generating layer(s) comprises an alkali metal, an alkaline earth metal, a rare-earth metal, a transition metal, a late transition metal, or a combination thereof, and at least one organic ligand selected from a hydroxyquinoline, a hydroxyisoquinoline, a hydroxy benzoquinoline, a hydroxyacridine, a hydroxyphenanthridine, a hydroxyphenyl oxazole, a hydroxyphenyl thiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene, and the light emitting device further comprises:

an electron transport layer between the second electrode and an emission unit adjacent to the second electrode from among the m emission units, wherein the electron transport layer comprises a metal-containing material and an electron transporting metal-non-containing material, the metal-containing material comprised in the electron transport layer comprises a metal, a metal complex, or a combination thereof, the metal comprised in the electron transport layer comprises an alkali metal, an alkaline earth metal, a rare-earth metal, a transition metal, a late transition metal, or a combination thereof, the metal complex comprised in the electron transport layer comprises an alkali metal, an alkaline earth metal, a rare-earth metal, a transition metal, a late transition metal, or a combination thereof, and the electron transporting metal-non-containing material is an organic compound comprising at least one selected from a phenanthroline ring, an imidazole ring, a pyridine ring, a pyrazine ring, a pyrimidine ring, a pyridazine ring, and a triazine ring, and the electron transporting metal-non-containing material comprised in the electron transport layer does not include the following compounds:

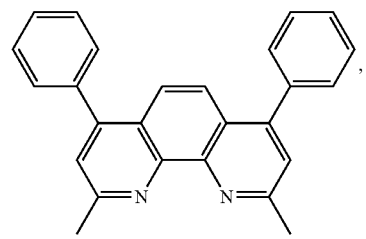 [SMILES: Cc1cc(-c2ccccc2)c2ccc3c(-c4ccccc4)cc(C)nc3c2n1]

wherein the metal-containing material comprised in the at least one of the m−1 n-type charge generating layer(s) differs from the metal-containing material comprised in the electron transport layer;

the electron transporting metal-non-containing material comprised in the at least one of the m−1 n-type charge generating layer(s) differs from the electron transporting metal-non-containing material comprised in the electron transport layer; or the metal-containing material comprised in the at least one of the m−1 n-type charge generating layer(s) differs from the metal-containing material comprised in the electron transport layer, and the electron transporting metal-non-containing material comprised in the at least one of the m−1 n-type charge generating layer(s) differs from the electron transporting metal-non-containing material comprised in the electron transport layer; and at least one of the m−1 n-type charge generating layer(s) and the electron transporting layer does not include a metal complex comprising lithium(Li).

* * * * *